(12) United States Patent
Nunoya et al.

(10) Patent No.: US 7,738,520 B2
(45) Date of Patent: Jun. 15, 2010

(54) OPTICAL SEMICONDUCTOR DEVICE AND OPTICAL SEMICONDUCTOR INTEGRATED CIRCUIT

(75) Inventors: Nobuhiro Nunoya, Kawasaki (JP); Yasuo Shibata, Tokyo (JP); Naoki Fujiwara, Tokyo (JP); Nobuhiro Kikuchi, Zama (JP); Yuichi Tomori, Yokohama (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 10/527,355

(22) PCT Filed: Mar. 30, 2004

(86) PCT No.: PCT/JP2004/004517

§ 371 (c)(1),
(2), (4) Date: Mar. 7, 2005

(87) PCT Pub. No.: WO2004/088802

PCT Pub. Date: Oct. 14, 2004

(65) Prior Publication Data

US 2006/0050752 A1    Mar. 9, 2006

(30) Foreign Application Priority Data

Mar. 31, 2003 (JP) .............................. 2003-094696
Nov. 28, 2003 (JP) .............................. 2003-400156
Dec. 10, 2003 (JP) .............................. 2003-412062

(51) Int. Cl.
*H01S 3/04* (2006.01)

(52) U.S. Cl. ..................................... 372/43.01; 372/96
(58) Field of Classification Search . 372/45.01–45.013, 372/46.01–46.016, 96
See application file for complete search history.

(56) References Cited

U.S. PATENT DOCUMENTS 3,605,037 A    9/1971    D'Asaro et al.

(Continued)

FOREIGN PATENT DOCUMENTS

DE    31 31 232 A1    4/1982

(Continued)

OTHER PUBLICATIONS

Abstract of Japanese Patent Publication No. 63-116485, published May 20, 1988.

(Continued)

*Primary Examiner*—Minsun Harvey
*Assistant Examiner*—Patrick Stafford
(74) *Attorney, Agent, or Firm*—Workman Nydegger

(57) ABSTRACT

An optical semiconductor device and optical semiconductor integrated circuit are provided by combining, on a semiconductor substrate, materials having different refractive indices and different temperature dependence of the refractive indices. In particular, it becomes possible to control the temperature dependence of the oscillation wavelength with a propagating region having a material and/or structure whose temperature dependence of the refractive index is different from that of a gain region of the semiconductor laser. In addition, they can be configured to have a plurality of interfaces formed along the waveguide direction of the optical waveguide so that the light reflected off the first interface is weakened by the light reflected from the remaining interfaces. Also, they can be configured with the interfaces inclined to the propagating direction so that the waveguide loss due to the reflection and refraction between the optical waveguides whose refractive indices differ from each other can be reduced.

19 Claims, 25 Drawing Sheets

U.S. PATENT DOCUMENTS

| | | | |
|---|---|---|---|
| 4,405,236 A | | 9/1983 | Mitsuhashi et al. |
| 4,505,539 A | | 3/1985 | Auracher et al. |
| 4,583,227 A | * | 4/1986 | Kirkby .................... 372/32 |
| 5,022,042 A | | 6/1991 | Bradley |
| 5,155,737 A | * | 10/1992 | Ikeda et al. ............. 372/50.11 |
| 5,157,468 A | | 10/1992 | Matsumoto |
| 5,617,436 A | * | 4/1997 | Lo ..................... 372/45.011 |
| 5,719,974 A | * | 2/1998 | Kashyap .................... 385/37 |
| 5,838,854 A | | 11/1998 | Taneya et al. |
| 6,163,631 A | | 12/2000 | Kawanishi et al. |
| 6,208,795 B1 | | 3/2001 | Nakano et al. |
| 6,320,888 B1 | | 11/2001 | Tanaka et al. |
| 6,501,776 B1 | * | 12/2002 | Numai ................... 372/45.01 |
| 6,522,794 B1 | | 2/2003 | Bischel et al. |
| 6,530,698 B1 | | 3/2003 | Kuhara et al. |
| 6,580,740 B2 | * | 6/2003 | Funabashi et al. ........ 372/50.22 |
| 6,711,323 B1 | | 3/2004 | Nayyer |
| 2003/0044119 A1 | | 3/2003 | Sasaki et al. |

FOREIGN PATENT DOCUMENTS

| | | |
|---|---|---|
| EP | 0 790 682 A1 | 8/1997 |
| EP | 1 089 108 A2 | 4/2001 |
| JP | 55-123188 | 9/1980 |
| JP | 62-202583 | 9/1987 |
| JP | 01-025586 | 1/1989 |
| JP | 01-118806 | 5/1989 |
| JP | 02-074909 | 3/1990 |
| JP | 05-048198 | 2/1993 |
| JP | 06-338650 | 12/1994 |
| JP | 08-211342 | 8/1996 |
| JP | 09-036495 | 2/1997 |
| JP | 09-092924 | 4/1997 |
| JP | 09-331102 | 12/1997 |
| JP | 2000-019345 | 1/2000 |
| JP | 2000-223784 | 8/2000 |
| JP | 2000-223787 | 8/2000 |
| JP | 2002-014247 | 1/2002 |
| JP | 2002-076513 | 3/2002 |
| JP | 2002-328244 | 11/2002 |

OTHER PUBLICATIONS

T. Tanaka et al., *Hybrid Integrated External Cavity Laser without Temperature Dependent Mode Hopping*, Electronics Letters, vol. 35, No. 2, Jan. 21, 1999, pp. 149-150.

Takeshi Kurosaki et al., *A Method for Reduction in Internal Reflection of Monolithically Integrated Optical Devices with Butt-Jointed Optical Waveguides*, C-I, vol. J79-C-I, No. 12, Dec. 25, 1996, pp. 482-483 (with concise English translation).

Yoshiaki Nakano et al., *Analysis of DFB, and DBR Lasers Coupled to Fabry-Perot Resonator with Consideration on Their Temperature Compensation Properties*, Department of Electronic Engineering, University of Tokyo, Jul. 24, 1985, pp. 55-56 (with concise English translation).

Toru Kusakawa, *Lens Optics*, Tokai University Press, Dec. 25, 1998, pp. 273-288 (with concise English transaltion).

Kazuo Sakai et al., *1.5 μm Range InGaAsP/InP Distributed Feedback Lasers*, IEEE Journal of Quantum Electronics, vol. QE-18, No. 8, Aug. 1982, pp. 1272-1278.

Hajime Asahi et al., *New III-V Compound Semiconductors TlInGaP for 0.9 μm to over 10 μm Wavelength Range Laser Diodes and Their First Successful Growth*, Jpn. J. Appl. Phys., vol. 35, 1996, pp. L876-L879.

K. Tada et al., *Temperature Compensated Coupled Cavity Diode Lasers*, Optical and Quantum Electronics, vol. 16, 1984, pp. 463-469.

Mukaihara et al. "*1.3 Micron GaInAsP lasers integrated with butt-coupled waveguide and high reflective semiconductor/air Bragg reflector (SABAR)*," Electronics Letters, IEE Stevanage, GB, vol. 34, No. 9, Apr. 30, 1998, pp. 882-884.

Inoue et al. "*Optical Amplification by Monolithically Integrated Distributed-Feedback Lasers*," Applied Physics, AIP, American Institute of Physics, Melville, NY, US, vol. 51, No. 28, Nov. 16, 1987, pp. 1577-1579.

H. Soda et al., "Stability in Single Longitudinal Mode Operation in GaInAsP/InP Phase-Adjusted DFB Lasers," IEEE Journal of Quantum Electronics, vol. QE-23, No. 6, pp. 804-814, Jun. 1987.

Shin Kamei et al., Loss reduction in super-high-delta compact athermal AWG, The Institute of Electronics, Information and Communication Engineers, p. 145, 2003.

\* cited by examiner

OPTICAL SEMICONDUCTOR DEVICE AND OPTICAL SEMICONDUCTOR INTEGRATED CIRCUIT

FIELD OF THE INVENTION

The present invention generally relates to an optical semiconductor device and optical semiconductor integrated circuit such as a semiconductor laser, optical waveguide, and other optical devices. The present invention particularly relates to an optical semiconductor device and optical semiconductor integrated circuit that are combined, on a semiconductor substrate, with materials which differ in the refractive indices and their temperature dependence.

BACKGROUND ART

The oscillation wavelength of a semiconductor laser varies depending on the ambient temperature and device temperature. For example, as described in K. Sakai, "1.5 µm range InGaAsP/InP distributed feedback lasers", IEEE J. Quantum Electron, vol. QW-18, pp. 1272-1278, August 1982, the temperature dependence of the oscillation wavelength of a distributed feedback (DFB) laser is about 0.1 nm/K. This is because the refractive index (n) of a semiconductor has temperature dependence, and hence the Bragg wavelength ($\lambda_B$) of a diffraction grating varies according to the following expression.

$$m\lambda_B = 2n\Lambda \tag{1}$$

where m is the order of diffraction and $\Lambda$ is the period of the diffraction grating.

For example, when using a semiconductor laser as a light source for optical fiber communication, particularly wavelength division multiplexing communication (WDM) that transmits optical signals with different wavelengths by multiplexing them into a single fiber, the accuracy of the wavelengths of the signal light is important. Accordingly, it is essential to stabilize the oscillation wavelength of the semiconductor laser constituting the light-emitting source. To achieve this, the oscillation wavelength of the semiconductor laser is stabilized by the temperature control of the semiconductor laser using a Peltier device, for example.

Methods of stabilizing the temperature dependence of the oscillation wavelength without using the temperature control by the Peltier device or the like are broadly divided into two methods. An example of the first method is disclosed in H. Asahi et al., Jpn. J. Appl. phys., vol. 35, pp. L875-, 1996. It employs a semiconductor material having a refractive index with smaller temperature dependence than a conventional counterpart, thereby reducing the temperature dependence with a semiconductor-only configuration. A second method is one that uses a composite configuration of semiconductor and materials other than the semiconductor in order to reduce the temperature dependence. For example, the following configurations are known. One that has a semiconductor laser combined with an external waveguide composed of materials other than the semiconductor is disclosed in "Hybrid integrated extennal Cavity laser without temperature dependent mode hopping", by T. Tanaka et al., Electron. Lett., vol. 35, No. 2, pp. 149-150, 1999. Another configuration that has semiconductor and non-semiconductor materials with the refractive index temperature dependence opposite to that of the semiconductor, connected alternately in cascade, is disclosed in Japanese patent application laid-open No. 2002-14247.

However, as for the method of carrying out the temperature control of the semiconductor laser with the Peltier device, it has a problem of complicating the device structure and control, and increasing the power consumption.

As for the method of reducing the temperature dependence by the semiconductor-only configuration using the semiconductor material with the refractive index of smaller temperature dependence, no reports have been made about a new material that is put to practical use, and because of the crystal growth and device formation, it is very difficult to develop such a new semiconductor.

Furthermore, as for the method of combining the semiconductors with the non-semiconductor materials, it is preferable to be able to combine them as simple as possible such as eliminating the need for optical axis adjustment. However, even if a simple fabrication method exists such as spin coating an organic material on the semiconductor substrate, in case for example of constructing distributed reflectors by alternately cascading the semiconductor and the organic materials to fabricate a first-order diffraction grating with good characteristics, it requires to place the semiconductor and organic materials alternately at about ¼ wavelength intervals, which presents a great degree of problem in the difficulty and reliability of the process.

On the other hand, by connecting a semiconductor optical waveguide with an optical waveguide composed of materials having different characteristics from the semiconductor, an optical waveguide with new characteristics is obtained which cannot be achieved by semiconductor-only. For example, while the refractive index of a semiconductor has a positive temperature dependence that increases with the temperature, a method is known which connects a semiconductor optical waveguide in cascade with an optical waveguide composed of materials whose refractive indices are negative in temperature dependence that decreases with the temperature.

As such, it is possible to implement an optical waveguide whose optical length, which is given by the product of the refractive index and the waveguide length, is independent of the temperature as a whole. For example, as disclosed in K. Tada et al., "Temperature compensated coupled cavity diode lasers", Optical and Quantum Electronics, vol. 16, pp. 463-469, 1984, a temperature-independent laser whose oscillation wavelength is independent of the temperature can be realized by constructing its cavity from materials with the negative refractive index temperature dependence external to the semiconductor laser.

More specifically, the optical length $n_D L_D$ of the laser cavity increases with the temperature because of an increase in the effective refractive index $n_D$ of the semiconductor medium. Assume that a laser diode is coupled with the external cavity whose optical length $n_R L_R$ decreases with an increase in the temperature, the condition that makes the total optical length ($n_D L_D + n_R L_R$) of the cavity constant regardless of the temperature is given by the following expression (2).

$$\partial/\partial T(n_D L_D + n_R L_R) = L_D \partial n_D/\partial T + n_D \partial L_D/\partial T + L_R \partial n_R/\partial T + n_R \partial L_R/\partial T = 0 \tag{2}$$

Note $\partial n_R/\partial T$ and $\partial L_R/\partial T$ become negative because $\partial n_D/\partial T$ and $\partial L_D/\partial T$ are usually positive.

Here, to splice the waveguides with different refractive indices, such as splicing the semiconductor optical waveguide with the waveguide composed of non-semiconductor materials, reflection occurs at the interface because of the difference between the refractive indices of the two waveguides. Assume that the refractive index of a first optical waveguide is $N_1$, and the refractive index of a second optical waveguide is $N_2$, and consider the plane wave for simplicity, then the reflectance R is given by the following expression (3).

$$R=((N_1-N_2)/(N_1+N_2))^2 \quad (3)$$

When light propagated through the semiconductor or silica waveguide is radiated to the outside, the reflection occurs because of the difference between the refractive index of the waveguide and that of the outside. Accordingly, when the light propagated through the semiconductor optical waveguide is radiated to the air from an end face of the semiconductor laser, for example, the reflection can be prevented by forming an evaporated film with a certain thickness on the semiconductor end face as disclosed in Toru Kusakawa, "Lens optics", pp. 273-288, the Tokai University Press. However, it is difficult to form such an antireflection film at high accuracy when integrating the waveguide composed of different materials on a semiconductor substrate.

On the other hand, when incident light is entered at an angle into the interface surface between materials with different refractive indices, refraction occurs at the interface surface as represented by the following expression (4) according to Snell's law, $$\sin\theta_1/\sin\theta_2 = N_2/N_1 \quad (4)$$

where $\theta_1$ is an incident angle and $\theta_2$ is a refraction angle.

When the incident angle $\theta_1$ equals the Brewster angle $\theta_B$, the reflection of the components parallel to the incidence plane can be eliminated, in which case, the Brewster angle $\theta_B$ is represented by the following expression (5).

$$\theta_B = \tan^{-1}(N_2/N_1) \quad (5)$$

Now, the semiconductor waveguide usually employ a buried heterostructure or ridge structure. As for the etching and buried growth of the semiconductor, there is a crystal orientation suitable for the etching and buried growth.

When splicing the semiconductor optical waveguide with the optical waveguide composed of the materials whose refractive index differs from the materials of the semiconductor optical waveguide, the reflection occurs at the splice interface in accordance with the difference between the refractive indices, thereby limiting the flexibility of the waveguide design.

Although the reflection can be reduced at the interface between the waveguides having different refractive indices by utilizing the Brewster angle $\theta_B$, the use of the Brewster angle $\theta_B$ causes the light to refract through the interface surface between the waveguides, which presents a problem in that the waveguides are no longer aligned.

Also, when utilizing the Brewster angle $\theta_B$ to reduce the reflection between the waveguides with different refractive indices, it becomes difficult to configure the buried semiconductor waveguide along with a certain crystal orientation, which makes it difficult to fabricate the buried semiconductor waveguide at a high reliability.

Furthermore, when utilizing the Brewster angle $\theta_B$ to reduce the reflection between the waveguides with different refractive indices, it becomes difficult to place the semiconductor waveguides perpendicularly to a cleaved surface, which precludes the cleaved surface to be used as the reflection plane of the semiconductor laser.

As described above, combining the materials that differ in the refractive indices and their temperature dependence poses a variety of problems and is desired to be improved further.

SUMMARY OF THE INVENTION

To solve the foregoing problems, according to an aspect of the present invention, there is provided a semiconductor laser comprising: a gain region having wavelength selectivity; a propagating region optically coupled to the gain region, having an effective refractive index whose temperature dependence differs from that of the gain region, and having no wavelength selectivity; and a reflection region for reflecting light propagated through the propagating region.

Thus, coupling the propagating region having no wavelength selectivity to the gain region having wavelength selectivity enables the control of the temperature dependence of the oscillation wavelength. More specifically, as the gain region has the wavelength selectivity, it can selectively excite light of a particular wavelength. As for the propagating region that does not have the wavelength selectivity and is optically-coupled with the gain region, the light excited by the gain region travels through the propagating region with the phase of the propagating light being varied. The light passing through the propagating region is reflected by the reflection region to return to the gain region again. Thus, the wavelength variations of the light due to the temperature changes in the gain region can be compensated for by the phase variations due to the temperature changes in the propagating region. Consequently, it becomes possible to control the temperature dependence of the oscillation wavelength of the semiconductor laser at a desired value without combining the semiconductors and non-semiconductor materials intricately even when the materials having the temperature dependence of the oscillation wavelength are used as the gain medium, thereby making it possible to stabilize the oscillation wavelength of the semiconductor laser using a simple configuration and easy process.

According to another aspect of the present invention, there is provided a semiconductor laser comprising: a gain region having wavelength selectivity; a propagating region optically coupled to the gain region, having a material with an effective refractive index whose temperature dependence differs from that of the gain region, and having no gain nor wavelength selectivity; and a reflection region that reflects light propagated through the propagating region, and has no gain.

Thus, the propagating region can be configured using a currently available material such as an organic material, thereby enabling the control of the temperature dependence of the oscillation wavelength with the simple configuration and easy process without using a new material.

According to still another aspect of the present invention, there is provided a semiconductor laser comprising: a gain region having wavelength selectivity; a propagating region optically coupled to the gain region, having a structure with an effective refractive index whose temperature dependence differs from that of the gain region, and having no gain nor wavelength selectivity; and a reflection region that reflects light propagated through the propagating region, and has no gain.

Thus, the propagating region can be configured without using a material with an effective refractive index whose temperature dependence is different, thereby enabling the control of the temperature dependence of the oscillation wavelength with the simple configuration and easy process.

According to another aspect of the present invention, there is provided a semiconductor laser comprising: a first gain region having wavelength selectivity; a propagating region optically coupled to the first gain region, having at least one of a material and structure with an effective refractive index whose temperature dependence differs from that of the gain region, and having no gain nor wavelength selectivity; and a second gain region optically coupled to the propagating region, and having wavelength selectivity.

Thus, the propagating region can be configured using a currently available material such as an organic material, and eliminate the need for the use of a mirror as the reflection region. Accordingly, not only the monolithic integration of a semiconductor laser can be facilitated, but also the control of the temperature dependence of the oscillation wavelength can be realized with a simple configuration and easy process without using a new material.

According to another aspect of the present invention, there is provided a semiconductor laser comprising: a semiconductor substrate; an active layer formed on the semiconductor substrate, and having a distributed reflection structure; a cladding layer formed on the active layer; a removed region from which part of the active layer and the cladding layer is removed; and a temperature compensation layer buried in the removed region, and having an effective refractive index whose temperature dependence differs from that of the active layer.

Thus, by removing part of the active layer and cladding layer, and then filling the temperature compensation layer, it becomes possible to easily couple the propagating region having no wavelength selectivity to the gain region having wavelength selectivity, thereby enabling the control of the temperature dependence of the oscillation wavelength with the simple configuration and easy process.

According to another aspect of the present invention, there is provided a semiconductor laser comprising: a semiconductor substrate; a distributed Bragg reflection layer stacked on the semiconductor substrate; an active layer stacked on the distributed Bragg reflection layer, and having a distributed reflection structure; a temperature compensation layer stacked on the active layer, and having an effective refractive index whose temperature dependence differs from that of the active layer; and a reflection layer stacked on the temperature compensation layer.

Thus, by successively stacking the distributed Bragg reflection layer, active layer, temperature compensation layer and reflection layer on the semiconductor substrate, it becomes possible to easily couple the propagating region having no wavelength selectivity to the gain region having wavelength selectivity, thereby enabling the control of the temperature dependence of the oscillation wavelength with the simple configuration and easy process.

According to another aspect of the present invention, there is provided a semiconductor laser comprising: a semiconductor substrate; an active layer formed on the semiconductor substrate, and having a distributed reflection structure; a cladding layer formed on the active layer, and having an inclined surface at an end of the active layer; and a temperature compensation layer formed on the cladding layer, and having an effective refractive index whose temperature dependence differs from that of the active layer.

Thus, by providing the temperature compensation layer on the cladding layer on which the inclined surface is formed, it becomes possible to couple the propagating region having no wavelength selectivity to the gain region having wavelength selectivity, thereby enabling the control of the temperature dependence of the oscillation wavelength with the simple configuration and easy process.

According to another aspect of the present invention, there is provided a integrated optical waveguide comprising: a first optical waveguide; a second optical waveguide optically coupled to the first optical waveguide, and having a refractive index different from that of the first optical waveguide; and a groove disposed so as to traverse an optical path of the first optical waveguide, and separated from an interface between the first optical waveguide and the second optical waveguide by a predetermined spacing, wherein the spacing from the interface and the width of the groove are determined such that reflection at the boundary between the first optical waveguide and the second optical waveguide is weakened.

Thus, by forming the groove in such a manner that it traverses the optical path of the first optical waveguide, it becomes possible to adjust the phase of the reflected waves from the boundary between the first optical waveguide and second optical waveguide, and to cancel the reflected waves from the boundary between the first optical waveguide and second optical waveguide. Accordingly, the reflection at the boundary between the first optical waveguide and second optical waveguide can be weakened even when the first optical waveguide and second optical waveguide have refractive indices different from each other. As a result, the loss at the boundary between the first optical waveguide and second optical waveguide can be reduced without forming an antireflection film on the interface between the first optical waveguide and second optical waveguide, thereby allowing the implementation of the optical waveguide having new characteristics that cannot be achieved by semiconductor-only configuration while enabling the integration of the optical waveguide.

According to another aspect of the present invention, there is provided an integrated optical waveguide comprising: a first optical waveguide formed on a semiconductor substrate; a second optical waveguide formed on the semiconductor substrate, and having a refractive index different from that of the first optical waveguide; and a semiconductor board disposed at the boundary between the first optical waveguide and the second optical waveguide, formed on the semiconductor substrate perpendicularly to the waveguide direction, and separated from the first optical waveguide via a groove, wherein a width of the groove and a thickness of the semiconductor board are determined such that light reflected off the interface between the first optical waveguide and the groove is weakened by light reflected from the interface between the groove and the semiconductor board, and by light reflected from the interface between the semiconductor board and the second optical waveguide.

Thus, the light reflected off the interface between the first optical waveguide and the groove can be weakened by the light reflected from the interface between the groove and semiconductor board and by the light reflected from the interface between the semiconductor board and the second optical waveguide. Accordingly, the reflection between the optical waveguides can be reduced even when the semiconductor optical waveguide and the non-semiconductor optical waveguide are integrated on the same semiconductor substrate, thereby allowing the implementation of the optical waveguide having new characteristics that cannot be achieved by semiconductor-only configuration while maintaining the flexibility of the waveguide design.

According to another aspect of the present invention, there is provided an integrated optical waveguide comprising: a first optical waveguide formed on a semiconductor substrate; a second optical waveguide formed on the semiconductor substrate, and having a refractive index different from that of the first optical waveguide; a first semiconductor board disposed at the boundary between the first optical waveguide and the second optical waveguide, formed on the semiconductor substrate perpendicularly to the waveguide direction, and separated from the first optical waveguide via a first groove; and a second semiconductor board formed on the semiconductor substrate perpendicularly to the waveguide direction and separated from the first semiconductor board via a second groove, wherein widths of the first groove and the second groove and thicknesses of the first semiconductor board and the second semiconductor board are determined such that light reflected off the interface between the first optical waveguide and the first groove is weakened by light reflected from the interface between the first groove and the first semiconductor board, by light reflected from the interface between the first semiconductor board and the second groove, by light reflected from the interface between the second groove and the second semiconductor board and by light reflected from the interface between the second semiconductor board and the second optical waveguide.

Thus, the light reflected off the interface between the first optical waveguide and the first groove can be weakened by the light reflected from the interface between the first groove and the first semiconductor board, by the light reflected from the interface between the first semiconductor board and the second groove, by the light reflected from the interface between the second groove and the second semiconductor board, and by the light reflected from the interface between the second semiconductor board and the second optical waveguide. As a result, the reflection between the optical waveguides can be reduced even when the semiconductor optical waveguide and the non-semiconductor optical waveguide are integrated on the same semiconductor substrate, thereby allowing the implementation of the optical waveguide having new characteristics that cannot be achieved by semiconductor-only configuration while maintaining the flexibility of the waveguide design.

According to another aspect of the present invention, there is provided an integrated optical waveguide comprising: a first optical waveguiding region; a second optical waveguiding region whose interface surface with the first optical waveguiding region is inclined with respect to the waveguide direction of the first waveguiding region, and having a refractive index different from that of the first optical waveguiding region; and a third optical waveguiding region whose interface surface with the second optical waveguiding region is disposed such that the refraction direction through the interface surface with the second optical waveguiding region is in line with the waveguide direction.

Thus, the interface surface between the first optical waveguiding region and the second optical waveguiding region can be inclined with respect to the waveguide direction. This makes it possible, even when refractive indices of the first optical waveguiding region and second optical waveguiding region are different from each other, to reduce the reflection on the interface surface between the first optical waveguiding region and the second optical waveguiding region. In addition, the third optical waveguiding region is provided with its interface surface being disposed in such a manner that its refraction direction is in line with the waveguide direction, thereby enabling the adjustment of the waveguide direction with reducing the waveguide loss due to the reflection and refraction between the waveguides having different refractive indices.

As a result, it can make effective use of the crystal orientation suitable for such as the cleavage, etching or burying while suppressing the waveguide loss even in the case where materials having different refractive indices are inserted between the optical waveguiding regions. Thus, it allows the implementation of the optical waveguide having new characteristics that cannot be achieved by semiconductor-only configuration while suppressing the deterioration of the reliability during fabrication of the waveguide, and improve the flexibility of the waveguide design.

According to another aspect of the present invention, there is provided an integrated optical waveguide comprising: a first optical waveguide having a first refractive index; a third optical waveguide having the first refractive index; and a second optical waveguiding region disposed between the first optical waveguide and the third optical waveguide, and having a second refractive index, wherein the first optical waveguide is connected with the second optical waveguiding region such that the interface surface between the first optical waveguide and the second optical waveguiding region is unperpendicular to the direction of the first optical waveguide; the second optical waveguiding region is connected with the third optical waveguide such that the interface surface between the second optical waveguiding region and the third optical waveguide is unperpendicular to the extension line of the refraction direction through the interface surface between the first optical waveguide and the second optical waveguiding region; and the refraction direction through the interface surface between the second optical waveguiding region and the third optical waveguide is in line with the direction of the third optical waveguide.

Thus, the reflections on the interface surface between the first optical waveguide and the second optical waveguiding region and on the interface surface between the second optical waveguiding region and the third optical waveguide can be reduced, and the loss due to the refractions can be suppressed, even when the material with the different refractive index is inserted between the optical waveguides,.

DETAILED DESCRIPTION OF THE INVENTION

Several embodiments in accordance with the present invention will now be described with reference to the accompanying drawings. First, applications in a semiconductor laser will be described as a first embodiment with reference to several examples. This embodiment makes it possible to control the temperature dependence of the oscillation wavelength of a semiconductor laser by combining the semiconductor laser with materials having different temperature dependence of the refractive indices.

Second, applications in an integrated optical waveguide will be described as a second embodiment referring to several examples. This embodiment makes it possible, when integrating a semiconductor optical waveguide and an optical waveguide having refractive index and temperature dependence different from those of the semiconductor optical waveguide, to reduce the reflection on the interface surface between these optical waveguides. In addition, by integrating the semiconductor optical waveguide and the optical waveguide having the refractive index different from that of the semiconductor optical waveguide, the embodiment allows an implementation of an optical waveguide having new characteristics that cannot be achieved by semiconductor-only configurations.

Furthermore, as a third embodiment, by inclining the interface surface between a semiconductor optical waveguide and an optical waveguide having a different refractive index, with respect to the waveguide direction, the waveguide loss due to the reflection and refraction between these optical waveguides can be reduced. Also, by integrating the semiconductor optical waveguide and the optical waveguide having refractive index different from that of the semiconductor optical waveguide, the embodiment allows an implementation of an optical waveguide having new characteristics that cannot be achieved by semiconductor-only configurations.

(Applications in Semiconductor Laser)

Semiconductor lasers of the first embodiment in accordance with the present invention will now be described with reference to the drawings. The first embodiment can provide semiconductor lasers capable of controlling the temperature dependence of the oscillation wavelength by combining materials different in temperature characteristics of refractive indices. Some specific examples of the present embodiment will now be described.

Figure 1:
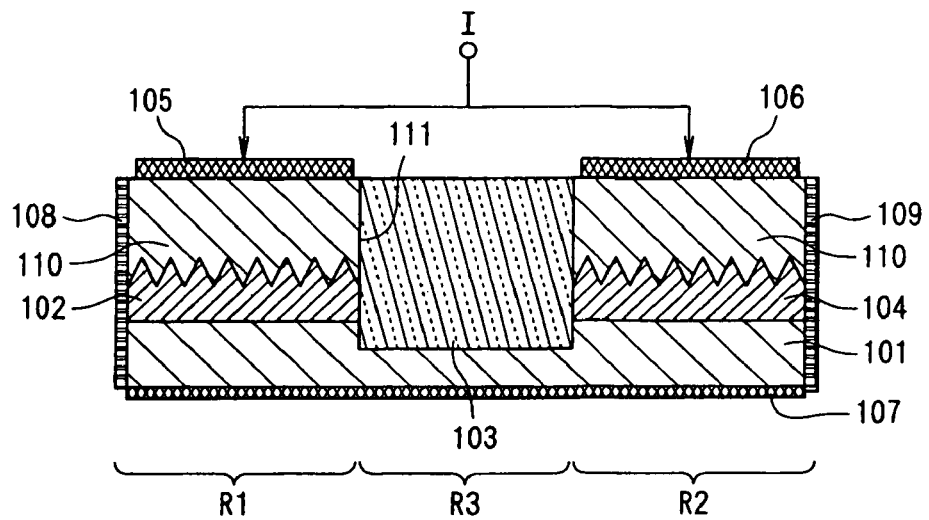
FIG. 1 is a cross-sectional view showing, along the waveguide direction, a configuration of a semiconductor laser of a first example in accordance with the present invention.

FIG. 1 is a cross-sectional view showing, along the waveguide direction, a configuration of the semiconductor laser of the first example in accordance with the present invention. The first example can control the temperature dependence of the oscillation wavelength by providing, between a first gain region R1 having wavelength selectivity and a second gain region R2 having wavelength selectivity, with a propagating region R3 having a different refractive index and no gain.

In FIG. 1, on a semiconductor substrate 101 are provided the first gain region R1 with wavelength selectivity, the propagating region R3 having a different refractive index and no gain, and the second gain region R2 with wavelength selectivity. Here, the gain region R1 has an active layer 102 formed on the semiconductor substrate 101. On the active layer 102, a first gain region electrode 105 is formed via a cladding layer 110.

Likewise, the gain region R2 has an active layer 104 formed on the semiconductor substrate 101. On the active layer 104, a second gain region electrode 106 is formed via a cladding layer 110.

As the semiconductor substrate 101 and cladding layer 110, such as InP can be used, and as the active layers 102 and 104, such as GaInAsP with the light-emitting wavelength of 1.55 μm can be used. The active layers 102 and 104 formed on the semiconductor substrate 101 have a first gain and second gain having the wavelength selectivity, respectively. In addition, the active layers 102 and 104 have a periodic perturbation with a complex refractive index, that is, a diffraction grating, which provides the active layers 102 and 104 with distributed reflection structure.

The propagating region R3 includes a removed region 111 formed by removing part of the active layers 102 and 104 and cladding layer 110 on the semiconductor substrate 101. The removed region 111 is filled with a temperature compensation material 103 having the refractive index whose temperature dependence differs from that of the gain regions R1 and/or R2.

As the temperature compensation material 103, it is possible to use an organic material with the refractive index whose temperature dependence is opposite to that of the semiconductors such as BCB (Benzocyclobutene), for example. Also, using a multilayer of organic materials as the temperature compensation material 103 can reduce the waveguide loss.

Incidentally, the propagating region R3 having no gain can be formed on the semiconductor substrate 101 by forming a groove with a desired width between the gain regions R1 and R2 using anisotropic etching such as reactive ion etching, followed by filling the groove with the organic material by spin coating or the like.

The cavity has an antireflection film 108 on the first gain region side and an antireflection film 109 on the second gain region side, formed on its end faces. The semiconductor substrate 101 has a backside electrode 107 formed on its back surface.

Here, the length of the first gain region R1, that of the second waveguide region R2 and that of the propagating region R3 can be determined in such a manner that oscillation does not occur only in the first gain region R1 or only in the second waveguide region R2.

Then, the light emitted or reflected by the first gain region R1 having wavelength selectivity passes through the propagating region R3 having no gain, and is reflected by the second gain region R2 having wavelength selectivity. The reflected light passes through the propagating region R3 having no gain again, and returns to the first gain region R1 having wavelength selectivity, thereby bringing about laser oscillation.

Thus, the laser oscillation is carried out in the first gain region R1, second waveguide region R2 and propagating region R3, and the variations in the oscillation wavelength due to the temperature changes in the first gain region R1 and second waveguide region R2 can be compensated for by the variations in the phase due to the temperature changes in the propagating region R3.

Using the organic material such as BCB makes it possible to control the temperature dependence of the oscillation wavelength of the semiconductor laser. Accordingly, the oscillation wavelength of the semiconductor laser can be stabilized by a simple configuration and easy process without using a new material.

The length of the propagating region R3 having gain can be set such that the longitudinal mode spacing, which is determined by the sum of the effective lengths of the diffraction gratings formed on the active layers 102 and 104 and the length of the propagating region R3 having no gain, becomes broader than the stop bandwidth of the diffraction gratings. This allows only one longitudinal mode to exist within the stop bandwidth of the diffraction gratings with the gain of the remaining longitudinal modes being suppressed, thereby increasing the stability of the single mode operation.

Next, with reference to the present example, the oscillation principle and oscillation wavelength will be described in detail.

The first gain region R1 having wavelength selectivity and the second gain region R2 having wavelength selectivity have the optical gains along with the wavelength selectivities. Accordingly, they can reflect the light with the wavelength determined by the diffraction grating, and amplify it. The wavelength band that maximizes the reflection can be determined by the stop bandwidth whose center is set at the Bragg wavelength of the diffraction grating. For example, the stop bandwidth of about 10 nm can be obtained by setting the coupling coefficient K of the diffraction grating at 300 cm$^{-1}$ and the length thereof at 50 μm. Also, the length of the propagating region 103 having no gain can be set at about 10 μm, for example.

Figure 2:
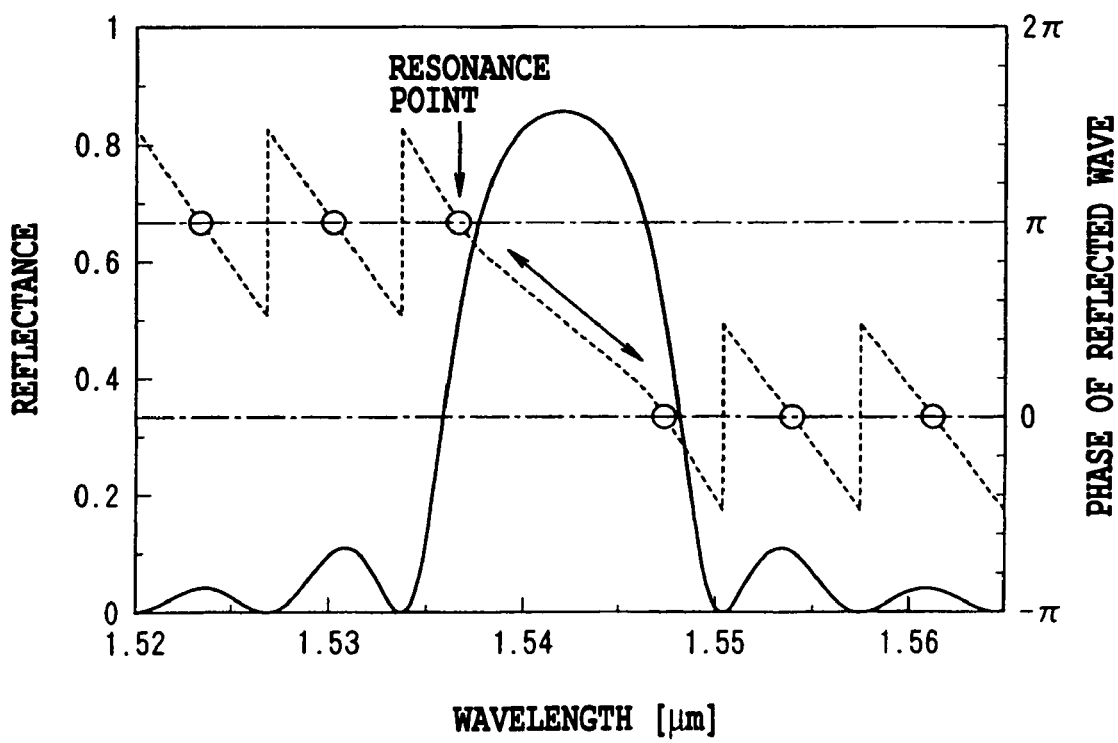
FIG. 2 is a diagram illustrating a reflection spectrum and phase characteristics of a reflected wave of a semiconductor laser of an embodiment in accordance with the present invention.

FIG. 2 is a diagram illustrating a reflection spectrum and phase characteristics of a reflected wave of the semiconductor laser of the embodiment in accordance with the present invention, which shows the reflection spectrum and phase delay of the reflected wave of the diffraction gratings of the first gain region R1 and second gain region R2.

In FIG. 2, consider the case where the propagating region R3 having no gain is not present, or the light passing through the propagating region R3 has no phase delay. In this case, when the sum of the phase delays in the diffraction gratings of the first gain region R1 and second gain region R2 is zero or integer multiple of 2π, or when the phase delay is 0 or π if only one of the first gain region R1 and second gain region R2 is considered, the wavelength becomes a resonance mode.

Then, when the propagating region R3 having no gain is present, the phase of the light varies during the propagation from the first gain region R1 to the second gain region R2. Accordingly, in response to the phase variations in the propagating region R3, the resonance mode varies in the stop band such that the phase delay becomes 0 or 2π throughout the cavity consisting of the first gain region R1, second gain region R2 and propagating region R3.

As for the semiconductor materials such as InP and GaAs which are currently used for ordinary semiconductor lasers, the refractive index increases with the ambient temperature. Accordingly, the Bragg wavelength of the diffraction grating shifts towards the longer wavelength according to the expression (1). As a result, the reflection spectrum of FIG. 2 also shifts towards the longer wavelength as a whole.

On the other hand, when the temperature compensation material 103 has the refractive index whose temperature dependence is opposite to that of the semiconductors, for example, the refractive index of the temperature compensation material 103 decreases with an increase of the temperature, thereby reducing the optical length of the propagating region R3 having no gain. Consequently, the phase of the light passing through the propagating region R3 having no gain varies so that the oscillation wavelength shifts from the longer wavelength side to the center within the stop band, and then towards the shorter wavelength side as the temperature increases.

Thus, the variations in the Bragg wavelength due to the temperature changes in the first gain region R1 and second waveguide region R2 can be compensated for by the variations in the phase due to the temperature changes in the propagating region R3. This enables the control of the temperature dependence of the oscillation wavelength of the semiconductor laser.

Figure 3:
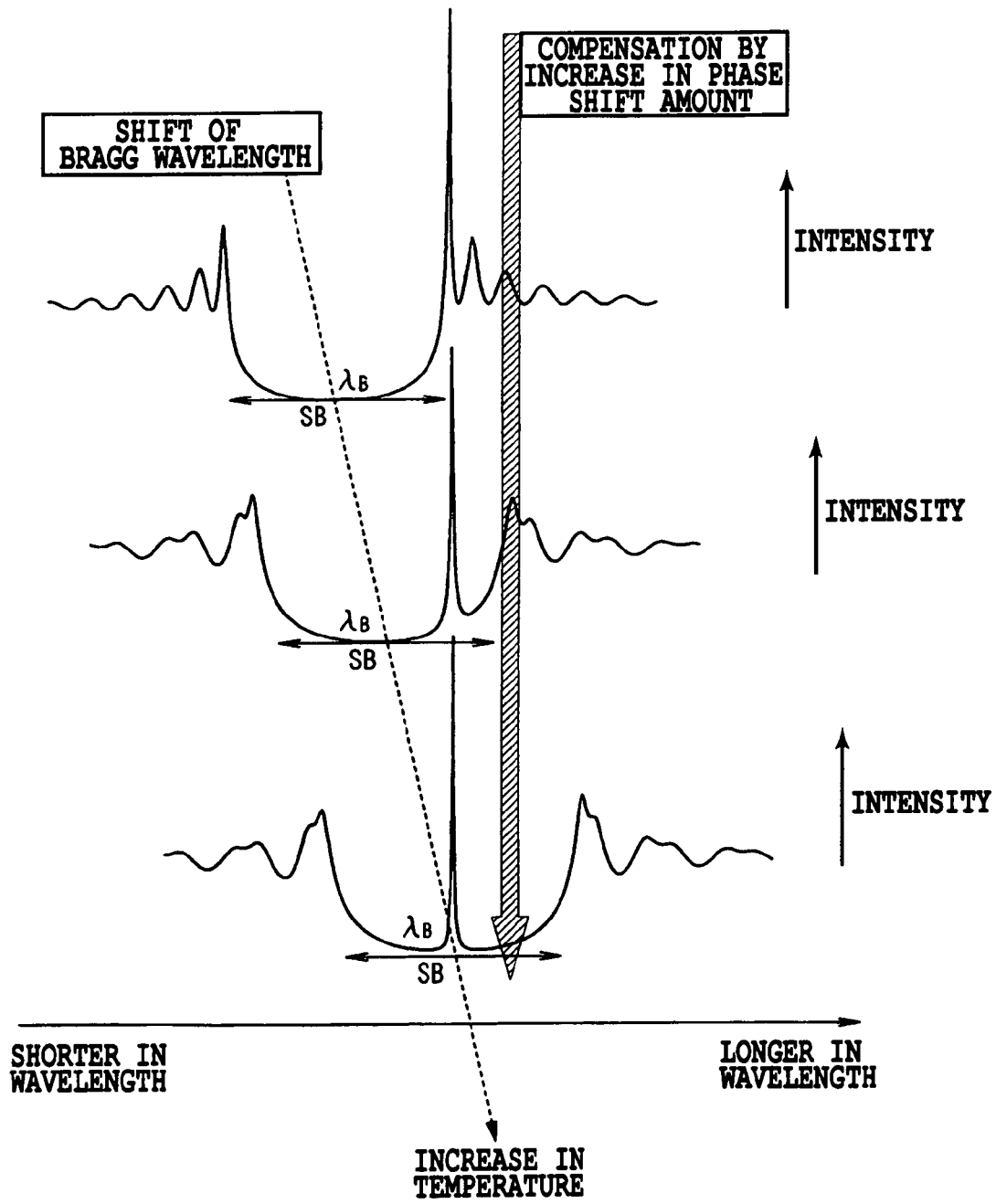
FIG. 3 is a diagram illustrating a compensation principle on the temperature dependence of oscillation wavelength for a semiconductor laser of an embodiment in accordance with the present invention.

FIG. 3 is a diagram illustrating a compensation principle of the temperature dependence of the oscillation wavelength of a semiconductor laser of an embodiment in accordance with the present invention.

FIG. 3 shows that although the Bragg wavelength $\lambda_B$ of the diffraction grating shifts toward the longer wavelength side as the temperature increases, the oscillation wavelength does not vary in spite of the temperature changes. As the stop bandwidth SB increases, the compensation can be made in a wider temperature range. For example, as for the example of FIG. 1, although the coupling coefficient of the diffraction grating is set at 300 cm$^{-1}$, an increasing coupling coefficient can broaden the stop bandwidth, thereby extending the temperature range for the compensation.

Although the foregoing description is made by way of example employing the temperature compensation material 103, which has the refractive index whose temperature dependence is opposite to that of the semiconductor, by replacing the material of the propagating region R3, a semiconductor laser with desired temperature dependence can be fabricated. In addition, since the propagating region R3 having no gain need not emit light, it need not have good crystallinity. Accordingly, organic materials or non-semiconductor materials can be employed, thereby allowing a wide selection of the material. Also, the propagating region having no gain can be configured using a material with the refractive index whose temperature dependence is greater than that of the semiconductor in the diffraction grating sections This makes it possible to form a semiconductor laser with a larger temperature dependence, which may be utilized as a temperature sensor. Furthermore, even if using a material whose refractive index increases with the temperature like the semiconductor, it is possible to configure the propagating region having no gain using a material with the refractive index whose temperature dependence is smaller than that of the semiconductor in the diffraction grating sections, thereby reducing the temperature dependence of the oscillation wavelength.

Figure 4:
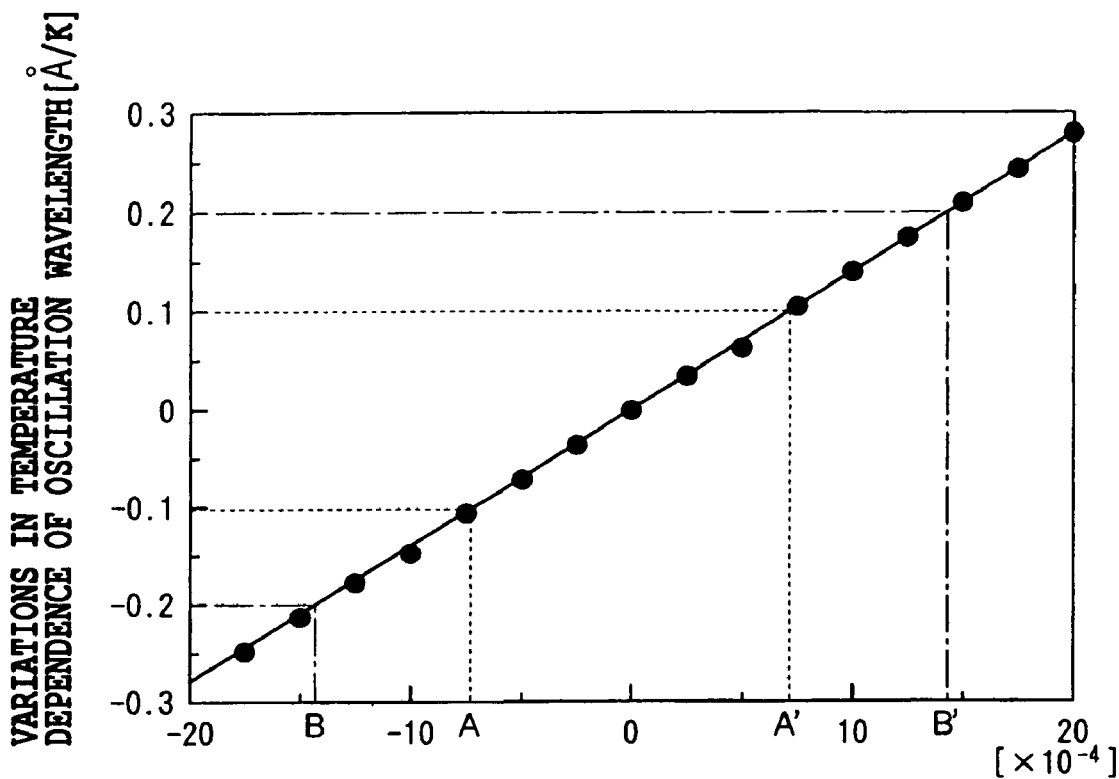
FIG. 4 is a graph illustrating the temperature coefficient difference of the refractive index and the temperature dependence of oscillation wavelength for a semiconductor laser of an embodiment in accordance with the present invention.

FIG. 4 is a diagram illustrating the temperature coefficient difference of the refractive index and the temperature dependence of the oscillation wavelength of a semiconductor laser of an embodiment in accordance with the present invention. In FIG. 4, the horizontal axis represents the product of the length of the propagating region having no wavelength selectivity nor gain and the difference between the refractive index temperature coefficients of the gain region having wavelength selectivity and of the propagating region having no wavelength selectivity nor gain; and the vertical axis represents the variations in the temperature dependence of the oscillation wavelength. In here, it is assumed that the device is configured with semiconductors-only, and that its regions have the same length and coupling coefficient of the diffraction gratings as in FIG. 1.

In FIG. 4, the temperature dependence of the oscillation wavelength is about 1 Å/K in the case of a DFB laser. Accordingly, to vary the oscillation wavelength about 10% thereof, it can be seen that the product of the length of the propagating region R3 and the difference between the temperature differential coefficient of the effective refractive index of the gain regions R1 and R2 and the temperature differential coefficient of the effective refractive index of the propagating region R3 is to be set at A point (decrease) and A' point (increase), whose values are ±7.5×10$^{-4}$[µm/K]. To vary the oscillation wavelength about 20%, it can be seen that the product of the length of the propagating region R3 and the difference between the temperature differential coefficient of the effective refractive index of the gain regions R1 and R2 and the temperature differential coefficient of the effective refractive index of the propagating region R3 is to beset at about ±14.5×10$^{-4}$[µm/K]. For example, when the length of the propagating region R3 is 10 µm, they become ±7.5×10$^{-4}$ [1/K], and ±1.45×10$^{-4}$ [1/K], respectively.

As for the structures of the active layers 102 and 104 of FIG. 1, it is not intended to limit, and the present invention is applicable to all the active layers with any commonly used structures to enable the control of the temperature dependence of the oscillation wavelength of the semiconductor laser. More specifically, as for the active layers 102 and 104, any desired materials such as InGaAsP, GaAs, AlGaAs, InGaAs and GaInNAs are applicable. As for the structures of the active layers 102 and 104, any of the bulk, MQW (multiple quantum well), quantum wire and quantum dot structures can be employed. Also, as for the waveguide structure of the active layer regions, any of the pn buried, ridge structure, semi-insulating buried structure and high-mesa structure can be used. As for the semiconductor substrate 101, it is not limited to an n-type substrate, but a p-type substrate or semi-insulating substrate can also be used.

Furthermore, the periodic perturbations need not be formed on the active layers 102 and 104. The same effects can be expected as long as they are formed on the regions in which the electric field of the light guided through the active layers has a finite value other than zero. For example, the periodic perturbations can be formed on an SCH layer with a separate confinement heterostructure (SCH structure) used by ordinary semiconductor lasers. Alternatively, it is possible to form the periodic perturbations on a layer having a refractive index higher than that of the cladding layer stacked on a region not contacting the active layers.

Furthermore, a waveguide structure having an optical confinement structure on one of the top and bottom or the right and left planes of the propagating region having no gain can reduce the propagating loss, thereby improving the characteristics of the semiconductor laser.

Moreover, the structure in accordance with the present invention can be formed in the thickness direction of the substrate to have the structure as a surface emitting laser, with which it is expected to achieve the same effect. In addition, as long as the first gain region R1, propagating region R3 and second gain region R2 are placed in this order along the optical axis, through reflecting mirrors formed by etching or the like, the first gain region R1, propagating region R3 and second gain region R2 can be disposed, and the optical axis may be bent in the layer direction or in the lateral direction along the way of the waveguide.

Figure 5:
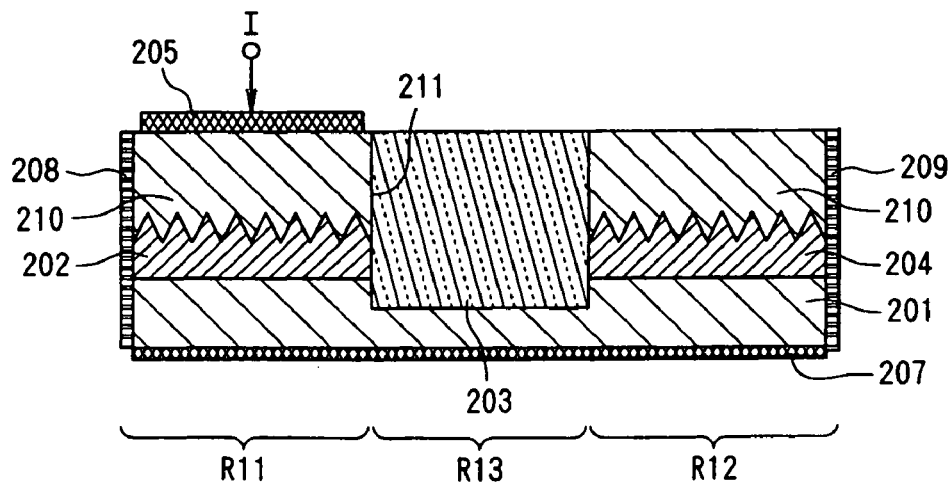
FIG. 5 is a cross-sectional view showing, along the waveguide direction, a configuration of a semiconductor laser of a second example in accordance with the present invention.

FIG. 5 is a cross-sectional view showing, along the waveguide direction, a configuration of a semiconductor laser of a second example in accordance with the present invention. The second example is to control the temperature dependence of the oscillation wavelength by providing, across the gain region R11 having wavelength selectivity and the reflection region R12 having no gain, the propagating region R13 that has the refractive index with different temperature dependence, and has no gain.

In FIG. 5, on a semiconductor substrate 201 are provided the first gain region R11 having wavelength selectivity, the propagating region R3 having the refractive index with different temperature dependence and no gain, and the second gain region R12 having the wavelength selectivity but no gain. Here, the gain region R11 has an active layer 202 that is formed on the semiconductor substrate 201, and has the wavelength selectivity and gain. The active layer 202 has a periodic perturbation with a complex refractive index, that is, a diffraction grating, which provides the active layer 202 with a distributed reflection structure. On the active layer 202, an electrode 205 is formed via a cladding layer 210.

Likewise, the reflection region R12 has a semiconductor layer 204 that is formed on the semiconductor substrate 201, and has the wavelength selectivity but no gain. Here, the semiconductor layer 204 has a periodic perturbation with a complex refractive index, that is, a diffraction grating, thereby providing the semiconductor layer 204 with a distributed reflection structure. The semiconductor layer 204 has a cladding layer 210 formed thereon. As the semiconductor substrate 201 and cladding layer 210, InP can be used for example, and as the active layer 202, GaInAsP with the light-emitting wavelength of 1.55 μm can be used, and as the semiconductor layer 204, GaInAsP with the light-emitting wavelength of 1.2 μm can be used for example. The semiconductor layer 204 can be formed by growing a material whose composition is different from that of the active layer 202 by selective growth or the like, followed by forming the diffraction grating with the periodic structure.

In addition, the propagating region R13 includes a removed region 211 formed by removing part of the active layer 202, semiconductor layer 204 and cladding layer 210 on the semiconductor substrate 201. The removed region 211 is filled with a temperature compensation material 203 having the refractive index whose temperature dependence differs from that of the gain region R11 and reflection region R12.

Here, as the temperature compensation material 203, it is possible to use an organic material with the refractive index whose temperature dependence is opposite to that of the semiconductors such as BCB. Also, using a multilayer of organic materials as the temperature compensation material 203, the waveguide loss can be reduced.

The propagating region R3 having no gain can be formed on the semiconductor substrate 201 by forming a groove with a desired width between the gain regions R11 and R12 using anisotropic etching such as reactive ion etching, followed by filling the groove with the organic material by spin coating or the like.

The cavity has an antireflection film 208 on the gain region side and antireflection film 209 on the reflection region side, formed on its end faces. The semiconductor substrate 201 has a backside electrode 207 formed on its back surface. The length of the first gain region R11 can be determined in such a manner that the gain region R11 does not oscillate by itself with its large reflection loss.

Then, the light emitted or reflected by the gain region R11 having wavelength selectivity passes through the propagating region R13 having no gain, and is reflected by the reflection region R12 having the wavelength selectivity but no gain. The reflected light passes through the propagating region R13 having no gain again, and returns to the gain region R11 having wavelength selectivity, thereby bringing about laser oscillation while providing feedback.

Thus, the gain region R11, reflection region R12 and propagating region R13 can participate in the laser oscillation, and the variations in the oscillation wavelength due to the temperature changes in the gain region R11 and reflection region R12 can be compensated for by the variations in the phase due to the temperature changes in the propagating region R3.

Using the organic material such as BCB, it makes possible to control the temperature dependence of the oscillation wavelength of the semiconductor laser. Accordingly, the oscillation wavelength of the semiconductor laser can be stabilized by a simple configuration and easy process without using a new material.

The length of the propagating region R13 having no gain can be set such that the longitudinal mode spacing, which is determined by the sum of the effective lengths of the diffraction gratings formed on the active layer 202 and semiconductor layer 204 and the length of the propagating region R13 having no gain, becomes broader than the stop bandwidth of the diffraction gratings. This allows only one longitudinal mode to exist within the stop bandwidth of the diffraction gratings with the gain of the remaining longitudinal modes being suppressed, thereby increasing the stability of the single mode operation.

Although the foregoing description is made by way of example employing the temperature compensation material 203 with the refractive index whose temperature dependence is opposite to that of the semiconductor as the propagating region R13 having no wavelength selectivity nor gain, by replacing the material of the propagating region R13, a semiconductor laser with desired temperature dependence can be fabricated. Also, since the propagating region R13 having no gain need not emit light, it need not have good crystallinity. Accordingly, organic materials or non-semiconductor materials can be employed, thereby allowing a wide selection of the material. Besides, the propagating region having no gain can be configured using a material with the refractive index whose temperature dependence is greater than that of the semiconductor in the diffraction grating section. This makes it possible to form a semiconductor laser with a larger temperature dependence, which can be utilized as a temperature sensor. Also, even if using a material whose refractive index increases with the temperature as the semiconductor, it is possible to configure the propagating region having no gain using a material with the refractive index whose temperature dependence is smaller than that of the semiconductor in the diffraction grating section, thereby reducing the temperature dependence of the oscillation wavelength.

As for the structure of the active layer 202 of FIG. 5, it is not intended to limit, and the present invention is applicable to all the active layers with any commonly used structures to enable the control of the temperature dependence of the oscillation wavelength of the semiconductor laser. More specifically, as for the active layer 202, any desired materials such as InGaAsP, GaAs, AlGaAs, InGaAs and GaInNAs are applicable. As for the structure of the active layer 202, any of the bulk, MQW (multiple quantum well), quantum wire and quantum dot structures can be employed. As for the waveguide structure of the active layer region, any of the pn buried, ridge structure, semi-insulating buried structure and high-mesa structure can be used. As for the semiconductor substrate 201, it is not limited to an n-type substrate, but a p-type substrate or semi-insulating substrate can also be used.

Furthermore, the periodic perturbations need not be formed on the active layer 202. The same effects can be expected as long as they are formed on the regions in which the electric field of the light guided through the active layer has a finite value other than zero. For example, the periodic perturbations can be formed on an SCH layer with a separate confinement heterostructure (SCH structure) used by ordinary semiconductor lasers. Alternatively, it is also possible to form the periodic perturbations on a layer having a refractive index higher than that of the cladding layer stacked on a region not contacting the active layer.

In addition, a waveguide structure having an optical confinement structure on one of the top and bottom or the right and left planes of the propagating region having no gain can reduce the propagating loss, thereby improving the characteristics of the semiconductor laser.

Moreover, the structure in accordance with the present invention can be formed in the thickness direction of the substrate to have the structure as a surface emitting laser, with which it is expected to achieve the same effect. When the gain region R11, propagating region R13 and reflection region R12 are placed in this order along the optical axis, through reflecting mirrors formed by etching or the like, the gain region R11, propagating region R13 and reflection region R12 can be disposed, and the optical axis may be bent in the layer direction or in the lateral direction along the way of the waveguide.

Figure 6:
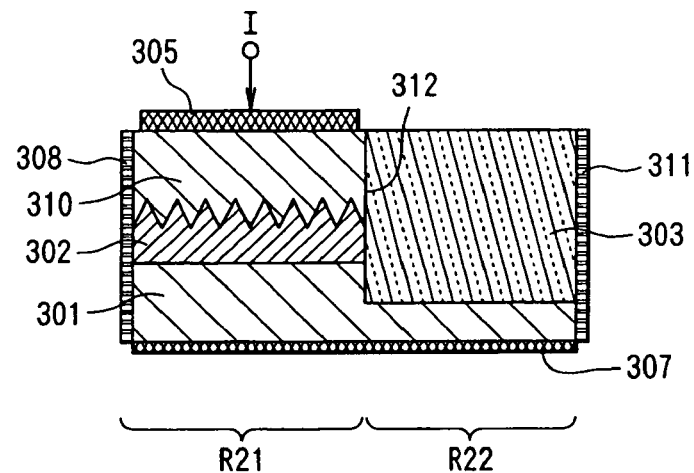
FIG. 6 is a cross-sectional view showing, along the waveguide direction, a configuration of a semiconductor laser of a third example in accordance with the present invention.

FIG. 6 is a cross-sectional view showing, along the waveguide direction, a configuration of a semiconductor laser of a third example in accordance with the present invention. The third example is to control the temperature dependence of the oscillation wavelength by coupling a gain region R21 having wavelength selectivity to a propagating region R22 that has the refractive index with different temperature dependence and has no gain.

In FIG. 6, on a semiconductor substrate 301 are formed the gain region R21 having wavelength selectivity, and the propagating region R22 that has the refractive index with the different temperature dependence and has no gain. Here, the gain region R21 includes an active layer 302 that is formed on the semiconductor substrate 301 and has the wavelength selectivity and gain. The active layer 302 has a periodic perturbation with a complex refractive index, that is, a diffraction grating, which provides the active layer 302 with a distributed reflection structure. On the active layer 302, an electrode 305 is formed via a cladding layer 310. As the semiconductor substrate 301 and cladding layer 310, InP can be used, and as the active layer 302, GaInAsP with the light-emitting wavelength of 1.55 μm can be used for example.

The propagating region R22 includes a removed region 312 formed by removing part of the active layer 302 and cladding layer 310 on the semiconductor substrate 301. The removed region 312 is filled with a temperature compensation material 303 having the refractive index whose temperature dependence differs from that of the gain region R21.

As the temperature compensation material 303, it is possible to use an organic material with the refractive index whose temperature dependence is opposite to that of the semiconductors such as BCB. Also, using a multilayer of organic materials as the temperature compensation material 303, the waveguide loss can be reduced.

The propagating region R22 having no gain can be formed on the semiconductor substrate 301 by forming a groove with a desired width at an end of the gain region R21 using anisotropic etching such as reactive ion etching, followed by filling the groove with the organic material by spin coating or the like.

The cavity has, on its end face on the gain region R21 side, an antireflection film 308 formed against the cleaved surface of the semiconductor substrate 301 on which the active layer 302 is formed. Also, the cavity has a high reflection film 311 formed on its end face on the propagating region R22 side. A backside electrode 307 is formed on the back surface of the semiconductor substrate 301. The length of the gain region R21 can be determined in such a manner that the gain region R21 does not oscillate by itself with its large reflection loss.

Then, the light emitted or reflected by the gain region R21 having wavelength selectivity passes through the propagating region R22 having no gain, and is reflected by the high reflection film 311. The reflected light passes through the propagating region R22 having no gain again, and returns to the gain region R21 having wavelength selectivity, thereby bringing about laser oscillation while providing feedback.

Thus, the gain region R21 and propagating region R22 can participate in the laser oscillation, and the variations in the oscillation wavelength due to the temperature changes in the gain region R21 can be compensated for by the variations in the phase due to the temperature changes in the propagating region R22.

Using the organic material such as BCB, it makes possible to control the temperature dependence of the oscillation wavelength of the semiconductor laser. Accordingly, the oscillation wavelength of the semiconductor laser can be stabilized by a simple configuration and easy process without using a new material.

The length of the propagating region R22 having no gain can be set such that the longitudinal mode spacing, which is determined by the sum of the effective length of the diffraction grating formed on the active layer 202 and the length of the propagating region R22 having no gain, becomes broader than the stop bandwidth of the diffraction grating. This allows only one longitudinal mode to exist within the stop bandwidth of the diffraction grating while suppressing the gain of the remaining longitudinal modes, thereby increasing the stability of the single mode operation.

Although the foregoing description is made by way of example that employs the temperature compensation material 303 with the refractive index whose temperature dependence is opposite to that of the semiconductor as the propagating region R22 having no wavelength selectivity nor gain, by replacing the material of the propagating region R22, a semiconductor laser with desired temperature dependence can be fabricated. Also, since the propagating region R22 having no gain need not emit light, it need not have good crystallinity. Accordingly, organic materials or non-semiconductor materials can be employed, thereby allowing a wide selection of the material. Besides, the propagating region having no gain can be configured using a material with the refractive index whose temperature dependence is greater than that of the semiconductor in the diffraction grating section. This makes it possible to form a semiconductor laser with a larger temperature dependence, which can be utilized as a temperature sensor. Even if using a material whose refractive index increases with the temperature as the semiconductor, it is possible to configure the propagating region having no gain using a material with the refractive index whose temperature dependence is smaller than that of the semiconductor in the diffraction grating section, thereby reducing the temperature dependence of the oscillation wavelength.

As for the structure of the active layer 302 of FIG. 6, it is not intended to limit, and the present invention is applicable to all the active layers with any commonly used structures to enable the control of the temperature dependence of the oscillation wavelength of the semiconductor laser. More specifically, as for the active layer 302, any desired materials such as InGaAsP, GaAs, AlGaAs, InGaAs and GaInNAs are applicable. In addition, as for the structure of the active layer 302, any of the bulk, MQW (multiple quantum well), quantum wire and quantum dot structures can be employed. As for the waveguide structure of the active layer region, any of the pn buried, ridge structure, semi-insulating buried structure and high-mesa structure can be used. As for the semiconductor substrate 301, it is not limited to an n-type substrate, but a p-type substrate or semi-insulating substrate can also be used.

Furthermore, the periodic perturbations need not be formed on the active layer 302. The same effects can be expected as long as they are formed on the regions in which the electric field of the light guided through the active layer has a finite value other than zero. For example, the periodic perturbations can be formed on an SCH layer with a separate confinement heterostructure (SCH structure) used by ordinary semiconductor lasers. Alternatively, it is also possible to form the periodic perturbations on a layer with a refractive index higher than that of the cladding layer stacked on a region not contacting the active layer.

Also, with a waveguide structure having an optical confinement structure on one of the top and bottom or the right and left planes of the propagating region having no gain, the propagating loss can be reduced, thereby improving the characteristics of the semiconductor laser.

Moreover, the structure in accordance with the present invention can be formed in the thickness direction of the substrate to have the structure as a surface emitting laser, with which it is expected to achieve the same effect. When the gain region R21 and propagating region R22 are placed along the optical axis, through a reflecting mirror formed by etching or the like, the gain region R21 and propagating region R22 can be disposed, and the optical axis may be bent in the layer direction or in the lateral direction along the way of the waveguide.

Figure 7:
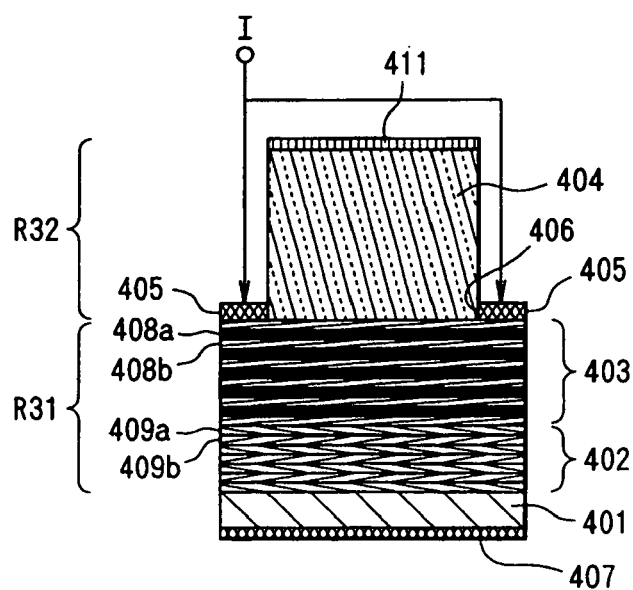
FIG. 7 is a cross-sectional view showing, along the waveguide direction, a configuration of a semiconductor laser of a fourth example in accordance with the present invention.

FIG. 7 is a cross-sectional view showing, along the waveguide direction, a configuration of a semiconductor laser of a fourth example in accordance with the present invention. The fourth example is to control the temperature dependence of the oscillation wavelength by stacking a propagating region R32 having no gain on a surface emitting laser.

In FIG. 7, on a semiconductor substrate 401, a gain region R31 having wavelength selectivity is stacked. On the gain region R31, a propagating region R32 is stacked which has the refractive index with different temperature dependence and has no gain. The propagating region R32 includes a temperature compensation material 404 with the refractive index whose temperature dependence differs from that of the gain region R31. Here, the gain region R31 has a distributed Bragg reflection layer 402 stacked on the semiconductor substrate 401 and an active region 403 that is stacked on the distributed Bragg reflection layer 402 and has wavelength selectivity. The distributed Bragg reflection layer 402 can have a structure comprising semiconductor layers 408a and 409b having different compositions stacked alternately, and the active region 403 can have a structure comprising active layers 408a and cladding layers 408b stacked alternately.

Then, on the active region 403, an electrode 405 is formed with an opening 406 for emitting light. Every layers of the gain region R31 need not have gain, if the region as a whole has gain.

As the semiconductor substrate 401, InP can be used, as the active layer 408a and cladding layer 408b, GaInAs/InAlAs can be used and as the semiconductor layers 408a and 409b, InAlGaAs/InAlAs can be used for example.

As the temperature compensation material 404, it is possible to use an organic material with the refractive index whose temperature dependence is opposite to that of the semiconductors such as BCB, for example. Also, using a multilayer of organic materials as the temperature compensation material 404, the waveguide loss can be reduced. As for the propagating region R32 having no gain, it can be formed by applying or depositing an organic material on the gain region R31.

Furthermore, a high reflection film 411 is formed on the temperature compensation material 404, and a backside electrode 407 is formed on the back surface of the semiconductor substrate 401. Here, the number of the active layers 408a and cladding layers 408b in the active region 403 can be determined in such a manner that the active region 403 does not oscillate by itself with its large reflection loss.

Then, the light emitted or reflected by the gain region R31 having wavelength selectivity passes through the propagating region R32 having no gain, and is reflected by the high reflection film 411. The reflected light passes through the propagating region R32 having no gain again, and returns to the gain region R31 having wavelength selectivity, thereby bringing about laser oscillation while providing feedback.

Thus, the gain region R31 and propagating region R32 can participate in the laser oscillation, and the variations in the oscillation wavelength due to the temperature changes in the gain region R31 can be compensated for by the variations in the phase due to the temperature changes in the propagating region R32.

Using the organic material such as BCB, it makes possible to control the temperature dependence of the oscillation wavelength of the semiconductor laser. Accordingly, the oscillation wavelength of the semiconductor laser can be stabilized by a simple configuration and easy process without using a new material.

The thickness of the propagating region R32 having no gain can be set such that the longitudinal mode spacing, which is determined by the sum of the effective length of the diffraction grating of the gain region R31 and the length of the propagating region R32 having no gain, becomes broader than the stop bandwidth of the diffraction grating. This allows only one longitudinal mode to exist within the stop bandwidth of the diffraction grating while suppressing the gain of the remaining longitudinal modes, thereby increasing the stability of the single mode operation.

Although the foregoing description is made by way of example that employs the temperature compensation material 404 with the refractive index whose temperature dependence is opposite to that of the semiconductor as the propagating region R32 having no wavelength selectivity nor gain, by replacing the material of the propagating region R32, a semiconductor laser with desired temperature dependence can be fabricated. Also, since the propagating region R32 having no gain need not emit light, it need not have good crystallinity. Accordingly, organic materials or non-semiconductor materials can be employed, thereby allowing a wide selection of the material. Besides, the propagating region having no gain can be configured using a material with the refractive index whose temperature dependence is greater than that of the semiconductor in the diffraction grating section. This makes it possible to form a semiconductor laser with a larger temperature dependence, which may be utilized as a temperature sensor. In addition, even if using a material whose refractive index increases with the temperature as the semiconductor, it is possible to configure the propagating region having no gain using a material with the refractive index whose temperature dependence is smaller than that of the semiconductor in the diffraction grating section, thereby reducing the temperature dependence of the oscillation wavelength.

As for the structure of the active region 403 of FIG. 7, it is not intended to limit, and the present invention is applicable to any active region 403 with any commonly used structures to enable the control of the temperature dependence of the oscillation wavelength of the semiconductor laser. More specifically, as for the active region 403, any desired materials such as InGaAsP, GaAs, AlGaAs, InGaAs and GaInNAs are applicable. As for the structure of the active region 403, any of the bulk, MQW (multiple quantum well), quantum wire and quantum dot structures can be employed as long as the diffraction grating can be formed by periodical stacking. As for the waveguide structure in the active region, any of the pn buried, semi-insulating buried structure and oxidation stricture structure can be used. As for the semiconductor substrate 401, it is not limited to an n-type substrate, but a p-type substrate or semi-insulating substrate can also be used.

Furthermore, by forming the propagating region having no gain with a waveguide structure having the optical confinement structure, the propagating loss can be reduced, thereby improving the characteristics of the semiconductor laser.

Figure 8:
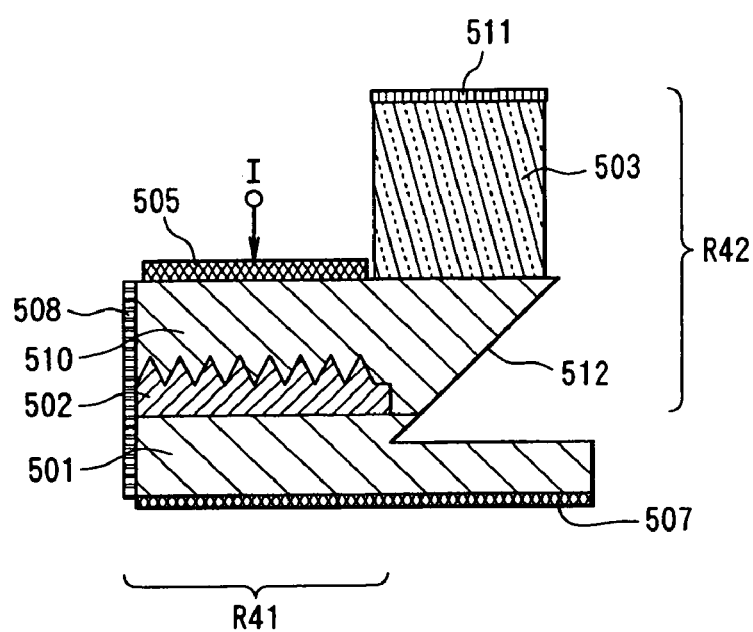
FIG. 8 is a cross-sectional view showing, along the waveguide direction, a configuration of a semiconductor laser of a fifth example in accordance with the present invention.

FIG. 8 is a cross-sectional view showing, along the waveguide direction, a configuration of a semiconductor laser of a fifth example in accordance with the present invention. The fifth example is to control the temperature dependence of the oscillation wavelength by coupling a gain region R41 having wavelength selectivity, via an optical path changing structure, to a propagating region R42 that has the refractive index with different temperature dependence and has no gain.

In FIG. 8, on a semiconductor substrate 501 are formed the gain region R41 having wavelength selectivity, and the propagating region R42 having no gain. The gain region R41 and the propagating region R42 are optically coupled via a reflecting mirror 512. Here, the gain region R41 comprises an active layer 502 that is formed on the semiconductor substrate 501, and has wavelength selectivity and gain. The active layer 502 has a periodic perturbation with a complex refractive index, that is, a diffraction grating, which provides the active layer 502 with a distributed reflection structure. On the active layer 502, an electrode 505 is formed via a cladding layer 510. As the semiconductor substrate 501 and cladding layer 510, InP can be used and as the active layer 502, GaInAsP with the light-emitting wavelength of 1.55 μm can be used for example. In addition, on the semiconductor substrate 501, the reflecting mirror 512 is formed at an end of the gain region R41. Here, the reflecting mirror 512 can be formed by etching the cladding layer 510 at the end of the gain region R41 in such a manner that an inclined surface making an angle of 90 degrees with the vertical direction is formed in the cladding layer 510.

The propagating region R42 includes a temperature compensation material 503 with the refractive index whose temperature dependence differs from that of the gain region R41. The temperature compensation material 503 is disposed on the cladding layer 510 in such a manner that it faces the reflecting mirror 512. The propagating region R42 having no gain is configured with the temperature compensation material 503 and an optical path, through which the light emitted from the gain region R41 travels and is reflected by the reflecting mirror 512 towards the temperature compensation material 503.

As the temperature compensation material 503, it is possible to use an organic material with the refractive index whose temperature dependence is opposite to that of the semiconductors such as BCB. Also, using a multilayer of organic materials as the temperature compensation material 503, the waveguide loss can be reduced.

The propagating region R42 having no gain can be formed on the cladding layer 510 by applying or stacking the organic material by spin coating or the like.

Furthermore, a high reflection film 511 is formed on the temperature compensation material 503, and the cavity has, on its end face on the gain region R41 side, an antireflection film 508 formed against the cleaved surface of the semiconductor substrate 501 on which the active layer 502 is formed. Also, a backside electrode 507 is formed on the back surface of the semiconductor substrate 501. The length of the gain region R41 can be determined in such a manner that the gain region R41 does not oscillate by itself with its large reflection loss.

Then, the light emitted or reflected by the gain region R41 having wavelength selectivity has its optical axis bent upward by the reflecting mirror 512, passes through the propagating region R42 having no gain, and is reflected by the high reflection film 511. The light reflected by the high reflection film 511 passes through the propagating region R42 having no gain again, has its optical axis bent to the horizontal direction by the reflecting mirror 512, and returns to the gain region R41 having wavelength selectivity, thereby bringing about laser oscillation while providing feedback.

Thus, the gain region R41 and propagating region R42 can participate in the laser oscillation, and the variations in the oscillation wavelength due to the temperature changes in the gain region R41 can be compensated for by the variations in the phase due to the temperature changes in the propagating region R42.

Using the organic material such as BCB, it makes possible to control the temperature dependence of the oscillation wavelength of the semiconductor laser. Accordingly, the oscillation wavelength of the semiconductor laser can be stabilized by a simple configuration and easy process without using a new material.

The length of the propagating region R42 having no gain can be set such that the longitudinal mode spacing, which is determined by the sum of the effective length of the diffraction grating formed on the active layer 502 and the length of the propagating region R42 having no gain, becomes broader than the stop bandwidth of the diffraction grating. This allows only one longitudinal mode to exist within the stop bandwidth of the diffraction grating while suppressing the gain of the remaining longitudinal modes, thereby increasing the stability of the single mode operation.

Although the foregoing example uses the reflecting mirror as the optical path changing structure, the same effect can be expected by causing the optical path to change by a diffraction grating, for example. In addition, although the foregoing example forms the reflecting mirror in such a manner that it changes the optical axis from the horizontal to vertical direction or vice versa, the optical axis can be bent by reflection on the same horizontal plane, and the number of the reflection positions is not necessarily limited to one. Furthermore, although the foregoing description is made by way of example that employs the temperature compensation material 503 with the refractive index whose temperature dependence is opposite to that of the semiconductor as the propagating region R42 having no wavelength selectivity nor gain, by replacing the material of the propagating region R42, a semiconductor laser with desired temperature dependence can be fabricated. Also, since the propagating region R42 having no gain need not emit light, it need not have good crystallinity. Accordingly, organic materials or non-semiconductor materials can be employed, thereby allowing a wide selection of the material. Besides, the propagating region having no gain can be configured using a material with the refractive index whose temperature dependence is greater than that of the semiconductor in the diffraction grating section. This makes it possible to form a semiconductor laser with a larger temperature dependence, which may be utilized as a temperature sensor. Also, even if using a material whose refractive index increases with the temperature as the semiconductor, it is possible to configure the propagating region having no gain using a material with the refractive index whose temperature dependence is smaller than that of the semiconductor in the diffraction grating section, thereby reducing the temperature dependence of the oscillation wavelength.

As for the structure of the active layer 502 of FIG. 8, it is not intended to limit, and the present invention is applicable to all the active layers with any commonly used structures to enable the control of the temperature dependence of the oscillation wavelength of the semiconductor laser. More specifically, as for the active layer 502, any desired materials such as InGaAsP, GaAs, AlGaAs, InGaAs and GaInNAs are applicable. As for the structure of the active layer 502, any of the bulk, MQW (multiple quantum well), quantum wire and quantum dot structures can be employed. As for the waveguide structure of the active layer region, any of the pn buried, ridge structure, semi-insulating buried structure and high-mesa structure can be used. As for the semiconductor substrate 501, it is not limited to an n-type substrate, but a p-type substrate or semi-insulating substrate can also be used.

Also, the periodic perturbation need not be formed on the active layer 502. The same effects can be expected as long as the periodic perturbation is formed in the region in which the electric field of the light guided through the active layer has a finite value other than zero. For example, the periodic perturbation can be formed on an SCH layer with a separate confinement heterostructure (SCH structure) used by ordinary semiconductor lasers. Alternatively, it is also possible to form the periodic perturbation on a layer with a refractive index higher than that of the cladding layer stacked on a region not contacting the active layer.

Furthermore, by forming the propagating region having no gain with a waveguide structure having the optical confinement structure, the propagating loss can be reduced, thereby improving the characteristics of the semiconductor laser.

FIGS. 9A-9E are cross-sectional views cut perpendicular to the waveguide direction, and each showing a configuration of a semiconductor laser of a sixth example in accordance with the present invention. The sixth example is to control the temperature dependence of the oscillation wavelength by providing a gain region with a structure different from that of an optical propagation region.

Figure 9A:
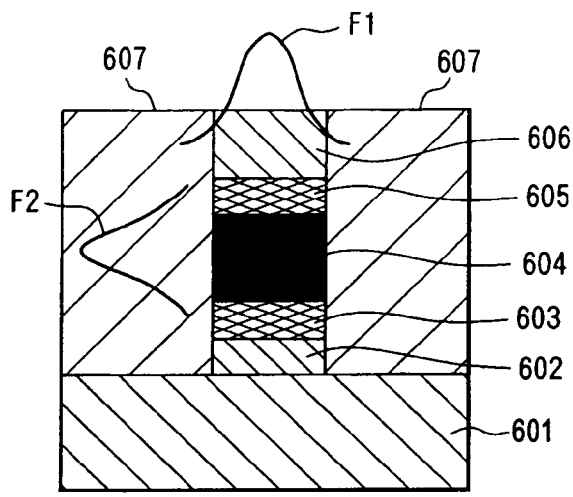
FIGS. 9A-9E are cross-sectional views cut perpendicular to the waveguide direction, showing configuration variations of a semiconductor laser of a sixth example in accordance with the present invention.

In FIG. 9A, on a semiconductor substrate 601, a buffer layer 602, an optical confinement layer 603, a core layer 604, an optical confinement layer 605 and a cap layer 606 are stacked successively, and these layers are buried in a burying layer 607.

Figure 9B:
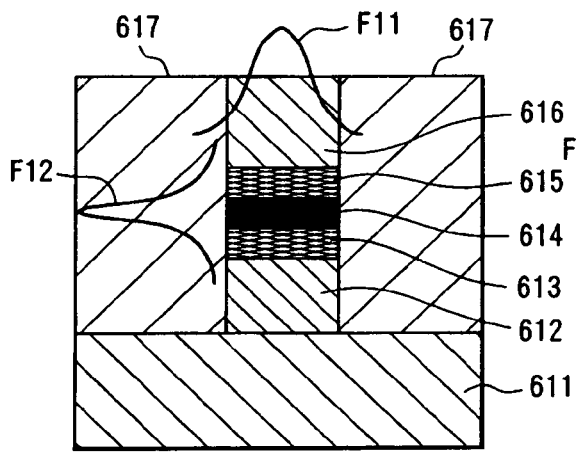

In FIG. 9B, on a semiconductor substrate 611, a buffer layer 612, an optical confinement layer 613, a core layer 614, an optical confinement layer 615 and a cap layer 616 are stacked successively, and these layers are buried in a burying layer 617.

Figure 9D:
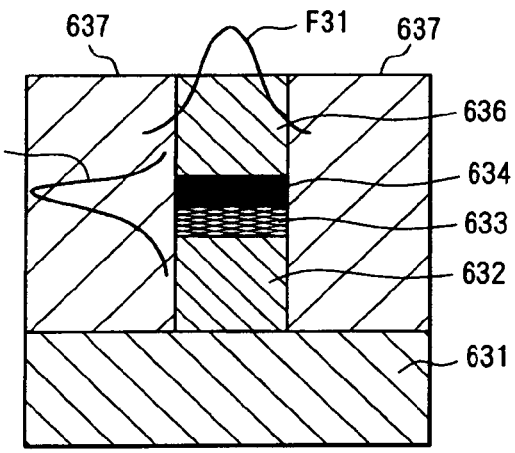
Figure 9C:
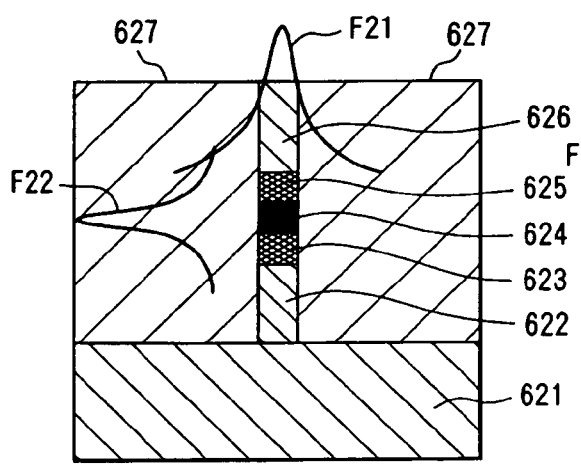

In FIG. 9C, on a semiconductor substrate 621, a buffer layer 622, an optical confinement layer 623, a core layer 624, an optical confinement layer 625 and a cap layer 626 are stacked successively, and these layers are buried in a burying layer 627.

In FIG. 9D, on a semiconductor substrate 631, a buffer layer 632, an optical confinement layer 633, a core layer 634 and a cap layer 636 are stacked successively, and these layers are buried in a burying layer 637.

Figure 9E:
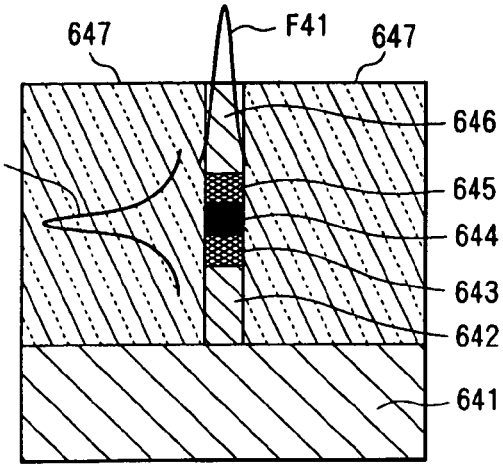

In FIG. 9E, on a semiconductor substrate 641, a buffer layer 642, an optical confinement layer 643, a core layer 644, an optical confinement layer 645 and a cap layer 646 are stacked successively, and these layers are buried in an organic material 647 composed of BCB or the like.

Here, the core layer 614 of FIG. 9B is thinner than the core layer 604 of FIG. 9A. This makes it possible to vary optical field distributions F2 and F12 in the vertical direction without changing the optical field distributions F1 and F11 in the horizontal direction, and hence to make a difference in the contribution of the individual layers to the effective refractive index and its temperature dependence. As a result, as for the configuration of FIG. 9A and the configuration of FIG. 9B, their effective refractive indices and temperature dependence can be made different. Accordingly, by combining the configuration of FIG. 9A with that of FIG. 9B, it makes possible to control the temperature dependence of the oscillation wavelength of the semiconductor laser.

The core layer 624 and optical confinement layers 623 and 625 of FIG. 9C are narrower in their width than the core layer 614 and optical confinement layers 613 and 615 of FIG. 9B. This makes it possible to vary optical field distributions F11 and F21 in the horizontal direction without changing the optical field distributions F12 and F22 in the vertical direction, and hence to make a difference in the contribution of the individual layers to the effective refractive indices and their temperature dependence. As a result, as for the configuration of FIG. 9B and the configuration of FIG. 9C, their effective refractive indices and temperature dependence can be made different. Accordingly, by combining the configuration of FIG. 9B with that of FIG. 9C, it makes possible to control the temperature dependence of the oscillation wavelength of the semiconductor laser.

In the configuration FIG. 9D, an upper layer of the core layer 633, an optical confinement layer 635, is omitted as compared in the configuration of FIG. 9B. This makes it possible to vary optical field distributions F12 and F32 in the vertical direction without changing the optical field distributions F11 and F31 in the horizontal direction, and hence to make a difference in the contribution of the individual layers to the effective refractive indices and their temperature dependence. As a result, as for the configuration of FIG. 9B and the configuration of FIG. 9D, their effective refractive indices and temperature dependence can be made different. Accordingly, by combining the configuration of FIG. 9B with that of FIG. 9D, it makes possible to control the temperature dependence of the oscillation wavelength of the semiconductor laser.

The configuration of FIG. 9E employs the organic material 647 instead of using the burying layer 627 of FIG. 9C. This makes it possible to vary optical field distributions F21 and F41 in the horizontal direction without changing the optical field distributions F22 and F42 in the vertical direction, and hence to make a difference in the contribution of the individual layers to the effective refractive indices and their temperature dependence. As a result, as for the configuration of FIG. 9C and the configuration of FIG. 9E, their effective refractive indices and temperature dependence can be made different. Accordingly, by combining the configuration of FIG. 9C with that of FIG. 9E, it makes possible to control the temperature dependence of the oscillation wavelength of the semiconductor laser.

Thus, combining the configurations of FIGS. 9A-9E enables the optical field distribution to be varied along the optical waveguide direction, which makes it possible to control the temperature dependence of the oscillation wavelength of the semiconductor laser even if the semiconductor lasers are configured using the same materials.

As the semiconductor substrates 601, 611, 621, 631 and 641, the buffer layers 602, 612, 622, 632 and 642, the cap layers 606, 616, 626, 636 and 646 and the burying layers 607, 617, 627 and 637, InP can be used for example. As the core layers 604, 614, 624, 634 and 644, GaInAsP with the light-emitting wavelength of 1.3 μm can be used and as the optical confinement layers 603, 613, 623, 633, 643, 605, 615, 625 and 645, GaInAsP with the light-emitting wavelength of 1.1 μm can be used for example.

As described above, the first embodiment in accordance with the present invention can control the temperature dependence of the oscillation wavelength of the semiconductor laser at a desired value by using a material with the refractive index whose temperature dependence differs from that of the gain region, and by using a rather simple configuration and easy process. In particular, it can eliminate the temperature dependence of the oscillation wavelength by employing the materials having the refractive index whose temperature dependence is opposite to that of the semiconductors as the materials of the propagating region having no gain, thereby allowing an implementation of the oscillation wavelength temperature independent semiconductor laser.

(Applications in Integrated Optical Waveguides)

Next, integrated optical waveguides of the second embodiment in accordance with the present invention will be described with reference to the accompanying drawings. The second embodiment can provide an integrated structure comprised of the semiconductor optical waveguide and the optical waveguide having a material whose refractive index differs from that of the semiconductor optical waveguide, and provide an optical semiconductor device and optical semiconductor integrated circuit using the integrated structure. In particular, the present embodiment can reduce the reflection from the interface at which the materials with different refractive indices are spliced. Several specific examples of the present embodiment will be described below.

Figure 10:
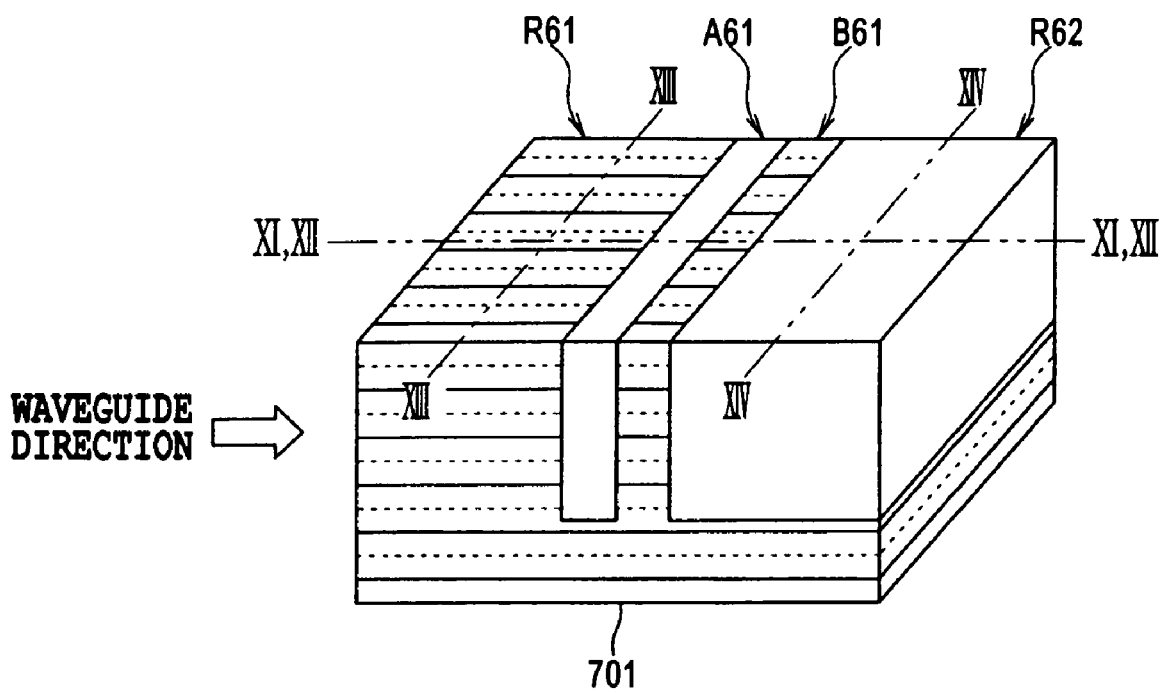
FIG. 10 is a perspective view showing a schematic configuration of a coupling section of an integrated optical waveguide of a seventh example in accordance with the present invention.

FIG. 10 is a perspective view showing a schematic configuration of a coupling section of an integrated optical waveguide of a seventh example in accordance with the present invention. The seventh example reduces the reflection on the boundary between an optical waveguide region R61 and an optical waveguide region R62 by providing a pair of a groove A61 and a semiconductor board B61.

In FIG. 10, on a semiconductor substrate 701, the optical waveguide region R61, the groove A61, the semiconductor board B61 and the optical waveguide region R62 are successively formed along the waveguide direction. Here, the refractive indices of the optical waveguide regions R61 and R62 can be set differently from each other. For example, the optical waveguide region R61 can be composed of semiconductor materials, and the optical waveguide region R62 can be composed of materials other than the semiconductors.

The groove A61 can be filled with a material other than the semiconductors such as the same material as that of the optical waveguide region R62. Also, the semiconductor board B61 can be configured to have the same structure as the optical waveguide region R61. The groove A61 and semiconductor board B61 are placed in such a manner that they traverse the waveguide direction. Preferably, the groove A61 and semiconductor board B61 may be placed perpendicularly to the waveguide direction.

The width of the groove A61 and the thickness of the semiconductor board B61 may be set in such a fashion that the light reflected off the interface between the optical waveguide region R61 and groove A61 is weakened by the light reflected off the interface between the groove A61 and the semiconductor board B61, and by the light reflected off the interface between the semiconductor board B61 and the optical waveguide region R62.

This makes it possible to reduce the reflection between the optical waveguides even in the case where the semiconductor optical waveguide and the non-semiconductor optical waveguide are integrated on the same semiconductor substrate 701, thereby allowing an implementation of an optical waveguide with new characteristics that cannot be achieved by only the semiconductors while maintaining the flexibility of the waveguide design.

The groove A61 and semiconductor board B61 may be formed on the semiconductor substrate 701 by etching the semiconductor substrate 701 on which the optical waveguide region R61 has been formed. Thus, the reflection from the boundary between the optical waveguide region R61 and the optical waveguide region R62 can be reduced without forming the antireflection film at the interface between the optical waveguide region R61 and the optical waveguide region R62, thereby facilitating the integration of the optical waveguides.

In addition, providing the semiconductor substrate 701 with the single semiconductor board B61 can reduce the reflection from the boundary between the optical waveguide region R61 and the optical waveguide region R62, which eliminates the need for disposing numbers of semiconductor boards as in a distributed reflector, thereby facilitating the fabrication of the integrated optical waveguide.

Figure 11:
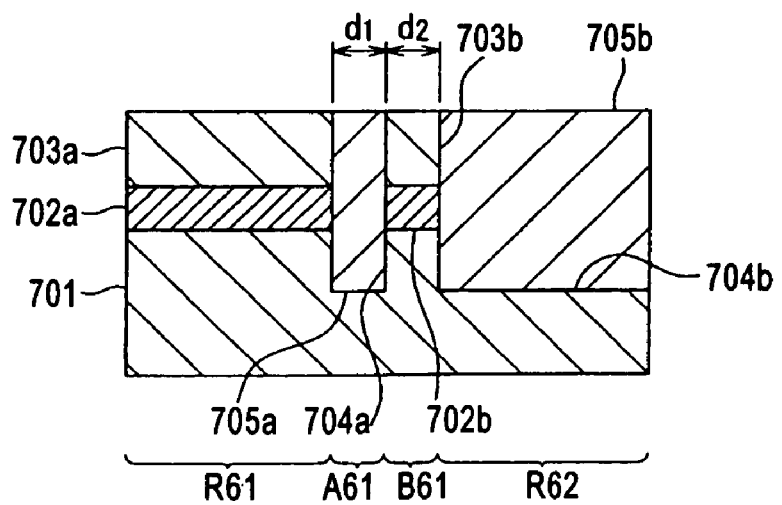
FIG. 11 is a cross-sectional view taken along the line XI, XII-XI, XII in the waveguide direction of FIG. 10.

FIG. 11 is a cross-sectional view taken along the line XI-XI in the waveguide direction of FIG. 10. In FIG. 11, core layers 702a and 702b are stacked on the semiconductor substrate 701, and upper cladding layers 703a and 703b are stacked on the core layers 702a and 702b. As the semiconductor substrate 701 and upper cladding layers 703a and 703b, InP can be used and as the core layers 702a and 702b, GaInAsP with the light-emitting wavelength of 1.3 μm can be used for example.

To stack the core layers 702a and 702b and the upper cladding layers 703a and 703b successively on the semiconductor substrate 701, epitaxial growth can be used such as MBE (molecular beam epitaxy), MOCVD (metal organic chemical vapor deposition), or ALCVD (atomic layer chemical vapor deposition).

By etching the semiconductor substrate 701, on which the core layers 702a and 702b and upper cladding layers 703a and 703b have been stacked successively, the groove 704a with the width $d_1$ which is disposed perpendicularly to the waveguide direction, as well as a notch 704b disposed apart from the groove 704a by a predetermined spacing $d_2$ on the semiconductor substrate 701 are formed.

Then by filling the groove 704a with a filler material 705a and the notch 704b with an optical waveguide material 705b, it makes possible to form the groove A61 at the interface with the optical waveguide region R61, as well as the optical waveguide region R62 separated from the groove A61 by the semiconductor board B61 with the thickness $d_2$.

This enables the adjustment of the phase of the reflected waves from the boundary between the optical waveguide region R61 and the optical waveguide region R62. Thus the reflected waves from the boundary between the optical waveguide region R61 and the optical waveguide region R62 can be canceled out each other.

Therefore the present example can integrate the optical waveguide region R61 and optical waveguide region R62 whose refractive indices differ from each other on the same semiconductor substrate 701 while enabling reduction of the reflection from the boundary between the optical waveguide region R61 and optical waveguide region R62, thereby allowing an implementation of the optical waveguide with new characteristics which cannot be achieved by a semiconductor-only configuration.

Here, as for the filler material 705a and optical waveguide material 705b, a material such as BCB (Benzocyclobutene) can be used which has the refractive index different from that of the semiconductors. In this case, the optical waveguide region R61 and semiconductor board B61 can each have an equivalent refractive index of 3.12, and the optical waveguide region R62 and groove A61 can each have an equivalent refractive index of 1.54. Incidentally, the equivalent refractive index is a refractive index defined with respect to the light propagating through optical waveguide. Accordingly, to treat the light propagating through optical waveguide, the previous refractive index can be replaced with the equivalent refractive index.

In general, the waveguide loss in the groove A61 and optical waveguide region R62 is negligibly small when their propagation distances in them are short. However, as the propagation distances in the groove A61 and optical waveguide region R62 increase, the waveguide loss becomes nonnegligible.

Figure 12:
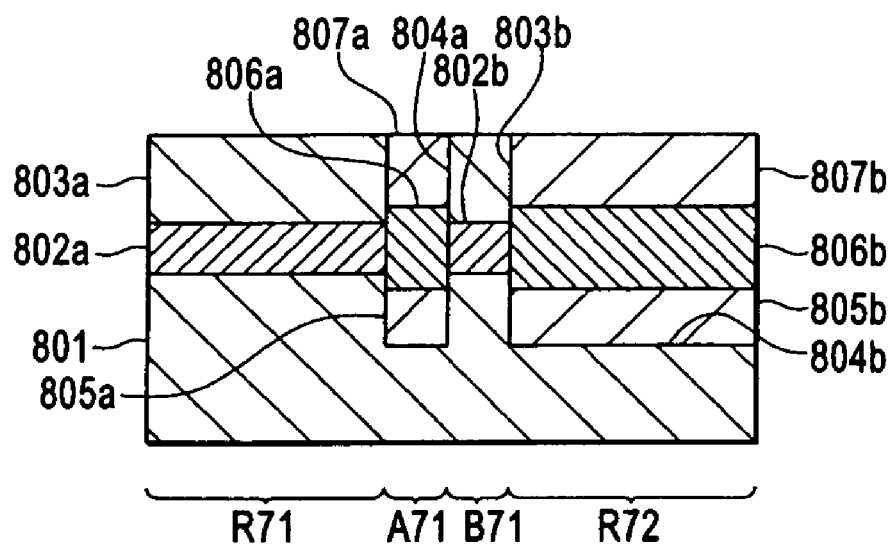
FIG. 12 is a cross-sectional view showing, along the waveguide direction, a schematic configuration of a coupling section of an integrated optical waveguide of an eighth example in accordance with the present invention.

For this reason, the sectional structure of FIG. 11 taken along the line XII-XII of FIG. 10 can be replaced by the sectional structure of FIG. 12.

FIG. 12 is a cross-sectional view showing, along the waveguide direction, a schematic configuration of a coupling section of the integrated optical waveguide of an eighth example in accordance with the present invention. The eighth example is configured to have core layers in the groove A61 and optical waveguide region R62 of FIG. 11. In FIG. 12, on the semiconductor substrate 801, an optical waveguide region R71, a groove A71, a semiconductor board B71 and an optical waveguide region R72 are formed successively along the waveguide direction.

More specifically, core layers 802a and 802b are stacked on the semiconductor substrate 801, and upper cladding layers 803a and 803b are stacked on the core layers 802a and 802b, respectively. As the semiconductor substrate 801 and upper cladding layers 803a and 803b, InP can be used and as the core layers 802a and 802b, GaInAsP with the light-emitting wavelength of 1.3 μm can be used for example.

Then, the groove 804a is formed perpendicularly to the waveguide direction by etching the semiconductor substrate 801 on which the core layers 802a and 802b and the upper cladding layers 803a and 803b have been stacked successively. Also, the notch 804b separated from the groove 804a by a predetermined spacing is formed on the semiconductor substrate 801.

Then, the groove 804a is filled with a core layer 806a sandwiched by cladding layers 805a and 807a, and the notch 804b is filled with a core layer 806b sandwiched by cladding layers 805b and 807b. Thus, the groove A71 disposed at the interface with the optical waveguide region R71 can be formed, and the optical waveguide region R72 separated from the groove A71 by the semiconductor board B71 can be formed.

As the material of the core layers 806a and 806b, BCB can be used and as the material of the cladding layers 805a, 807a, 805b and 807b, polyimide whose refractive index is lower than that of the core layers 806a and 806b can be used for example.

This makes it possible to reduce the waveguide loss in the groove A71 and optical waveguide region R72, while enabling reduction of the reflection from the boundary between the optical waveguide region R71 and the optical waveguide region R72.

Figure 13:
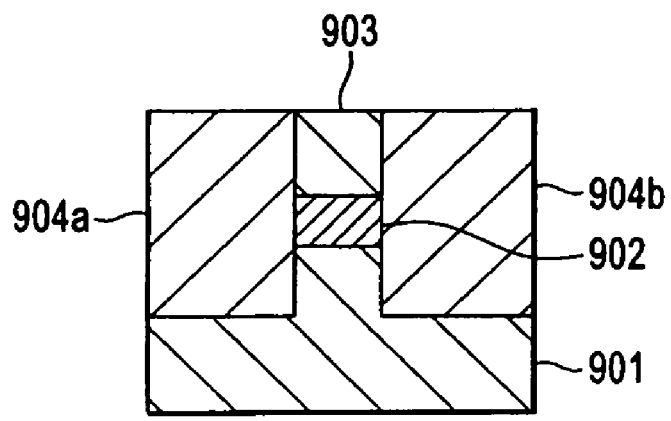
FIG. 13 is a cross-sectional view showing, along the direction orthogonal to the waveguide direction, a schematic configuration of an integrated optical waveguide of a ninth example in accordance with the present invention.

To suppress the waveguide loss in the lateral direction of the optical waveguide region R61 of FIG. 10, the sectional structure taken along the line XIII-XIII of FIG. 10 can be replaced by the sectional structure of FIG. 13.

FIG. 13 is a cross-sectional view showing, along the direction orthogonal to the waveguide direction, a schematic configuration of the integrated optical waveguide of a ninth example in accordance with the present invention. In FIG. 13, on a semiconductor substrate 901, a core layer 902 and an upper cladding layer 903 are stacked successively. Then the upper cladding layer 903, the core layer 902 and the top portion of the semiconductor substrate 901 are etched in stripes along the waveguide direction so that burying layers 904a and 904b are formed on both sides of the upper cladding layer 903, the core layer 902 and the top portion of the semiconductor substrate 901.

As the semiconductor substrate 901, upper cladding layer 903 and burying layers 904a and 904b, InP can be used and as the core layer 902, GaInAsP with the light-emitting wavelength of 1.3 μm can be used for example.

This makes it possible to reduce the waveguide loss in the optical waveguide region R61, while enabling reduction of the reflection from the boundary between the optical waveguide region R61 and the optical waveguide region R62.

Figure 14:
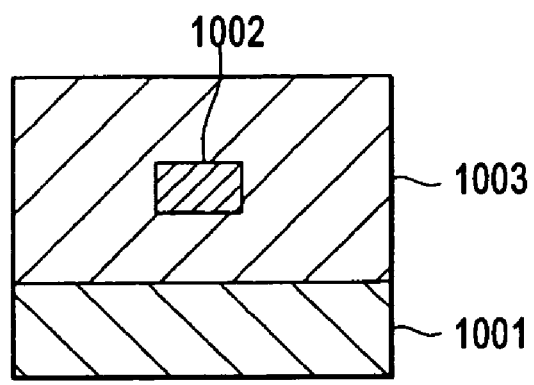
FIG. 14 is a cross-sectional view showing, along the direction orthogonal to the waveguide direction, a schematic configuration of an integrated optical waveguide of a 10th example in accordance with the present invention.

To suppress the waveguide loss in the lateral direction of the optical waveguide region R61 of FIG. 10, the sectional structure taken along the line XIV-XIV of FIG. 10 can be replaced by the sectional structure of FIG. 14.

FIG. 14 is a cross-sectional view showing, along the direction orthogonal to the waveguide direction, a schematic configuration of the integrated optical waveguide of a 10th example in accordance with the present invention. In FIG. 14, on a semiconductor substrate 1001, a core layer 1002 surrounded by a cladding layer 1003 is formed. As the semiconductor substrate 1001, InP can be used, as the material of the core layer 1002, BCB can be used and as the material of the cladding layer 1003, polyimide whose refractive index is lower than that of the core layer 1002 can be used for example.

This makes it possible to reduce the waveguide loss in the optical waveguide region R62, while enabling reduction of the reflection from the boundary between the optical waveguide region R61 and the optical waveguide region R62.

As for the shape of the core layers 702a and 702b of FIG. 11, it is not intended to limit. For example, it is possible to employ a separate confinement heterostructure (SCH) in which the core layers are sandwiched with materials having a refractive index between the refractive index at the center of the core layer and the refractive index of the cladding layer, or a graded index (GI-) SCH that has its refractive index varied stepwise.

To apply the present structure to a semiconductor laser, an active region can be used as the core, and its structure can be any of the bulk, MQW (multiple quantum well), quantum wire and quantum dot structures. As for the waveguide structure of the active region, any of the pn buried, ridge structure, semi-insulating buried structure and high-mesa structure can be used. As for the materials, they are not limited to the combination of the InP and GaInAsP, but any suitable materials such as GaAs, AlGaAs, InGaAs and GaInNAs are applicable.

In addition, as for the lateral confinement of FIG. 13, it is not intended to limit. For example, it is possible to employ a commonly used ridge waveguide or high-mesa waveguide as the semiconductor waveguide structure.

Furthermore, as for the optical waveguide region R62 of FIG. 14, it is not intended to limit. For example, it is possible to employ a ridge waveguide or high-mesa waveguide as the optical waveguide region R62.

The operation principle of the example of FIG. 11 will be described below.

In FIG. 11, assume that the equivalent refractive index of the optical waveguide region R61 and semiconductor board B61 is 3.12, and the equivalent refractive index of the optical waveguide region R62 and groove A61 is 1.54. According to the expression (3), reflection of about 12% occurs at each interface between the individual regions. The overall reflectance on the interfaces between the individual regions is not a simple summation, but is required to take the phases of the reflected waves into consideration. With equal intensities, if the phases are opposite, the light waves cancel each other out. Accordingly, the overall reflectance on the interfaces can be reduced by optimizing the phases of the reflected waves on the interfaces between the individual regions by adjusting the width of the groove A61 and the thickness of the semiconductor board B61.

Figure 15:
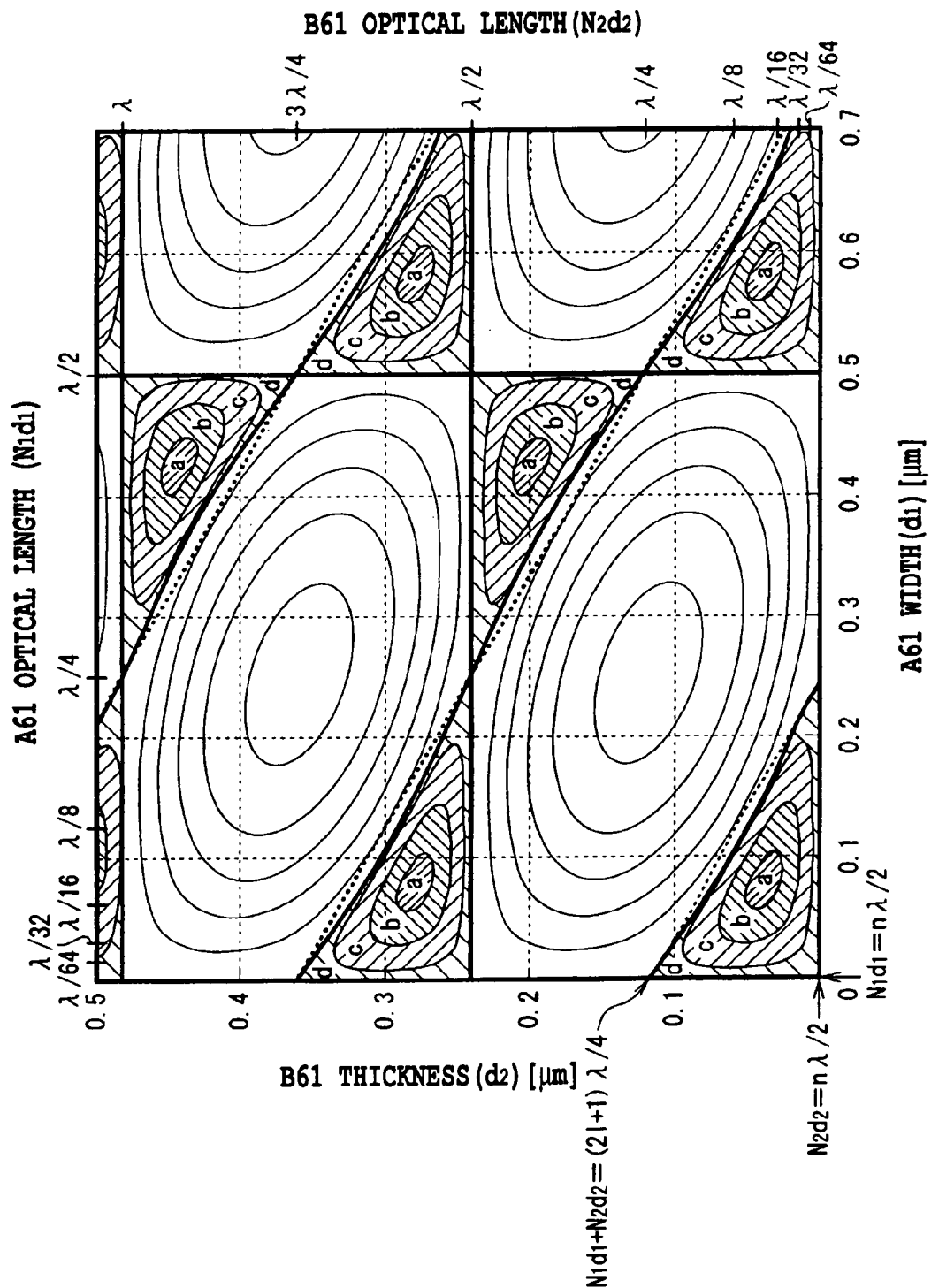
FIG. 15 is a chart illustrating the reflectance at the coupling section of the integrated optical waveguide of FIG. 11 in terms of the relationships between the width $d_1$ of the groove A61 and the thickness $d_2$ of the semiconductor board B61.

FIG. 15 is a chart illustrating the reflectance at the coupling section of the integrated optical waveguide of FIG. 11 in terms of the relationships between the width $d_1$ of the groove A61 and the thickness $d_2$ of the semiconductor board B61. In FIG. 15, with the equivalent refractive index $N_1$ of the optical waveguide region R61 and semiconductor board B61 being 3.12, and the equivalent refractive index $N_2$ of the optical waveguide region R62 and groove A61 being 1.54, the reflectance is represented in contour with respect to the width $d_1$ of the groove A61 and the thickness $d_2$ of the semiconductor board B61. To make more general description, optical lengths are shown on the axes opposite to the respective axes.

In FIG. 15, bold solid lines represent the reflectance (about 12%) in the case where the optical waveguide region R61 is directly spliced to the optical waveguide region R62 without forming the groove A61 and semiconductor board B61. More specifically, the bold solid lines consist of lines when the optical length of the groove A61 or that of the semiconductor board B6 is $\lambda/2$, where $\lambda$ is the incident wavelength, and curves close to lines $N_1 d_1 + N_2 d_2 = \lambda/4 \times (2l+1)$ represented by the dotted lines, where l is an integer.

In near-triangular regions encompassed by the bold solid lines, the reflectance becomes smaller than in the case where the two waveguides are simply spliced. The triangular regions can be represented by ranges approximated by the following expressions.

$$N_1 d_1 > \lambda/2n,\ N_2 d_2 > \lambda/2m,\ N_1 d_1 + N_2 d_2 < \lambda/4(2l+1) \quad (6)$$

where l, m and n are integers satisfying the relation n+m=l, or $$N_1 d_1 < \lambda/2n,\ N_2 d_2 < \lambda/2m,\ N_1 d_1 + N_2 d_2 > \lambda/4(2l+1) \quad (7)$$

where l, m and n are integers satisfying the relation n+m=l−1.

Here, as indicated by the triangle closest to the origin, in the region c obtained by shifting the sides of the triangle toward the center of the triangle by $\lambda/64$, the reflectance can be made equal to or less than 10% (about 80% with respect to the simple splice of the two waveguides). Likewise, in the region b shifted by $\lambda/32$, the reflectance can be made equal to or less than 5% (about 40% with respect to the simple splice of the two waveguides), and in the region a shifted by $\lambda/16$, the reflectance can be made equal to or less than 1% (about 8% with respect to the simple splice of the two waveguides). The region d is an area in which the reflectance becomes lower than the reflectance of the simple splice of the two waveguides.

More specifically, assume that the sides of the triangle are reduced by an amount $\delta x$, then its sides are represented by the following expressions.

$$N_1 d_1 > n\lambda/2 \pm \delta x,$$

$$N_2 d_2 > m\lambda/2 \pm \delta x,$$

$$N_1 d_1 + N_2 d_2 = \lambda/4 \times (2l+1) \pm \delta x,$$

The expressions are applicable for other triangular regions.

To achieve nonreflection, it is necessary to satisfy the following expressions.

$$N_1 d_1 + N_2 d_2 = \pm \lambda/(2\pi)[\cos^{-1}\{\pm(N_1^2 + N_2^2)/(N_1 + N_2)^2\} + 2m\pi] \quad (8)$$

$$N_1 d_1 - N_2 d_2 = \lambda/2n \quad (9)$$

where m and n are integers. This corresponds to nearly the center of each triangular region.

Although the foregoing description is made by way of example in which the material filling the groove A61 is the same as the material of the optical waveguide region R62, the materials can differ from each other. In addition, it is not necessary for the optical waveguide region R61 and semiconductor board B61 to have the same layer structure.

Figure 16:
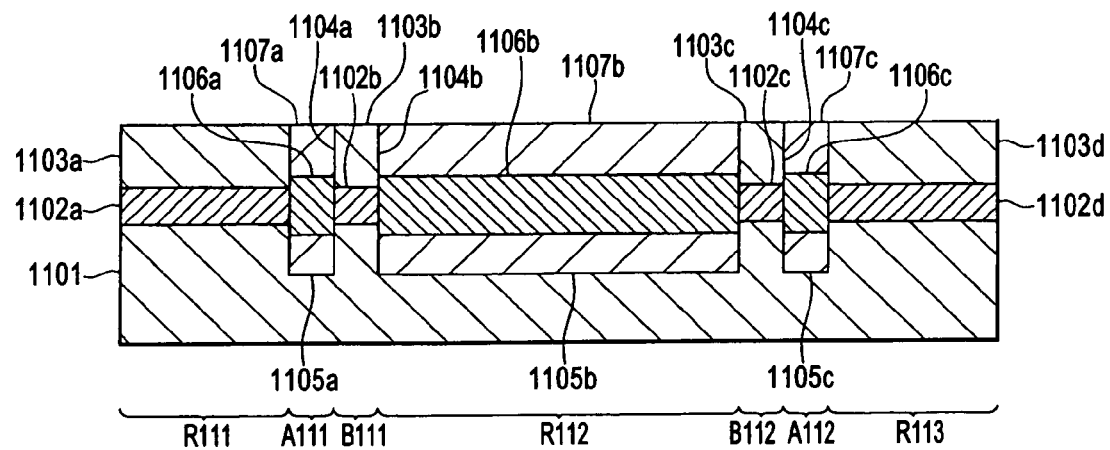
FIG. 16 is a cross-sectional view showing a schematic configuration of an integrated optical waveguide of the 10th example in accordance with the present invention.

FIG. 16 is a cross-sectional view showing a schematic configuration of an integrated optical waveguide of a 10th example in accordance with the present invention. The 10th example has the structures of FIG. 12 disposed opposingly each other. In FIG. 16, on a semiconductor substrate 1101, an optical waveguide region R111, a groove A111, a semiconductor board B111, an optical waveguide region R112, a semiconductor board B112, a groove A112 and an optical waveguide region R113 are successively formed in the waveguide direction.

The refractive index of the optical waveguide regions R111 and R113 may differ from the refractive index of the optical waveguide region R112. For example, the optical waveguide regions R111 and R113 may be built from semiconductor materials and the optical waveguide region R112 may be built from materials other than the semiconductors.

In addition, the grooves A111 and A112 can be filled with a material other than the semiconductors such as the material identical to that of the optical waveguide region R112, for example. Semiconductor boards B111 and B112 may have the same structure as the optical waveguide regions R111 and R113. The grooves A111 and A112 and semiconductor boards B111 and B112 are placed in such a manner that they traverse the waveguide direction, and are preferably disposed perpendicularly to the waveguide direction.

As for the width of the groove A111 and the thickness of the semiconductor board B111, they can be set such that the light reflected off the interface between the optical waveguide region R111 and the groove A111 is weakened by the light reflected from the interface between the groove A111 and the semiconductor board B111 and the light reflected from the interface between the semiconductor board B111 and the optical waveguide region R112.

As for the width of the groove A112 and the thickness of the semiconductor board B112, they can be set such that the light reflected of f the interface between the optical waveguide region R112 and the semiconductor board B112 is weakened by the light reflected from the interface between the semiconductor board B112 and the groove A112 and the light reflected from the interface between the groove A112 and the optical waveguide region R113.

More specifically, on the semiconductor substrate 1101, core layers 1101a-1101d are stacked, and on the core layers 1101a-1101d, upper cladding layers 1103a-1103d are stacked, respectively. As the semiconductor substrate 1101 and upper cladding layers 1103a-1103d, InP can be used and as the core layers 1101a-1101d, GaInAsP with the light-emitting wavelength of 1.3 μm can be used for example.

Then, by etching the semiconductor substrate 1101 on which the core layers 1101a-1101d and upper cladding layers 1103a-1103d have been stacked successively, grooves 1104a and 1104c disposed perpendicularly to the waveguide direction are formed, and a concave section 1104b separated from the grooves 1104a and 1104c by a predetermined spacing, is formed on the semiconductor substrate 1101.

Grooves A111 and A112 disposed at the interfaces with the optical waveguide regions R111 and R113 can be formed by burying a core layer 1106a sandwiched by cladding layers 1105a and 1107a in the groove 1104a, and by burying a core layer 1106c sandwiched by cladding layers 1105c and 1107c in the groove 1104c.

The optical waveguide region R112 disposed across the grooves A111 and A112 via the semiconductor boards B111 and B112 can be formed by burying a core layer 1106b sandwiched by cladding layers 1105b and 1107b in the concave section 1104b.

As the material of the core layers 1106a-1106c, BCB can be used and as the material of the cladding layers 1105a-1105c and 1107a-1107c, polyimide whose refractive index is lower than that of the core layers 1106a-1106c can be used for example.

This makes it possible to integrate the optical waveguide composed of the material whose refractive index differs from the semiconductor into an intermediate location of the semiconductor optical waveguide, while enabling reduction of the reflection between the optical waveguides in the case where the semiconductor optical waveguide and the non-semiconductor optical waveguide are integrated on the same semiconductor substrate 1101. This enables the implementation of an optical waveguide with new characteristics that cannot be achieved by semiconductor-only configuration while maintaining the flexibility of the waveguide design.

The example of FIG. 16 has the structures of FIG. 12 disposed opposingly. Accordingly, as for the materials and structure of the waveguides, core layers and cladding layers of the example of FIG. 16, it is not intended to limit, and materials and structures other than those described herein can also be used.

In addition, although only a pair of structures of FIG. 12 is disposed face to face in the example of FIG. 16, three or more structures of FIG. 12 can be connected in cascade. Using the structures of FIG. 12 enables the suppression of the reflectance between the individual optical waveguides, thereby suppressing the reflectance throughout the integrated optical waveguide.

Considering the optical length of the foregoing integrated optical waveguide, the optical length of the optical waveguide increases with an increase of the ambient temperature because the refractive index of the semiconductors increases with the temperature, that is, the refractive index has a positive temperature differential coefficient.

Thus, the optical waveguide region R62 of FIG. 11 and the optical waveguide region R112 of FIG. 16 can be configured by using a material having a negative refractive index temperature differential coefficient, for example. This makes it possible to suppress the temperature changes of the overall optical length of the optical waveguides, even if the optical lengths of the individual optical waveguides vary because of the temperature changes. As a material with the negative refractive index temperature differential coefficient, PMMA can be used, for example.

Figure 17:
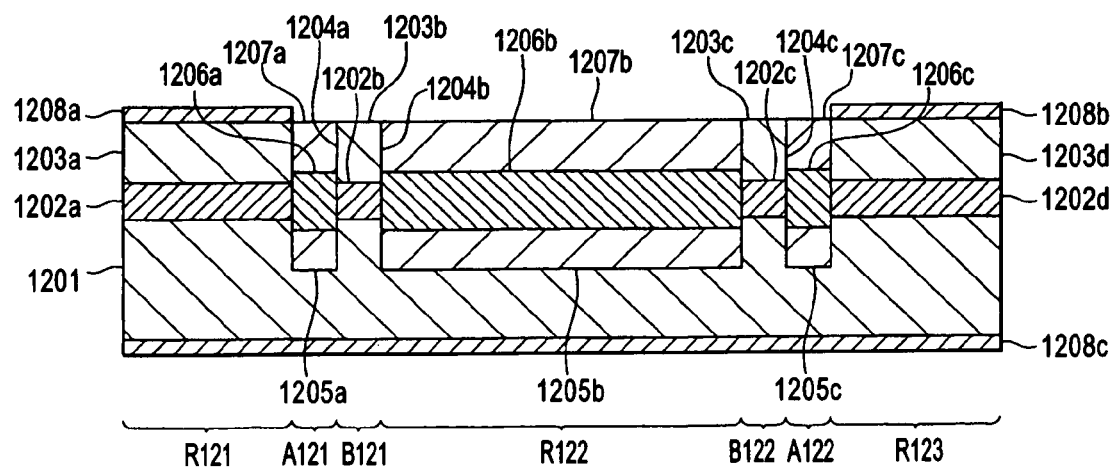
FIG. 17 is a cross-sectional view showing a schematic configuration of an integrated optical waveguide of an 11th example in accordance with the present invention.

FIG. 17 is a cross-sectional view showing a schematic configuration of an integrated optical waveguide of an 11th example in accordance with the present invention. The 11th example has semiconductor lasers integrated into the structure of FIG. 16. In FIG. 17, on a semiconductor substrate 1201, an optical waveguide region R121, a groove A121, a semiconductor board B121, an optical waveguide region R122, a semiconductor board B122, a groove A122 and an optical waveguide region R123 are formed successively in the waveguide direction. In addition, a laser diode is formed on the optical waveguide region R121 and on the optical waveguide region R123.

The refractive index of the optical waveguide regions R121 and R123 may differ from the refractive index of the optical waveguide region R122. For example, the optical waveguide regions R121 and R123 may be built from semiconductor materials and the optical waveguide region R122 may be built from materials other than the semiconductors.

In addition, the grooves A121 and A122 can be filled with a material other than the semiconductors such as the material identical to that of the optical waveguide region R122, for example. The semiconductor boards B121 and B122 may have the same structure as the optical waveguide regions R121 and R123. In addition, the grooves A121 and A122 and semiconductor boards B121 and B122 are placed in such a manner that they traverse the waveguide direction, and are preferably disposed perpendicularly to the waveguide direction.

As for the width of the groove A121 and the thickness of the semiconductor board B121, they can be set such that the light reflected off the interface between the optical waveguide region R121 and the groove A121 is weakened by the light reflected from the interface between the groove A121 and the semiconductor board B121 and the light reflected from the interface between the semiconductor board B121 and the optical waveguide region R122.

As for the width of the groove A122 and the thickness of the semiconductor board B122, they can be set such that the light reflected off the interface between the optical waveguide region R122 and the semiconductor board B122 is weakened by the light reflected from the interface between the semiconductor board B122 and the groove A122 and the light reflected from the interface between the groove A122 and the optical waveguide region R123.

More specifically, on the semiconductor substrate 1201, active layers 1202a and 1202d and core layers 1201b-1201c are stacked, and on the active layers 1201b-1201c and core layers 1202b and 1202c, upper cladding layers 1203a, 1203d, 1203b and 1203c are stacked, respectively. As the semiconductor substrate 1201 and upper cladding layers 1203a-1203d, InP can be used and as the active layers 1202a and 1202d and core layers 1202b and 1202c, GaInAsP with the light-emitting wavelength of 1.55 μm can be used for example. In addition, the semiconductor substrate 1201 can be made an n-type, and the upper cladding layers 1203a-1203d can be made a p-type, for example.

Then, by etching the semiconductor substrate 1201 on which the active layers 1202a and 1202d and core layers 1202c and 1202c have been stacked, and then the upper cladding layers 1203a-1203d are stacked thereon, grooves 1204a and 1204c disposed perpendicularly to the waveguide direction are formed, and a concave section 1204b separated from the grooves 1204a and 1204c by a predetermined spacing, is formed on the semiconductor substrate 1201. Thus, the active layers 1202a and 1202d can be disposed corresponding to the optical waveguide regions R121 and R123, and the core layers 1202b and 1202c can be disposed corresponding to the semiconductor boards B121 and B122.

Then, the grooves A121 and A122 disposed at the interfaces with the optical waveguide regions R121 and R123 can be formed by burying a core layer 1206a sandwiched by cladding layers 1205a and 1207a into a groove 1204a, and by burying a core layer 1206c sandwiched by cladding layers 1205c and 1207c into a groove 1204c.

In addition, the optical waveguide region R122 disposed across the grooves A121 and A122 via the semiconductor boards B121 and B122 can be formed by burying a core layer 1206b sandwiched by cladding layers 1205b and 1207b into a concave section 1204b.

Furthermore, a laser diode can be built in the optical waveguide region R121 and optical waveguide region R123 by forming electrodes 1208a and 1208b on the upper cladding layers 1203a and 1203d, and by forming an electrode 1208c on the back surface of the semiconductor substrate 1201.

As the material of the core layers 1206a-1206c, BCB can be used and as the material of the cladding layers 1205a-1205c and 1207a-1207c, polyimide whose refractive index is lower than that of the core layers 1206a-1206c can be used for example.

In addition, the optical waveguide region R122 can be formed using a material with a negative refractive index temperature differential coefficient such as PMMA. This makes it possible to keep the cavity length constant regardless of the temperature, and suppress the temperature dependence of the oscillation wavelength of the semiconductor laser.

Also, the optical waveguide regions R121 and R123 may have a diffraction grating to provide the wavelength selectivity, and it is also possible to fabricate a distributed feedback (DFB) semiconductor laser or distributed reflector (DBR).

As for the structure of the active layers 1202a and 1202d and core layers 1202b and 1202c, it is possible to employ a separate confinement heterostructure (SCH) that sandwiches them with materials having a refractive index between the refractive index at the center of the active layers or core layers and the refractive index of the cladding layers, or a graded index (GI-) SCH that has its refractive index varied stepwise.

As for the shapes of the active layers 1202a and 1202d, any of the bulk, MQW (multiple quantum well), quantum wire and quantum dot structures can be use, and as for the waveguide structure of the active regions, any of the pn buried, ridge structure, semi-insulating buried structure and high-mesa structure can be used. As for the materials, they are not limited to the combination of the InP and GaInAsP, but any suitable materials such as GaAs, AlGaAs, InGaAs and GaInNAs are applicable.

Figure 18:
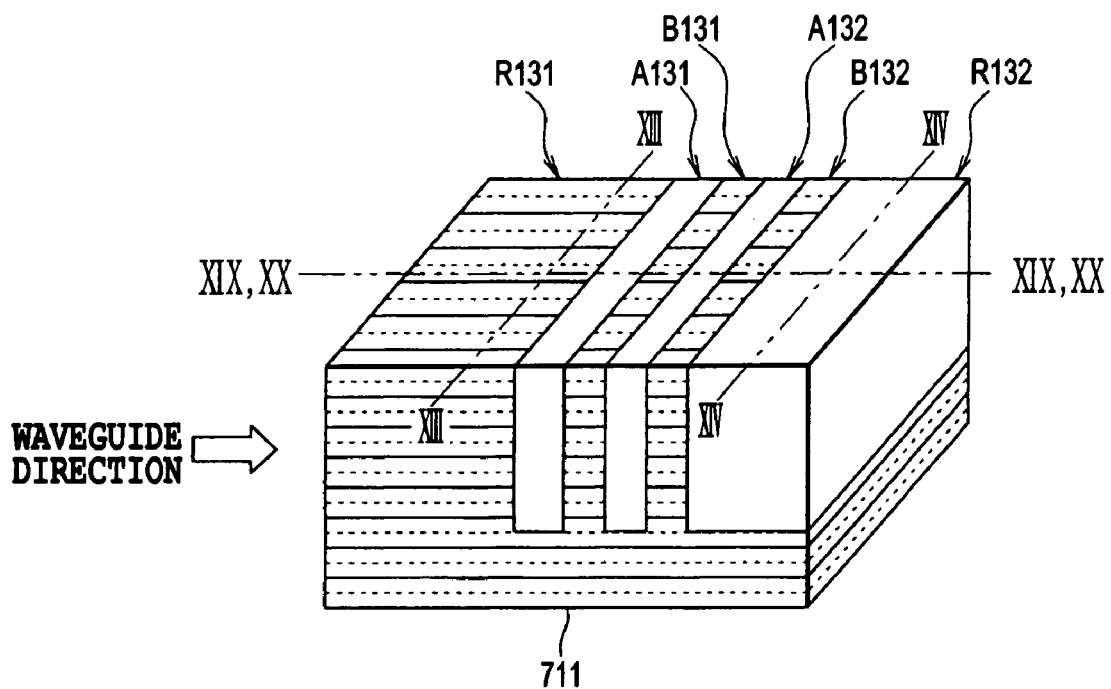
FIG. 18 is a perspective view showing a schematic configuration of a coupling section of an integrated optical waveguide of a 12th example in accordance with the present invention.

FIG. 18 is a perspective view showing a schematic configuration of a coupling section of an integrated optical waveguide of a 12th example in accordance with the present invention. The 12th example increases the wavelength range, in which the reflection on the boundary between an optical waveguide region R131 and an optical waveguide region R132 can be reduced, by providing two pairs of grooves A131 and A132 and semiconductor boards B131 and B132.

In FIG. 18, on a semiconductor substrate 711, the optical waveguide region R131, the groove A131, the semiconductor board B131, the groove A132, the semiconductor board B132 and the optical waveguide region R132 are successively formed along the waveguide direction. Here, the refractive indices of the optical waveguide regions R131 and R132 may differ from each other. For example, the optical waveguide region R131 may be composed of semiconductor materials, and the optical waveguide region R132 may be composed of materials other than the semiconductors.

The grooves A131 and A132 can be filled with a material other than the semiconductors such as the same material as that of the optical waveguide region R132. Also, the semiconductor boards B131 and B132 may be configured to have the same structure as the optical waveguide region R131. The grooves A131 and A132 and semiconductor boards B131 and B132 are placed in such a manner that they traverse the waveguide direction. Preferably, the grooves A131 and A132 and semiconductor boards B131 and B132 be placed perpendicularly to the waveguide direction.

The widths of the grooves A131 and A132 and the thicknesses of the semiconductor boards B131 and B132 can be set in such a fashion that the light reflected off the interface between the optical waveguide region R131 and groove A131 is weakened by the light reflected from the interface between the groove A131 and the semiconductor board B131, by the light reflected from the interface between the semiconductor board B131 and the groove A132, by the light reflected from the interface between the groove A132 and the semiconductor board B132, and by the light reflected from the interface between the semiconductor board B132 and the optical waveguide region R132.

This makes it possible to reduce the reflection between the optical waveguides even in the case where the semiconductor optical waveguide and the non-semiconductor optical waveguide are integrated on the same semiconductor substrate 711, thereby allowing an implementation of an optical waveguide with new characteristics that cannot be achieved by semiconductor-only configuration while maintaining the flexibility of the waveguide design.

The grooves A131 and A132 and semiconductor boards B131 and B132 can be formed in the semiconductor substrate 711 by etching the semiconductor substrate 711 on which the optical waveguide region R131 have been formed. Thus, the reflection from the boundary between the optical waveguide region R131 and the optical waveguide region R132 can be reduced without forming the antireflection film at the interface between the optical waveguide region R131 and the optical waveguide region R132, thereby facilitating the integration of the optical waveguides.

In addition, adjusting the widths of the grooves A131 and A132 and the thicknesses of the semiconductor boards B131 and B132 enables an increase of the wavelength range in which the reflection from the boundary between the optical waveguide region R131 and optical waveguide region R132 can be reduced. This makes it possible to implement an optical waveguide with new characteristics that cannot be achieved by semiconductor-only, while enabling application to a wavelength division multiplexing optical network or the like.

Figure 19:
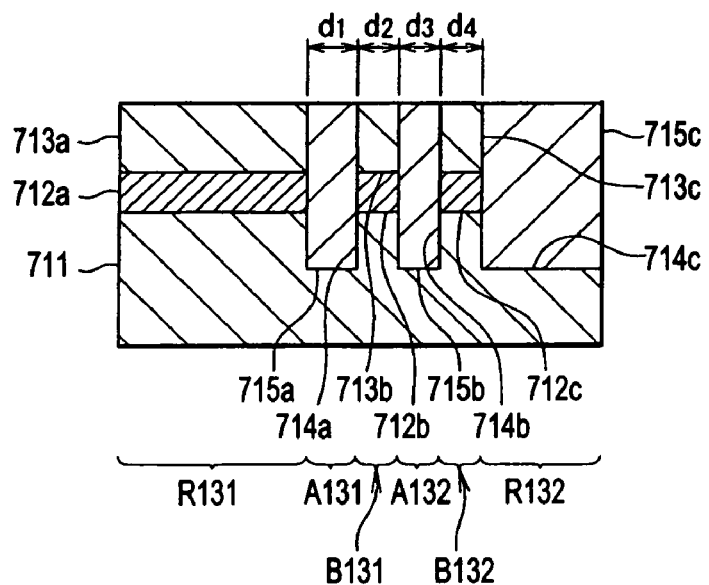
FIG. 19 is a cross-sectional view taken along the line XIX, XX-XIX, XX in the waveguide direction of FIG. 18.

FIG. 19 is a cross-sectional view taken along the line XIX, XX-XIX, XX in the waveguide direction of FIG. 18. In FIG. 19, core layers 712a-712c are stacked on the semiconductor substrate 711, and upper cladding layers 713a-713c are stacked on the core layers 712a-712c, respectively. As the semiconductor substrate 711 and upper cladding layers 713a-713c, InP can be used and as the core layers 712a-712c, GaInAsP with the light-emitting wavelength of 1.3 μm can be used for example.

Then, by etching the semiconductor substrate 711, on which the core layers 712a-712c and upper cladding layers 713a-713c have been stacked, formed on the semiconductor substrate 711 are a groove 714a with the width $d_1$ which is disposed perpendicularly to the waveguide direction, as well as a groove 714b with a width $d_3$ which is disposed separately from the groove 714a by a predetermined spacing $d_2$, and a notch 714b disposed apart from the groove 714b by a predetermined spacing $d_4$.

Then, by filling the grooves 714a and 714b with filler materials 715a and 715b, respectively, it makes possible to form the groove A131 at the interface with the optical waveguide region R131, as well as the groove A132 separated from the groove A131 by the semiconductor board B131 with the thickness $d_2$.

In addition, by filling the notch 714c with an optical waveguide material 715c, it makes possible to form the optical waveguide region R132 separated from the groove A132 via a semiconductor board B132 with a thickness $d_4$.

As the filler materials 715a and 715b and the optical waveguide material 715c, a material such as BCB can be used, which has the refractive index different from that of the semiconductors. In this case, the optical waveguide region R131 and semiconductor boards B131 and B132 can each have an equivalent refractive index of 3.12, and the optical waveguide region R132 and grooves A131 and A132 can each have an equivalent refractive index of 1.54.

Thus the present example can integrate the optical waveguide region R131 and optical waveguide region R132 whose refractive indices differ from each other on the same semiconductor substrate 711 while enabling reduction of the reflection from the boundary between the optical waveguide region R131 and optical waveguide region R132 in a wide wavelength range, thereby allowing an implementation of the optical waveguide with new characteristics which cannot be achieved by semiconductor-only configuration.

The waveguide loss in the grooves A131 and A132 and optical waveguide region R132 is negligibly small when their propagation distances in them are short. However, as the propagation distances in the grooves A131 and A132 and optical waveguide region R132 increase, the waveguide loss becomes nonnegligible.

Figure 20:
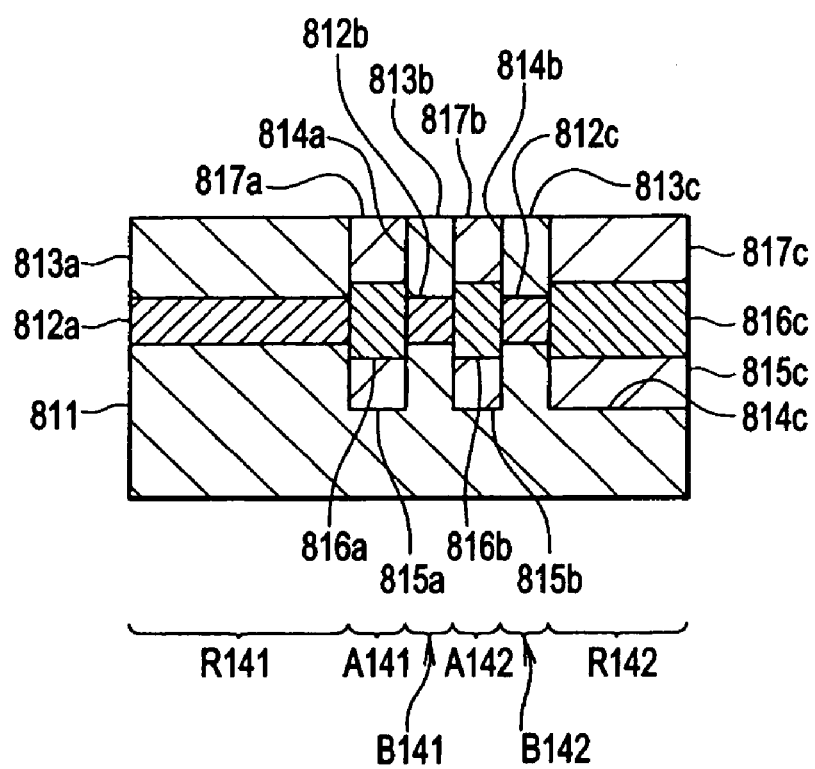
FIG. 20 is a cross-sectional view showing, along the waveguide direction, a schematic configuration of the coupling section of an integrated optical waveguide of a 13th example in accordance with the present invention.

For this reason, the sectional structure of FIG. 19 taken along the line XX-XX of FIG. 18 can be replaced by the sectional structure of FIG. 20.

FIG. 20 is a cross-sectional view showing, along the waveguide direction, a schematic configuration of a coupling section of the integrated optical waveguide of a 13th example in accordance with the present invention. The 13th example is configured to comprise core layers in the grooves A131 and A132 and optical waveguide region R132 of FIG. 19.

In FIG. 20, on the semiconductor substrate 811, an optical waveguide region R141, a groove A141, a semiconductor board B141, a groove A142, a semiconductor board B142 and an optical waveguide region R142 are formed successively along the waveguide direction.

More specifically, core layers 812a-812c are stacked on the semiconductor substrate 811, and upper cladding layers 813a-813c are stacked on the core layers 812a-812c, respectively. Here, as the semiconductor substrate 811 and upper cladding layers 813a-813c, InP can be used and as the core layers 812a-812c, GaInAsP with the light-emitting wavelength of 1.3 μm can be used for example.

Then, by etching the semiconductor substrate 811 on which the core layers 812a-812c and upper cladding layers 813a-813c have been stacked successively, formed on the semiconductor substrate 811 are a groove 814a perpendicularly to the waveguide direction, as well as a groove 814b separated from the groove 814a by a predetermined spacing, and a notch 814c separated from the groove 814b by a predetermined spacing.

This enables to form the groove A141 disposed at the interface with the optical waveguide region R141, and the groove A142 separated from the groove A141 via the semiconductor board B141 by burying a core layer 816a sandwiched by cladding layers 815a and 817a in the groove 814a, and by burying a core layer 816b sandwiched by cladding layers 815b and 817b in the groove 814b.

In addition, the optical waveguide region R142 separated from the groove A142 via the semiconductor board B142 can be formed by burying a core layer 816c sandwiched by cladding layers 815c and 817c into the notch 814c.

Here, as the material of the core layers 816a-816c, BCB can be used and as the material of the cladding layers 815a-815c and 817a-817c, polyimide whose refractive index is lower than that of the core layers 816a-816c can be used for example.

This makes it possible to reduce the waveguide loss in the grooves A141 and A142 and optical waveguide region R142, while enabling reduction of the reflection from the boundary between the optical waveguide region R141 and optical waveguide region R142.

To suppress the waveguide loss in the lateral direction of the optical waveguide region R131 of FIG. 19, the sectional structure taken along the line XIII-XIII of FIG. 18 can be replaced by the sectional structure of FIG. 13. In addition, to suppress the waveguide loss in the lateral direction of the optical waveguide region R132 of FIG. 18, the sectional structure taken along the line XIV-XIV of FIG. 18 can be replaced by the sectional structure of FIG. 14.

As for the shape of the core layers 712a and 712b of FIG. 19, it is not intended to limit. For example, it is possible to employ a separate confinement heterostructure (SCH) in which the core layers are sandwiched with materials having a refractive index between the refractive index at the center of the core layer and the refractive index of the cladding layer, or a graded index (GI-) SCH that has its refractive index varied stepwise.

To apply the present structure to a semiconductor laser, an active region can be used as the core, and its structure can be any of the bulk, MQW (multiple quantum well), quantum wire and quantum dot structures. As for the waveguide structure of the active region, any of the pn buried, ridge structure, semi-insulating buried structure and high-mesa structure can be used. As for the materials, they are not limited to the combination of the InP and GaInAsP, but any suitable materials such as GaAs, AlGaAs, InGaAs and GaInNAs are applicable.

In FIG. 19, assume that the equivalent refractive index $N_1$ of the optical waveguide region R131 and semiconductor boards B131 and B132 is 3.12, and the equivalent refractive index $N_2$ of the optical waveguide region R132 and grooves A131 and A132 is 1.54. In this case, as for the optical waveguide composed of the optical waveguide region R131, groove A131, semiconductor board B131 and groove A132, the reflectance with respect to the width $d_1$ of the groove A131 and the thickness $d_2$ of the semiconductor board B131 are the same as in FIG. 15.

Accordingly, to reduce the reflectance of the optical waveguide composed of the optical waveguide region R131, groove A131, semiconductor board B131 and groove A132, the width $d_1$ of the groove A131 and the thickness $d_2$ of the semiconductor board B131 can be set in such a manner that they satisfy the relationship of expression (6) or (7).

In addition, to achieve zero reflectance of the optical waveguide composed of the optical waveguide region R131, groove A131, semiconductor board B131 and groove A132, the width $d_1$ of the groove A131 and the thickness $d_2$ of the semiconductor board B131 can be set in such a manner that they satisfy the relationship of expression (8) or (9).

Consider the case where the reflection at a particular wavelength λ is made zero through the entire optical waveguide of FIG. 19. In this case, assume that the entire configuration of FIG. 19 is divided by the groove A132, and hence suppose the optical waveguide composed of the optical waveguide region R131, groove A131, semiconductor board B131 and groove A132, and the optical waveguide composed of the groove A132, semiconductor board B132 and optical waveguide region R132, then the reflectance must be made zero in both of these optical waveguides.

Thus, it is necessary not only for the reflectance of the optical waveguide composed of the optical waveguide region R131, groove A131, semiconductor board B131 and groove A132 to be made zero, but also for the reflectance of the optical waveguide composed of the groove A132, semiconductor board B132 and optical waveguide region R132 to be made zero.

Here, the condition for making the reflectance zero of the optical waveguide composed of the groove A132, semiconductor board B132 and optical waveguide region R132 is given by the following expression (10).

$$N_2 d_4 = \lambda/2n \qquad (10)$$

where n is an integer.

Figure 21:
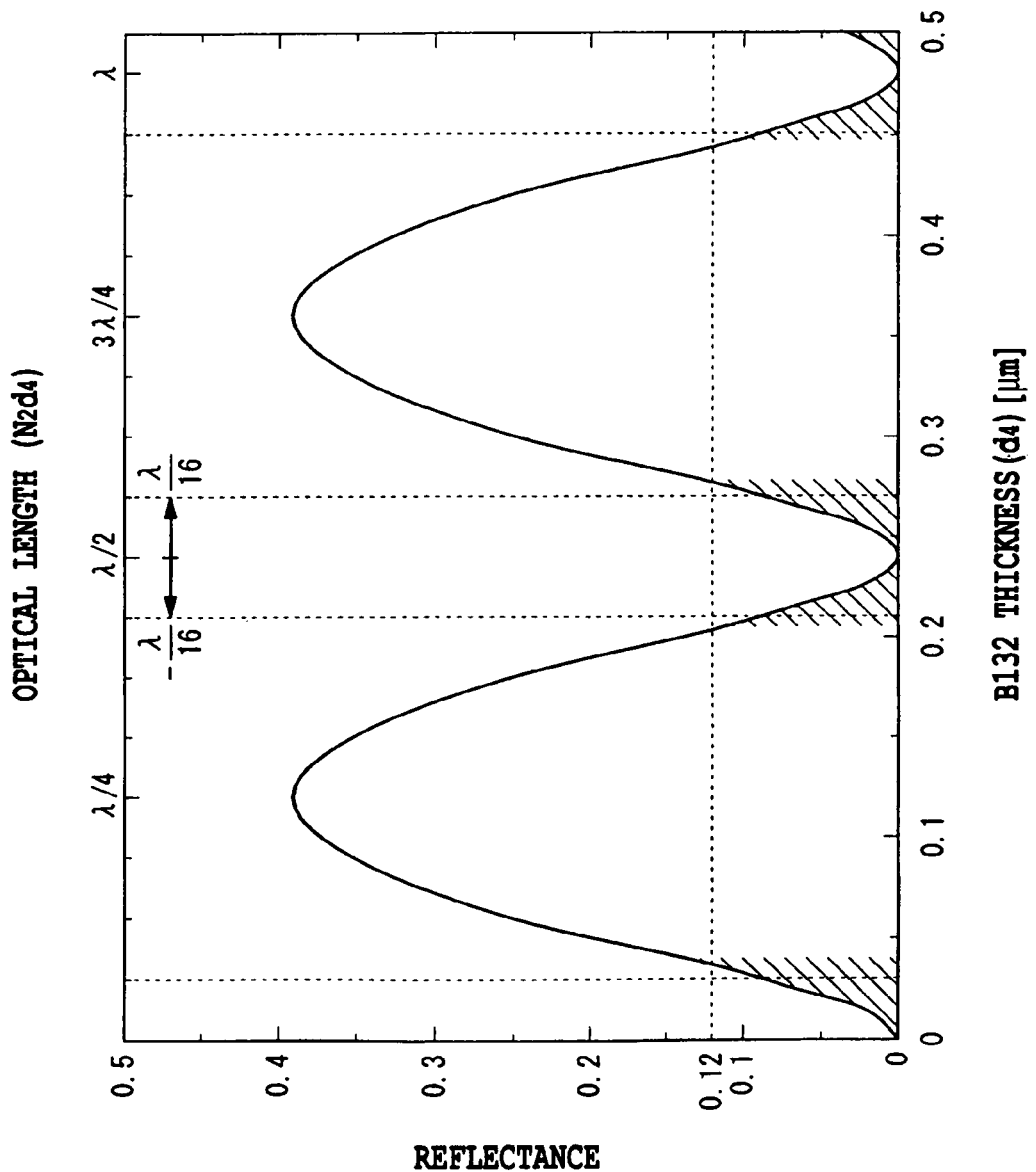
FIG. 21 is a diagram illustrating relationships between the reflectance of the optical waveguide composed of regions A132, B132 and R132 of FIG. 18 and the thickness $d_4$ of the semiconductor board B132.

FIG. 21 is a diagram illustrating relationships between the reflectance of the optical waveguide, which is composed of the groove A132, semiconductor board B132 and optical waveguide region R132 of FIG. 19, and the thickness $d_4$ of the semiconductor board B132. The incident wavelength is set at 1.55 μm.

In shaded regions of FIG. 21, the reflectance of the optical waveguide composed of the groove A132, semiconductor board B132 and optical waveguide region R132 is smaller than that of the mere splice of two waveguides (about 12%). The condition of making the reflectance of the optical waveguide composed of the groove A132, semiconductor board B132 and optical waveguide region R132 smaller than that of the mere splice of two waveguides is given by the following expression (11).

$$\lambda/2n - \lambda/16 < N_2 d_4 < \lambda/2n + \lambda/16 \qquad (11)$$

where n is an integer.

Here, the whole optical waveguide of FIG. 19 has a left side optical waveguide and a right side optical waveguide connected with each other. The former is composed of the optical waveguide region R131, groove A131, semiconductor board B131 and groove A132, and the latter is composed of the groove A132, semiconductor board B132 and optical waveguide region R132. Since the rear end of the left side optical waveguide has the same refractive index as the front end of the right side optical waveguide, no reflection occurs in that portion. Accordingly, considering the whole optical waveguide before the division, the reflection can be made zero at the coupling section between the optical waveguide region R131 and optical waveguide region R132 when the incident wavelength is λ, which holds true independently of the width $d_3$ of the groove A132.

Figure 22:
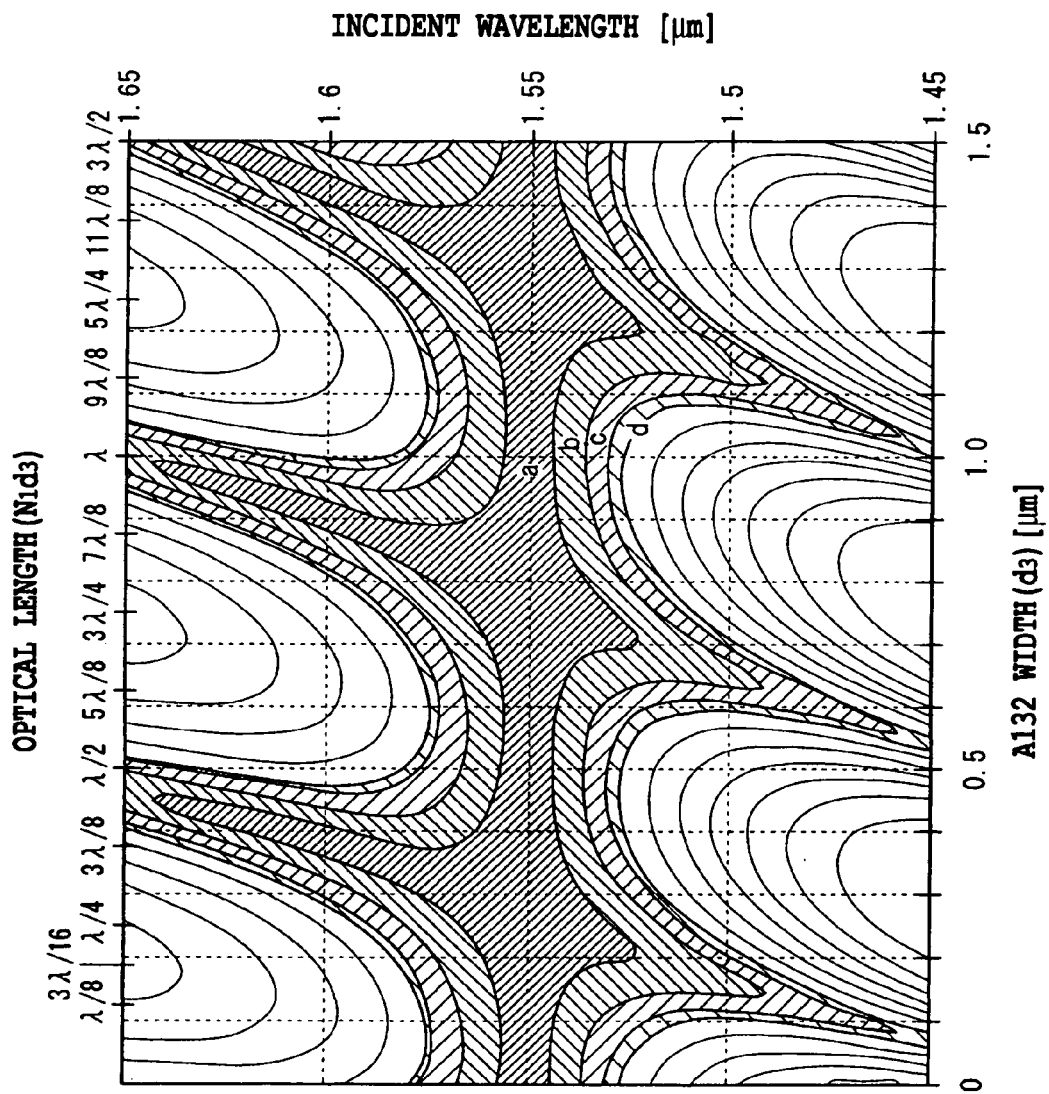
FIG. 22 is a chart illustrating relationships between the width $d_3$ of the groove A132 of FIG. 18 and the reflectance for the incident wavelength.

FIG. 22 is a chart illustrating relationships between the width $d_3$ of the groove A132 of FIG. 18 and the reflectance for the incident wavelength. In FIG. 22, it is determined such that $d_1$=1.08 μm, $d_2$=1.00 μm and $d_4$=0.966 μm to satisfy the condition of making the reflectance zero when $N_1$=1.54, $N_2$=3.21 and incident wavelength λ=1.55 μm. To make more general description, optical length is also shown.

In FIG. 22, the region d is an area in which the reflectance is smaller than the reflectance (about 12%) of the simple splice between the optical waveguide region R131 and the optical waveguide region R132; the region c is an area in which the reflectance is equal to or less than 10%; the region b is an area in which the reflectance is equal to or less than 5%; and the region a is an area in which the reflectance is equal to or less than 1%.

Thus, the regions that provide low reflectance can be changed by varying the width $d_3$ of the groove A132. For example, to increase the wavelength width of the region d, the following can be met.

$$\lambda/2(n+\tfrac{1}{4}) < N_1 d_3 < \lambda/2(n+1)$$

where n is an integer.

Likewise, to increase the wavelength width of the region a, the following can be met.

$$\lambda/2(m+\tfrac{3}{8}) < N_1 d_3 < \lambda/2(m+\tfrac{3}{4})$$

where m is an integer.

Although the foregoing description is made by way of example in which the material filling the grooves A131 and A132 is the same as the material of the optical waveguide region R132, the materials can differ from each other. Also, it is not necessary for the optical waveguide region R131 and the semiconductor boards B131 and B132 to have the same layer structure.

Figure 23:
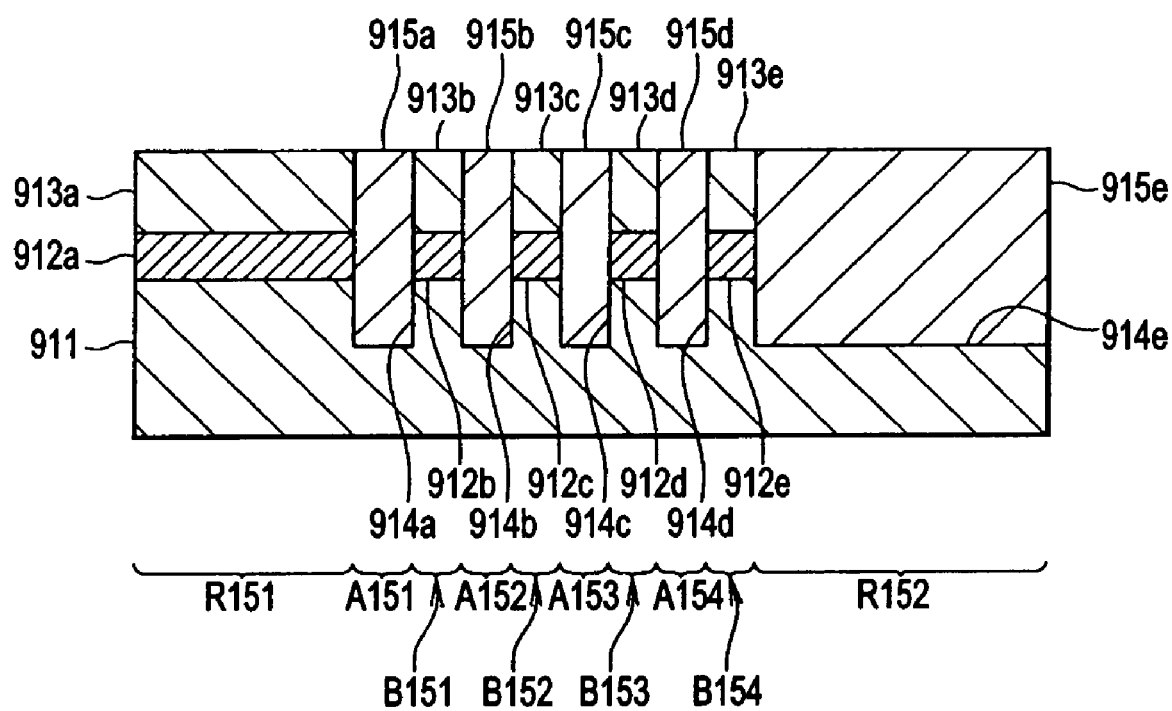
FIG. 23 is a cross-sectional view showing a schematic configuration of an integrated optical waveguide of a 14th example in accordance with the present invention.

FIG. 23 is a cross-sectional view showing a schematic configuration of an integrated optical waveguide of a 14th example in accordance with the present invention. The 14th example is configured to dispose grooves A151-A154 and semiconductor boards B151-B154 alternately to sharpen the wavelength band that achieves low reflection.

In FIG. 23, on a semiconductor substrate 911, an optical waveguide region R151 and an optical waveguide region R152 are formed along the waveguide direction, and grooves A151-A154 and semiconductor boards B151-B154 are disposed alternately across the optical waveguide region R151 and optical waveguide region R152 along the waveguide direction.

The refractive indices of the optical waveguide region R151 and optical waveguide region R152 can be made different from each other. For example, the optical waveguide region R151 may be composed of semiconductor materials, and the optical waveguide region R152 may be composed of materials other than the semiconductors.

The grooves A151-A154 can be filled with materials other than the semiconductors such as the materials of the optical waveguide region R152. The semiconductor boards B151-B154 can have the same structure as the optical waveguide region R151. The grooves A151-A154 and semiconductor boards B151-B154 are disposed in such a manner that they traverse the waveguide direction, and preferably the grooves A151-A154 and semiconductor boards B151-B154 are disposed perpendicularly to the waveguide direction.

The width of the groove A151 and the thickness of the semiconductor board B151 can be set in such a manner that the reflectance is weakened in the optical waveguide composed of the optical waveguide region R14, groove A151, semiconductor board B151 and groove A152.

The width of the groove A152 and the thickness of the semiconductor board B152 can be set in such a manner that the optical waveguide composed of the groove A152, semiconductor board B152 and groove A153 satisfies the non-reflectance conditions.

In addition, the width of the grooves A153 and A154 and the thickness of the semiconductor boards B153 and B154 can be set equal to the width of the groove A152 and the thickness of the semiconductor board B152, respectively.

The structure having the grooves A151-A154 and semiconductor boards B151-B154 disposed alternately can maintain the reflectance at the incident wavelength λ at a constant value by setting the width of the groove A152 and the thickness of the semiconductor board B152 such that the optical waveguide composed of the groove A152, semiconductor board B152 and groove A153 satisfy the conditions of non-reflectance, and by setting the width of the grooves A153 and A154 and the thickness of the semiconductor boards B153 and B154 such that they become equal to the width of the groove A152 and the thickness of the semiconductor board B152, respectively.

More specifically, on the semiconductor substrate 911, core layers 912a-912e are stacked, and on the core layers 912a-912e, upper cladding layers 913a-913e are stacked, respectively. As the semiconductor substrate 911 and upper cladding layers 913a-913e, InP can be used and as the core layers 912a-912e, GaInAsP with the light-emitting wavelength of 1.3 µm can be used for example.

Then, by etching the semiconductor substrate 911 on which the core layers 912a-912e and upper cladding layers 913a-913e have been stacked successively, grooves 914a-914d disposed perpendicularly to the waveguide direction are formed, and a notch 914e separated from the groove 914d by a predetermined spacing is formed on the semiconductor substrate 911.

Then, by filling the grooves 914a-914d with filler materials 915a-915d, and by filling the notch 914e with an optical waveguide material 915e, the grooves A151-A154 and semiconductor boards B151-B154 disposed along the waveguide direction can be formed between the optical waveguide region R151 and the optical waveguide region R152, and on the semiconductor substrate 911, the optical waveguide region R152 separated from the groove A154 via the semiconductor board B154 can also be formed.

Thus, by etching the semiconductor substrate 911 to form the grooves 914a-914d, the wavelength band that achieves low reflection can be sharpened. As a result, even when the semiconductor optical waveguide and the non-semiconductor optical waveguide are integrated on the same semiconductor substrate 911, the reflection of a certain wavelength between these optical waveguides can be reduced effectively.

Although the foregoing description is made by way of example that alternates the grooves A151-A154 and semiconductor boards B151-B154 four times, the grooves and semiconductor boards can be alternated three times, or five times or more.

Figure 24:
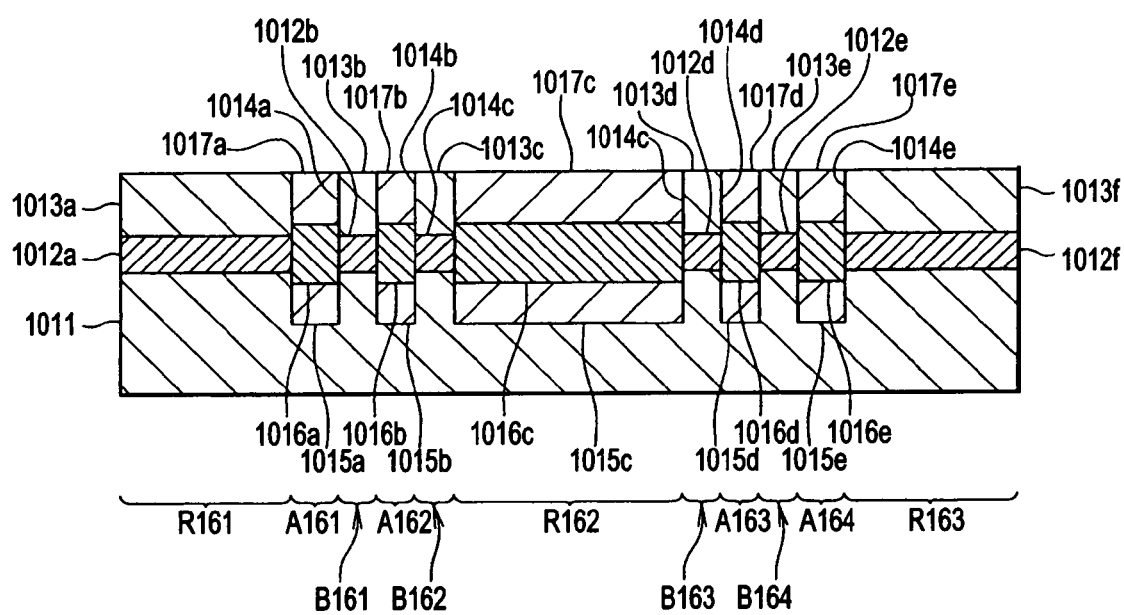
FIG. 24 is a cross-sectional view showing a schematic configuration of an integrated optical waveguide of a 15th example in accordance with the present invention.

FIG. 24 is a cross-sectional view showing a schematic configuration of an integrated optical waveguide of a 15th example in accordance with the present invention. The 15th example has the structures of FIG. 19 disposed opposingly. In FIG. 24, on a semiconductor substrate 1011, an optical waveguide region R161, a groove A161, a semiconductor board B161, a groove A162, a semiconductor board B162, an optical waveguide region R162, a semiconductor board B163, a groove A163, a semiconductor board B164, a groove A164 and an optical waveguide region R163 are formed successively along the waveguide direction.

Here, the refractive index of the optical waveguide regions R161 and R163 may differ from the refractive index of the optical waveguide region R162. For example, the optical waveguide regions R161 and R163 may be built from semiconductor materials and the optical waveguide region R162 may be built from materials other than the semiconductors.

In addition, the grooves A161-A164 can be filled with a material other than the semiconductors such as the material identical to that of the optical waveguide region R162. The semiconductor boards B161-B164 may have the same structure as the optical waveguide regions R161 and R163. The grooves A161-A164 and semiconductor boards B161-B164 are placed in such a manner that they traverse the waveguide direction, and are preferably disposed perpendicularly to the waveguide direction.

As for the width of the groove A161 and the thickness of the semiconductor board B161, they can be set such that the light reflected off the interface between the optical waveguide region R161 and the groove A161 is weakened by the light reflected from the interface between the groove A161 and the semiconductor board B161, by the light reflected from the interface between the semiconductor board B161 and the groove A162, by the light reflected from the interface between the groove A162 and the semiconductor board B162, and by the light reflected from the interface between the semiconductor board B162 and the optical waveguide region R162.

As for the width of the groove A164 and the thickness of the semiconductor board B164, they can be set such that the light reflected off the interface between the optical waveguide region R163 and the groove A164 is weakened by the light reflected from the interface between the groove A164 and the semiconductor board B164, by the light reflected from the interface between the semiconductor board B164 and the groove A163, by the light reflected from the interface between the groove A163 and the semiconductor board B163, and by the light reflected from the interface between the semiconductor board B163 and the optical waveguide region R162.

More specifically, on the semiconductor substrate 1011, core layers 1012a-1012f are stacked, and on the core layers 1012a-1012f, upper cladding layers 1013a-1013f are stacked, respectively. As the semiconductor substrate 1011 and upper cladding layers 1013a-1013f, InP can be used and as the core layers 1012a-1012f, GaInAsP with the light-emitting wavelength of 1.3 µm can be used for example.

Then, by etching the semiconductor substrate 1011 on which the core layers 1012a-1012f and upper cladding layers 1013a-1013f have been stacked successively, grooves 1014a, 1014b, 1014d and 1014e disposed perpendicularly to the waveguide direction are formed, and a concave section 1014c, which is separated from the grooves 1014b and 1014d by a predetermined spacing, is formed on the semiconductor substrate 1011.

Then, grooves A161 and A162 disposed between the optical waveguide regions R161 and R162 can be formed by burying a core layer 1016a sandwiched by cladding layers 1015a and 1017a in the groove 1014a, and by burying a core layer 1016b sandwiched by cladding layers 1015b and 1017b in the groove 1014b.

Likewise, grooves A163 and A164 disposed between the optical waveguide regions R162 and R163 can be formed by burying a core layer 1016d sandwiched by cladding layers 1015d and 1017d in the groove 1014d, and by burying a core layer 1016e sandwiched by cladding layers 1015e and 1017e in the groove 1014e.

The optical waveguide region R162 can be formed which is separated from the grooves A162 and A164 via the semiconductor boards B162 and B164 by burying a core layer 1016c sandwiched by cladding layers 1015c and 1017c in the concave section 1014c.

As the material of the core layers 1016a-1016e, BCB can be used and as the material of the cladding layers 1015a-1015e and 1017a-1017e, polyimide whose refractive index is lower than that of the core layers 1016a-1016e can be used for example.

The example of FIG. 24 has the structures of FIG. 20 disposed opposingly. Accordingly, as for the materials and structure of the waveguides, core layers and cladding layers of the example of FIG. 24, it is not intended to limit, but materials and structure other than those described herein can also be used.

Although only a pair of structures of FIG. 20 is disposed face to face in the example of FIG. 24, three or more structures of FIG. 20 can be connected in cascade. Here, using the structures of FIG. 20 enables the suppression of the reflectance between the individual optical waveguides, thereby suppressing the reflectance throughout the integrated optical waveguide.

Considering the optical length of the foregoing integrated optical waveguide, the refractive indices of the semiconductors increase with the temperature, that is, the refractive indices have a positive temperature differential coefficient. Accordingly, the optical length of the optical waveguide increases with an increase of the ambient temperature.

Thus, the optical waveguide region R132 of FIG. 19 and the optical waveguide region R162 of FIG. 24 can be configured by using a material having a negative refractive index temperature differential coefficient, for example. This makes it possible to suppress the temperature changes of the overall optical length of the optical waveguides, even if the optical lengths of the individual optical waveguides vary because of the temperature changes. As a material with the negative refractive index temperature differential coefficient, PMMA can be used, for example.

Figure 25:
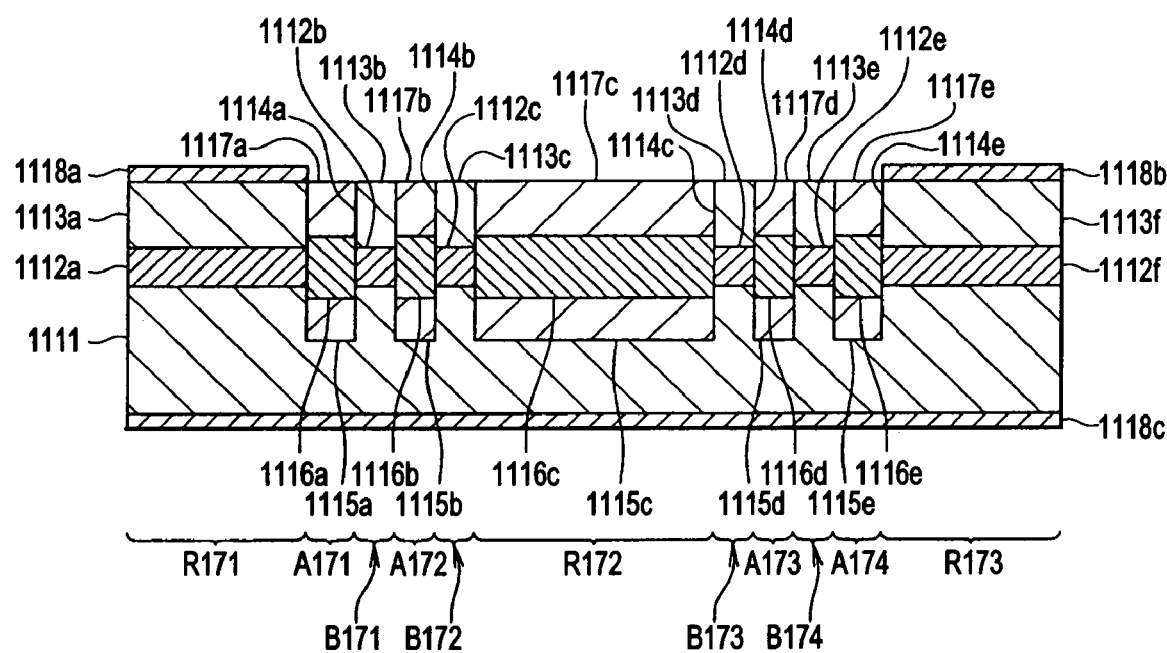
FIG. 25 is a cross-sectional view showing a schematic configuration of an integrated optical waveguide of a 16th example in accordance with the present invention.

FIG. 25 is a cross-sectional view showing a schematic configuration of an integrated optical waveguide of a 16th example in accordance with the present invention. The 16th example includes semiconductor lasers integrated in the structure of FIG. 24.

In FIG. 25, on a semiconductor substrate 1111, an optical waveguide region R171, a groove A171, a semiconductor board B171, a groove A172, a semiconductor board B172, an optical waveguide region R172, a semiconductor board B173, a groove A173, a semiconductor board B174, a groove A174 and an optical waveguide region R173 are formed successively along the waveguide direction. In addition, a laser diode is formed in the optical waveguide region R171 and optical waveguide region R173, each.

The refractive index of the optical waveguide regions R171 and R173 may differ from the refractive index of the optical waveguide region R172. For example, the optical waveguide regions R171 and R173 may be built from semiconductor materials and the optical waveguide region R172 may be built from materials other than the semiconductors.

Also, the grooves A171-A174 can be filled with a material other than the semiconductors such as the material identical to that of the optical waveguide region R172. The semiconductor boards B171-B174 may have the same structure as the optical waveguide regions R171 and R173. The grooves A171-A174 and semiconductor boards B171-B174 are placed in such a manner that they traverse the waveguide direction, and are preferably disposed perpendicularly to the waveguide direction.

As for the width of the groove A171 and the thickness of the semiconductor board B171, they can be set such that the light reflected off the interface between the optical waveguide region R171 and the groove A171 is weakened by the light reflected from the interface between the groove A171 and the semiconductor board B171, by the light reflected from the interface between the semiconductor board B171 and the groove A172, by the light reflected from the interface between the groove A172 and the semiconductor board B172, and by the light reflected from the interface between the semiconductor board B172 and the optical waveguide region R172.

As for the width of the groove A174 and the thickness of the semiconductor board B174, they can be set such that the light reflected of f the interface between the optical waveguide region R173 and the groove A174 is weakened by the light reflected from the interface between the groove A174 and the semiconductor board B174, by the light reflected from the interface between the semiconductor board B174 and the groove A173, by the light reflected from the interface between the groove A173 and the semiconductor board B173, and by the light reflected from the interface between the semiconductor board B173 and the optical waveguide region R172.

More specifically, on the semiconductor substrate 1111, active layers 1112a and 1112f and core layers 1112b-1112e are stacked. On the active layers 1112a and 1112f and core layers 1112b-1112e, upper cladding layers 1113a, 1113f and 1113b-1113e with a conductivity type different from that of the semiconductor substrate 1111 are stacked. As the semiconductor substrate 1111 and upper cladding layers 1113a-1113f, InP can be used and as the active layers 1112a and 1112f and core layers 1112b-1112e, GaInAsP with a light-emitting wavelength of 1.55 μm can be used for example. Also, the semiconductor substrate 1111 can be made of an n-type, and the upper cladding layers 1113a-1113f can be made of a p-type, for example.

The, by etching the semiconductor substrate 1111 on which the active layers 1112a and 1112f and core layers 1112c-1112e and then the upper cladding layers 1113a-1113f have been stacked, grooves 1114a, 1114b, 1114d and 1114e disposed perpendicularly to the waveguide direction are formed, and a concave section 1114c separated from the grooves 1114b and 1114d by a predetermined spacing is formed on the semiconductor substrate 1111. The active layers 1112a and 1112f can be disposed corresponding to the optical waveguide regions R171 and R173, and the core layers 1112b-1112e can be disposed corresponding to the semiconductor boards B171-B174.

Then, the grooves A171 and A172 disposed between the optical waveguide regions R171 and R172 can be formed by burying a core layer 1116a sandwiched by cladding layers 1115a and 1117a in the groove 1114a, and by burying a core layer 1116b sandwiched by cladding layers 1115b and 1117b in the groove 1114b.

Likewise, the grooves A173 and A174 disposed between the optical waveguide regions R172 and R173 can be formed by burying a core layer 1116d sandwiched by cladding layers 1115d and 1117d in the groove 1114d, and by burying a core layer 1116e sandwiched by cladding layers 1115e and 1117e in the groove 1114e.

Also, the optical waveguide region R172 which is separated from the grooves A172 and A174 via the semiconductor boards B172 and B174 can be formed by burying the core layer 1116c sandwiched by the cladding layers 1115c and 1117c in the concave section 1114c.

Furthermore, the laser diodes can be formed in the optical waveguide region R171 and optical waveguide region R173, respectively, by forming electrodes 1118a and 1118b on the upper cladding layers 1113a and 1113f, and an electrode 1118c on the back surface of the semiconductor substrate 1111.

As the material of the core layers 1116a-1116e, BCB can be used and as the material of the cladding layers 1115a-1115e and 1117a-1117e, polyimide whose refractive index is lower than that of the core layers 1116a-1116e can be used for example.

Also, the optical waveguide region R172 can be formed using a material with a negative refractive index temperature differential coefficient such as PMMA. This makes it possible to keep the cavity length constant regardless of the temperature, and suppress the temperature dependence of the oscillation wavelength of the semiconductor laser.

Moreover, the optical waveguide regions R171 and R173 can have a diffraction grating to provide the wavelength selectivity, and it is possible to fabricate a distributed feedback (DFB) semiconductor laser or distributed reflector (DBR).

As for the structure of the active layers 1112a and 1112f and core layers 1112b-1112e, it is possible to employ a separate confinement heterostructure (SCH) that sandwiches them with materials having a refractive index between the refractive index at the center of the active layers or core layers and the refractive index of the cladding layers, or a graded index (GI-) SCH that has its refractive index varyed stepwise.

As for the shapes of the active layers 1112a and 1112f, any of the bulk, MQW (multiple quantum well), quantum wire and quantum dot structures can be use, and as for the waveguide structure of the active regions, any of the pn buried, ridge structure, buried heterostructure and high-mesa structure can be used. As for the materials, they are not limited to the combination of the InP and GaInAsP, but any suitable materials such as GaAs, AlGaAs, InGaAs and GaInNAs are applicable.

As described above, according to the second embodiment in accordance with the present invention, the reflection from the boundary between the first optical waveguide and second optical waveguide can be reduced without forming an antireflection film at the interface between the first optical waveguide and second optical waveguide. This makes it possible to easily implement, on the semiconductor substrate, an optical waveguide with new characteristics that cannot be achieved by only the semiconductors, while enabling the integration of the optical waveguide.

(Optical Waveguide and Optical Device Using Brewster Angle)

Next, an integrated optical waveguide of the third embodiment in accordance with the present invention will now be described with reference to the drawings. The third embodiment can provide an optical waveguide and optical device that can be integrated on a semiconductor substrate, while enabling the improvement in the flexibility of the design of the waveguide direction, and reducing the waveguide loss due to the reflection and refraction between the waveguides with different refractive indices. Some specific examples of the present embodiment will now be described.

Figure 26:
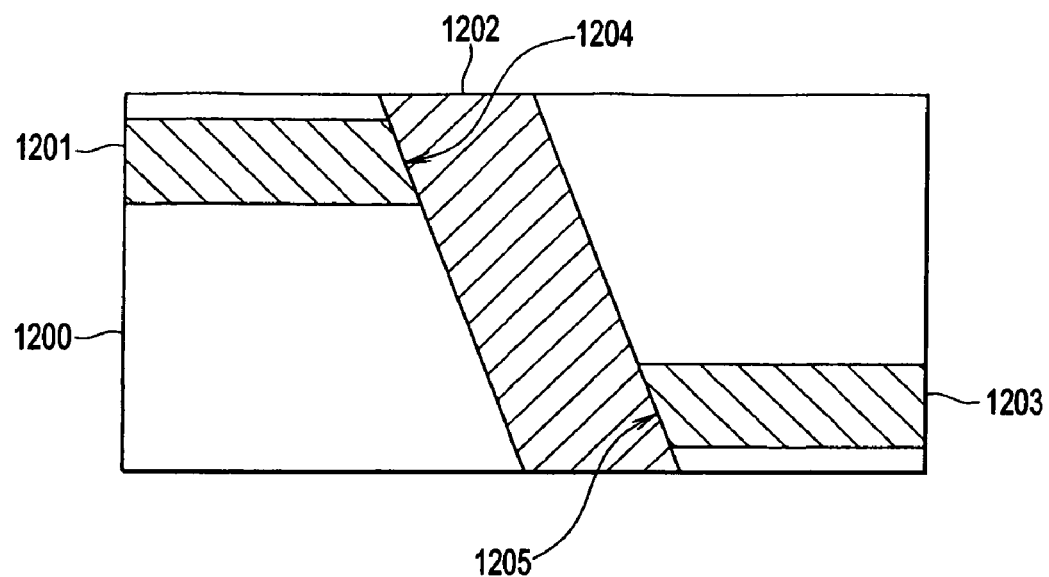
FIG. 26 is a plan view showing a schematic configuration of an integrated optical waveguide of a 17th example in accordance with the present invention.

FIG. 26 is a cross-sectional plan view showing a schematic configuration of an integrated optical waveguide of a 17th example in accordance with the present invention. In FIG. 26, on a semiconductor substrate 1200, a first waveguide 1201, a second waveguide region 1202 and a third waveguide 1203 are formed. The second waveguide region 1202 is disposed across the first waveguide 1201 and the third waveguide 1203.

Here, the first waveguide 1201 and third waveguide 1203 may have the same refractive index, whereas the first waveguide 1201 and second waveguide region 1202 may have different refractive indices. For example, the first waveguide 1201 and third waveguide 1203 maybe composed of the semiconductor materials, whereas the second waveguide region 1202 may be composed of materials other than the semiconductors. As the materials of the second waveguide region 1202, poly-fluoromethacrylate deuteride (d-PFMA) can be used, for example.

An interface surface 1204 between the first waveguide 1201 and second waveguide region 1202 can be inclined with respect to the propagation direction of the first waveguide 1201. Likewise, an interface surface 1205 between the second waveguide region 1202 and third waveguide 1203 can be inclined with respect to an extension line of the refraction direction through the interface surface 1204 between the first waveguide 1201 and second waveguide region 1202. When the interface surface 1205 between the second waveguide region 1202 and third waveguide 1203 is inclined with respect to the extension line of the refraction direction through the interface surface 1204 between the first waveguide 1201 and second waveguide region 1202, the refraction direction through the interface surface 1205 between the second waveguide region 1202 and third waveguide 1203 can be set in such a manner that the refraction direction is in line with the propagation direction of the third waveguide 1203.

Thus, even when the second waveguide region 1202 whose refractive index differs from that of the first waveguide 1201 and third waveguide 1203 is disposed between them, it is possible to reduce the reflection and the loss due to the refraction at the interface surface 1204 between the first waveguide 1201 and second waveguide region 1202 and at the interface surface 1205 between the second waveguide region 1202 and third waveguide 1203.

More specifically, since the first waveguide 1201 and second waveguide region 1202 are connected in such a manner that the interface surface 1204 between them is inclined with respect to the propagation direction of the first waveguide 1201, the light reflected off the interface surface 1204 does not return to the first waveguide 1201, which can prevent the first waveguide 1201 from forming a local cavity. Likewise, the second waveguide region 1202 and third waveguide 1203 are connected in such a manner that the interface surface 1205 between them is inclined with respect to the propagation direction of the second waveguide region 1202, which can prevent the second waveguide region 1202 and third waveguide 1203 from forming a local cavity.

In addition, by aligning the refraction direction through the interface surface 1205 between the second waveguide region 1202 and third waveguide 1203 with the propagation direction of the third waveguide 1203, it can prevent the light propagating through the first waveguide 1201, second waveguide region 1202 and third waveguide 1203 from leaking out of the first waveguide 1201, second waveguide region 1202 and third waveguide 1203 even if the light is refracted through the interface surface 1204 between the first waveguide 1201 and second waveguide region 1202 and through the interface surface 1205 between the second waveguide region 1202 and third waveguide 1203.

As a result, the light launched into the first waveguide 1201 can propagate through the first waveguide 1201, second waveguide region 1202 and third waveguide 1203 with a smaller loss than in a conventional device and emit from the third waveguide 1203.

When the interface surface 1204 between the first waveguide 1201 and second waveguide region 1202 is inclined with respect to the propagation direction of the first waveguide 1201, the inclination angle of the interface surface 1204 can be set in such a manner that it satisfies the Brewster angle. Likewise, when the interface surface 1205 between the second waveguide region 1202 and third waveguide 1203 is inclined with respect to the propagation direction of the second waveguide region 1202, the inclination angle of the interface surface 1205 can be set in such a manner that it satisfies the Brewster angle. In this case, the first waveguide 1201 and third waveguide 1203 can be connected to the second waveguide region 1202 such that they are point symmetry with respect to the midpoint of the second waveguide region 1202.

This makes it possible to reduce the reflection at the interface surface 1204 between the first waveguide 1201 and second waveguide region 1202 and at the interface surface 1205 between the second waveguide region 1202 and third waveguide 1203., and to make the directions of the first waveguide 1201 and the third waveguide 1203 in parallel.

Thus, the incident direction and emitting direction can be matched with each other even when the Brewster angle is used to limit the reflection between the waveguides, between which the materials with different refractive indices are inserted.

In this way, even when the material with different refractive index is inserted between the first waveguide 1201 and third waveguide 1203, it is possible to make effective use of the crystal orientation suitable for cleavage, etching or burying while suppressing the waveguide loss; to implement the optical waveguide with new characteristics that cannot be achieved with semiconductor-only configuration while limiting the degradation in the reliability during the fabrication of the first waveguide 1201 and third waveguide 1203, and to improve the flexibility of the waveguide design.

Figure 27:
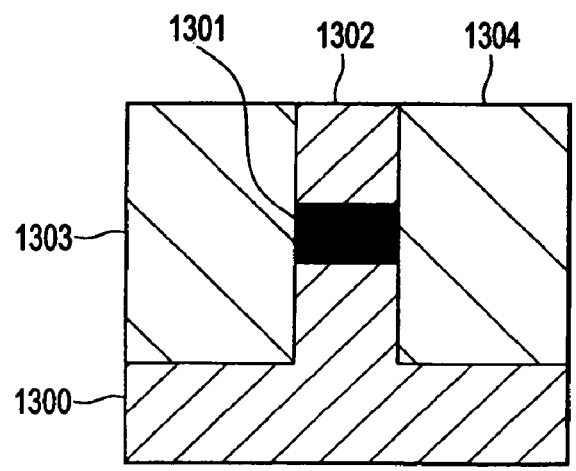
FIG. 27 is a cross-sectional view showing a schematic configuration of the first waveguide region 1201 of FIG. 26.

FIG. 27 is a cross-sectional view showing a schematic configuration of the first waveguide 1201 and third waveguide 1203 of FIG. 26. In FIG. 27, on a semiconductor substrate 1200, a core layer 1301 and an upper cladding layer 1302 are stacked successively. Then, the upper cladding layer 1302, core layer 1301 and an upper portion of the semiconductor substrate 1201 are etched in stripes along the waveguide direction to form burying layers 1303 and 1304 on both sides of the upper cladding layer 1302, core layer 1301 and upper portions of the semiconductor substrate 1200.

This can provide the first waveguide 1201 and third waveguide 1203 with the buried heterostructure (BH) structure, which enables optical confinement in the lateral direction, and can reduce the waveguide loss in the first waveguide 1201 and third waveguide 1203.

As the semiconductor substrate 1200, upper cladding layer 1302 and burying layers 1303 and 1304, InP can be used and as the core layer 1301, GaInAsP can be used for example.

When stacking the core layer 1301 and upper cladding layer 1302 successively on the semiconductor substrate 1200, epitaxial growth such as MBE (molecular beam epitaxy), MOCVD (metal organic chemical vapor deposition) or ALCVD (atomic layer chemical vapor deposition) can be used.

Figure 28:
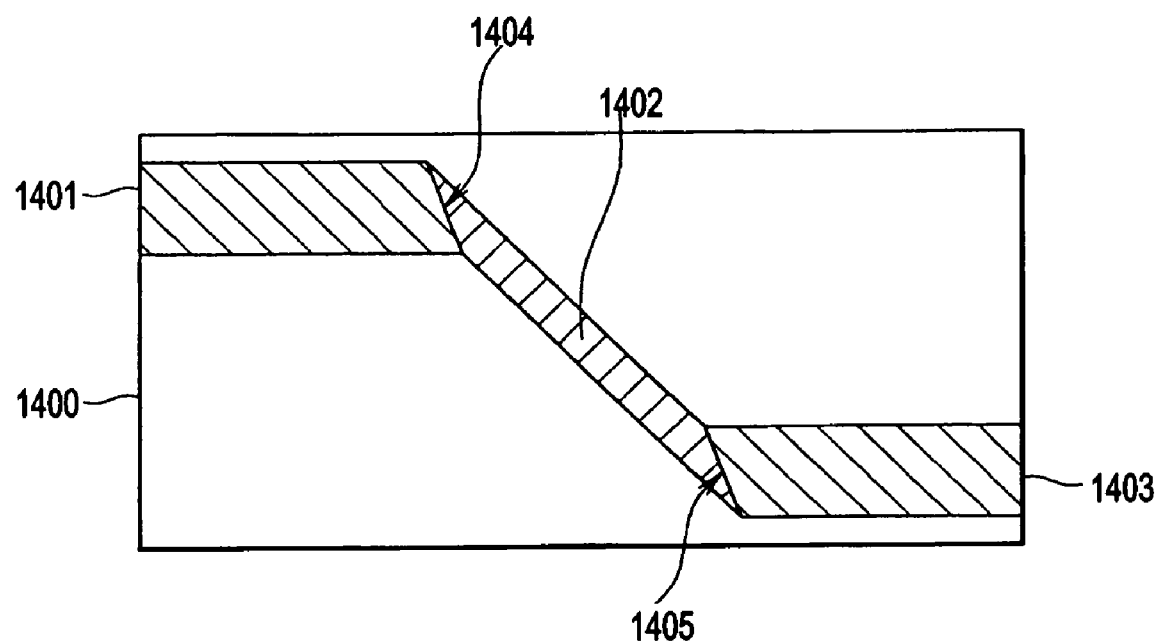
FIG. 28 is a plan view showing a schematic configuration of an integrated optical waveguide of an 18th example in accordance with the present invention.

FIG. 28 is a plan view showing a schematic configuration of an integrated optical waveguide of an 18th example in accordance with the present invention. In FIG. 28, on a semiconductor substrate 1400, a first waveguide 1401, a second waveguide 1402 and a third waveguide 1403 are formed. The second waveguide 1402 is disposed across the first waveguide 1401 and the third waveguide 1403. Here, the first waveguide 1401 and third waveguide 1403 may have the same refractive index, whereas the first waveguide 1401 and second waveguide 1402 may have different refractive indices. For example, the first waveguide 1401 and third waveguide 1403 may be composed of semiconductor materials, whereas the second waveguide 1402 may be composed of materials other than the semiconductors.

In addition, an interface surface 1404 between the first waveguide 1401 and second waveguide 1402 can be inclined with respect to the propagation direction of the first waveguide 1401. Likewise, an interface surface 1405 between the second waveguide 1402 and third waveguide 1403 can be inclined with respect to an extension line of the refraction direction through the interface surface 1404 between the first waveguide 1401 and second waveguide 1402. When the interface surface 1405 between the second waveguide 1402 and third waveguide 1403 is inclined with respect to the extension line of the refraction direction through the interface surface 1404 between the first waveguide 1401 and second waveguide 1402, the refraction direction through the interface surface 1405 between the second waveguide 1402 and third waveguide 1403 can be set in such a manner that the refraction direction is in line with the propagation direction of the third waveguide 1403.

For example, it is possible to set the inclination angles at the interface surfaces 1404 and 1405 in such a manner that they satisfy the Brewster angle, and to connect the first waveguide 1401 and third waveguide 1403 to the second waveguide 1402 in such a manner that they are point symmetry with respect to the midpoint of the second waveguide 1402.

Figure 29:
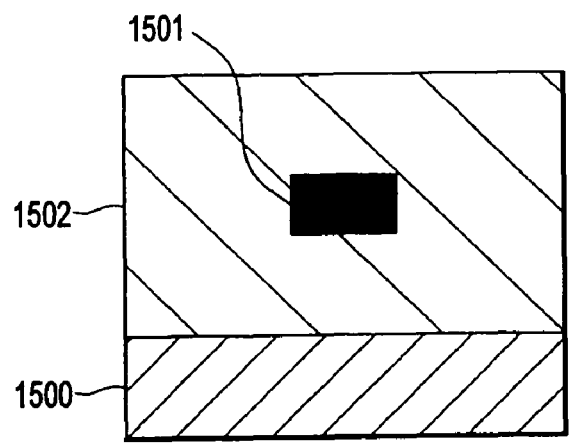
FIG. 29 is a cross-sectional view showing a schematic configuration of the second waveguide 1402 of FIG. 28.

FIG. 29 is a cross-sectional view showing a schematic configuration of the second waveguide 1402 of FIG. 28. In FIG. 29, on a semiconductor substrate 1400, a core layer 1501 surrounded by a cladding layer 1502 is formed. As the semiconductor substrate 1400, InP can be used for example. As the cladding layer 1502 and core layer 1501, poly-fluoromethacrylate deuteride (d-PFMA) whose refractive index is altered by varying its fluorine content can be used, for example.

This makes it possible to reduce the waveguide loss in the second waveguide 1402, and to reduce the reflection at the interface surface 1404 between the first waveguide 1401 and second waveguide region 1402 and at the interface surface 1405 between the second waveguide region 1402 and third waveguide 1403.

As for the first waveguide 1201 and third waveguide 1203 of FIG. 26, and the first waveguide 1401, second waveguide 1402 and third waveguide 1403 of FIG. 28, it is not intended to limit. For example, commonly used ridge waveguide or high-mesa waveguide can also be employed as the semiconductor waveguide structure.

As for the shapes of the core layer and cladding layer, it is not intended to limit. For example, it is possible to employ a separate confinement heterostructure (SCH) that sandwiches them with materials having a refractive index between the refractive index at the center of the core layer and the refractive index of the cladding layer, or a graded index (GI-) SCH that has its refractive index varyed stepwise.

To apply the present structure to a semiconductor laser, an active region can be used as the core, and its structure can be any of the bulk, MQW (multiple quantum well), quantum wire and quantum dot structures. As for the waveguide structure of the active region, any of the pn buried, ridge structure, semi-insulating buried structure and high-mesa structure can be used. As for the materials, they are not limited to the combination of the InP and GaInAsP, but any suitable materials such as GaAs, AlGaAs, InGaAs and GaInNAs are applicable.

Also, as for the second waveguide region 1202 of FIG. 26 and the second waveguide 1402 of FIG. 28, it is not intended to limit. For example, polyimide or benzocyclobutene can be used.

Considering the optical length of the foregoing integrated optical waveguide, the optical length of the optical waveguide increases with an increase of the ambient temperature because the refractive index of the semiconductors increases with the temperature, that is, the refractive index has a positive temperature differential coefficient.

Thus, the second waveguide region 1202 of FIG. 26 and the second waveguide 1402 of FIG. 28 can be configured by using a material having a negative refractive index temperature differential coefficient. This makes it possible to suppress the temperature changes of the total optical length of the optical waveguides, even if the optical lengths of the individual optical waveguides vary because of the temperature changes. As a material with the negative refractive index temperature differential coefficient, PMMA can be used, for example.

The operation principle of the example of FIGS. 26 and 28 will now be described in detail.

Figure 30:
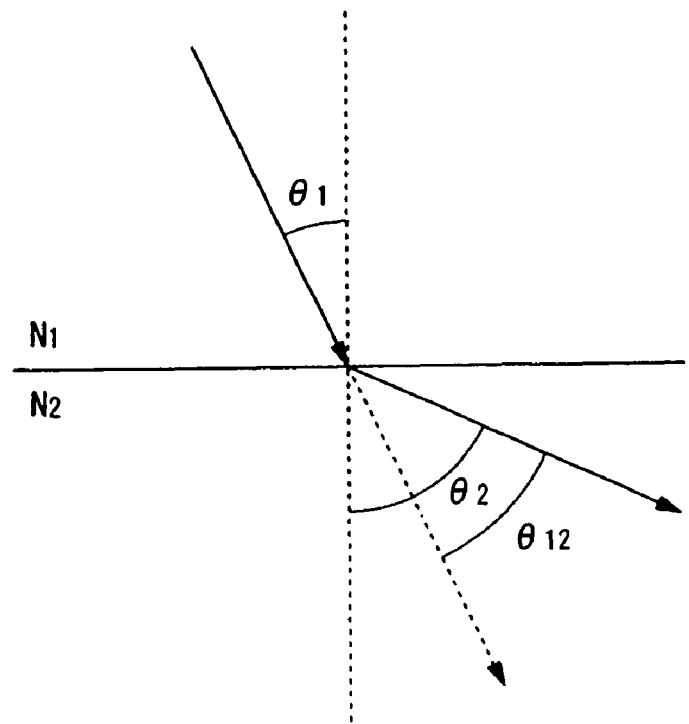
FIG. 30 is a diagram illustrating a relationship between an incident angle and a refraction angle when the light incidents to a splice plane of materials with different refractive indices.

FIG. 30 is a schematic diagram illustrating a relationship between an incident angle and refraction angle when the light incident to a splice plane of materials with different refractive indices.

In FIG. 30, the light launched from a material having a refractive index $N_1$ to a material having a refractive index $N_2$ at the incident angle $\theta_1$ is refracted through the interface of the materials at the refraction angle $\theta_2$. In this case, the relationship between the incident angle $\theta_1$ and refraction angle $\theta_2$ is given by the foregoing expression (4). In particular, the reflection component parallel to the incidence plane can be eliminated when the incident angle $\theta_1$ satisfies the relationship represented by expression (5), and agrees with the Brewster angle $\theta_B$.

When the incident angle $\theta_1$ equals the Brewster angle $\theta_B$, the following expression (12) holds from expressions (4) and (5).

$$\cos\theta_1 = \sin\theta_2 \therefore \theta_2 = \pi/2 - \theta_1 \quad (12)$$

Accordingly, by connecting the first waveguide 1401 and third waveguide 1403 to the second waveguide 1402 in such a manner that they are point symmetry with respect to the midpoint of the second waveguide 1402 of FIG. 28, it becomes possible to make the inclination angle equal to the Brewster angle, the inclination angle being of the interface surface 1404 between the first waveguide 1401 and second waveguide 1402 and that of the interface surface 1405 between the second waveguide 1402 and third waveguide 1403, and to make the directions of the first waveguide 1201 and the third waveguide 1203 in parallel each other.

As is clearly seen from FIG. 30, an angle $\theta_{12}$ between the waveguide direction through the material having the refractive index $N_1$ and the waveguide direction through the material having the refractive index $N_2$ is given by the following expression (13).

$$\theta_{12} = \pi/2 - 2\theta_1 \quad (13)$$

Figure 31:
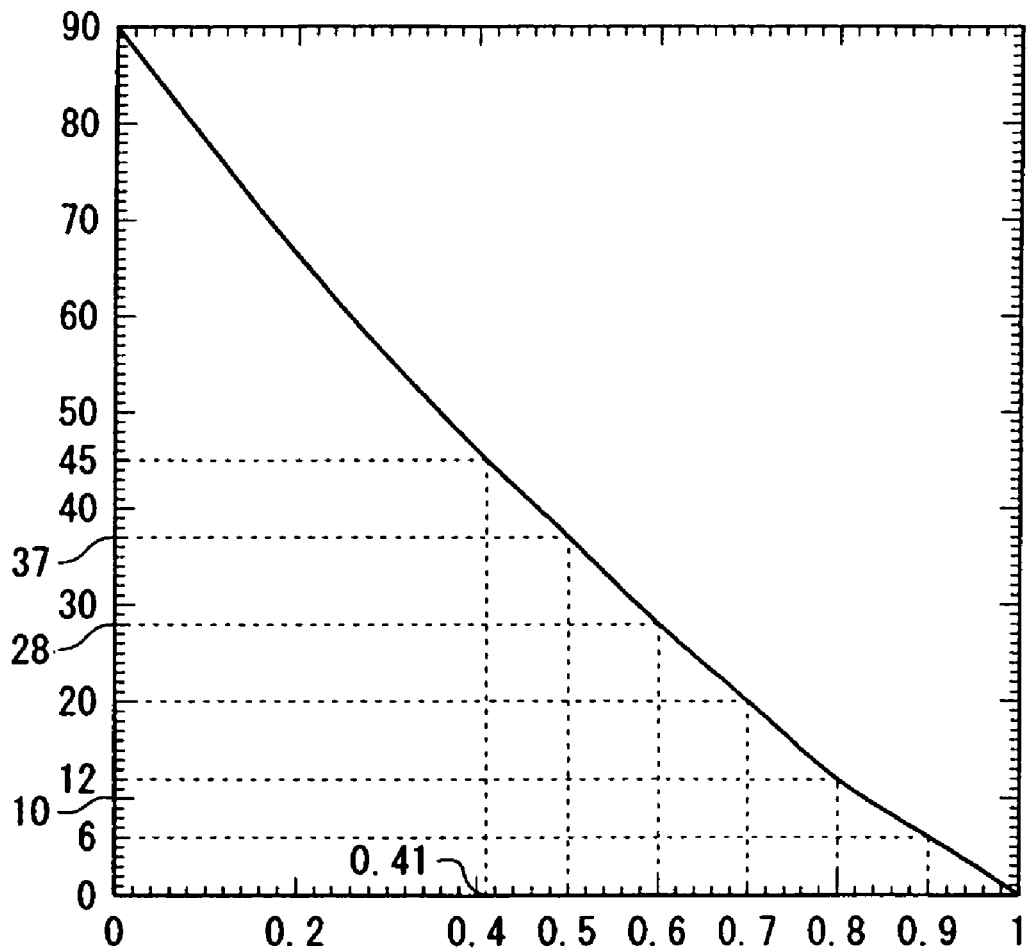
FIG. 31 is a diagram illustrating relationships between the angle of the waveguide directions and the refractive index ratio when the light propagates through materials with different refractive indices.

FIG. 31 is a graph illustrating relationships between the angle $\theta_{12}$, which is made by the waveguide direction when the light is launched from the material having the refractive index $N_1$ to the material having the refractive index $N_2$, and the refractive index ratio $N_2/N_1$. Here, the angle $\theta_{12}$ the waveguide direction makes is equal to the angle between the waveguide direction of the first waveguide 1201 and the waveguide direction of the second waveguide region 1202 in the configuration of FIG. 26, and is equal to the angle between the direction of the first waveguide 1401 and the direction of the second waveguide 1402 in the configuration of FIG. 28.

In FIG. 31, take the configuration of FIG. 28 as an example, and assume that the refractive index ratio between the first waveguide 1401 and second waveguide 1402 is 0.9 (e.g. when the refractive index of the first waveguide 1401 is 3.21, then the refractive index of the second waveguide 1402 is 2.89), then the angle $\theta_{12}$ the first waveguide 1401 makes with the second waveguide 1402 is about six degrees. Accordingly, when the waveguide length of the second waveguide 1402 is 10 μm, for example, the light-emitting position from the second waveguide 1402 shifts about 1 μm from the extension line of the first waveguide 1401.

When the refractive index ratio between the first waveguide 1401 and second waveguide 1402 is 0.8, then the angle $\theta_{12}$ the first waveguide 1401 makes with the second waveguide 1402 is about 12 degrees; when the refractive index ratio between the first waveguide 1401 and second waveguide 1402 is 0.7, then the angle $\theta_{12}$ the first waveguide 1401 makes with the second waveguide 1402 is about 20 degrees; when the refractive index ratio between the first waveguide 1401 and second waveguide 1402 is 0.6, then the angle $\theta_{12}$ the first waveguide 1401 makes with the second waveguide 1402 is about 28 degrees; and when the refractive index ratio between the first waveguide 1401 and second waveguide 1402 is 0.5, then the angle $\theta_{12}$ the first waveguide 1401 makes with the second waveguide 1402 is about 37 degrees. Thus, the shift increases from the extension line of the first waveguide 1401.

Although aligning the first waveguide 1401 and the third waveguide 1403 will prevent the effective waveguide of light, the light can be guided efficiently by disposing the third waveguide 1403 with shifting it from the extension line of the first waveguide 1401 according to the angle $\theta_{12}$ the first waveguide 1401 makes with the second waveguide 1402, and the waveguide length of the second waveguide 1402.

Since the path of light is not changed even if the traveling direction is reversed, in case of $N_2 > N_1$, $N_2$ and $N_1$ can be replaced as apparent from expressions (3)-(5) and (12).

For example, assume that the refractive index of the first waveguide 1401 and third waveguide 1403 is 3.12, the refractive index of the second waveguide 1402 is 1.54, and hence the refractive index ratio between the first waveguide 1401 and second waveguide 1402 is 0.48, then the Brewster angle $\theta_B$ from the first waveguide 1401 to the second waveguide 1402 is 25.6 degrees and the refraction angle $\theta_2$ is 25.6 degrees. Accordingly, the angle $\theta_{12}$ between the first waveguide 1401 and second waveguide 1402 is 38.8 degrees.

On the other hand, considering the case from the second waveguide 1402 to the third waveguide 1403, it corresponds to the case where the refractive indices of the first waveguide 1401 and second waveguide 1402 are exchanged as apparent from expressions (3)-(5) and (12). Accordingly, the Brewster angle $\theta_B$ is 64.4 degrees and the refraction angle $\theta_2$ is 25.6 degrees.

Therefore, by connecting the first waveguide 1401 and third waveguide 1403 to the second waveguide 1402 in such a manner that they are point symmetry with respect to the midpoint of the second waveguide 1402 of FIG. 28, it becomes possible to make the directions of the first waveguide 1401 and the third waveguide 1403 in parallel each other while suppressing the reflection between the waveguides. As a result, the first waveguide 1401 and third waveguide 1403 can be formed along the same crystal orientation, which enables the first waveguide 1401 and third waveguide 1403 with the buried heterostructure to be built at high reliability.

In particular, as seen from FIG. 31, the angle $\theta_{12}$ between the first waveguide 1401 and second waveguide 1402 can be adjusted to 45 degrees when the refractive index ratio between the first waveguide 1401 and second waveguide 1402 is about 0.41, thereby making the directions of the first waveguide 1401 and third waveguide 1403 orthogonal to each other.

Since the principle of the present invention is the same even when the first waveguide 1401 and third waveguide 1403 are composed of materials other than the semiconductors, the directions of the first waveguide 1401 and third waveguide 1403 can also be made in parallel each other in this case.

Next, assume that the refractive index of the first waveguide 1401 is $N_1$, and the refractive index of the second waveguide 1402 is $N_2$, then the reflectance R of the component parallel to the incidence plane is given by the following expression (14).

$$R=|\tan(\theta_1-\sin^{-1}(N_2/N_1\sin\theta_1))/\tan(\theta_1+\sin^{-1}(N_2/N_1\sin\theta_1))|^2 \quad (14)$$

Figure 32:
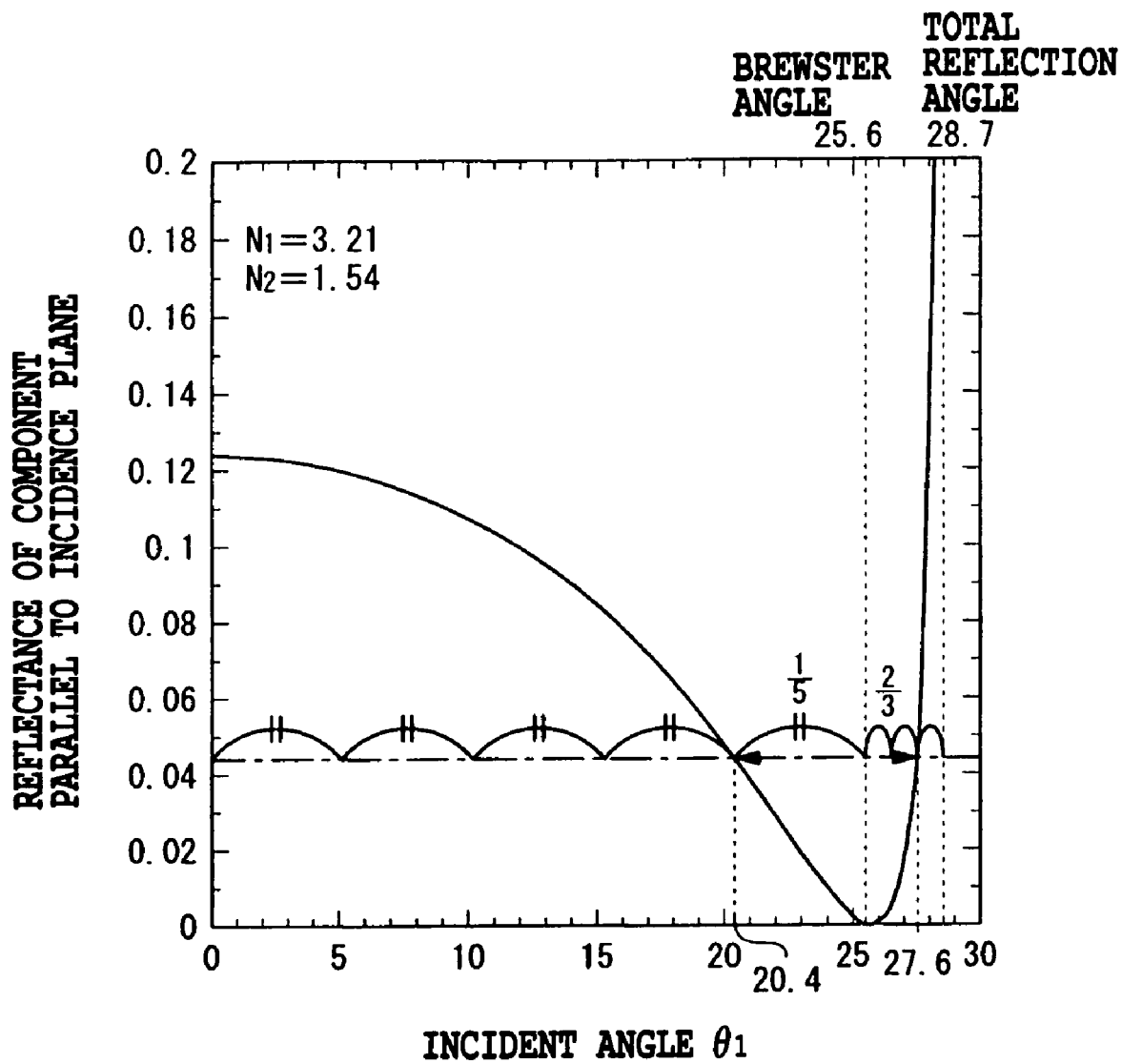
FIG. 32 is a diagram illustrating relationships between the incident angle and the reflectance of components parallel to the incidence plane when the light incidents to a splice plane of materials with different refractive indices.

FIG. 32 is a graph illustrating relationships between the incident angle and the reflectance of the component parallel to the incidence plane when light incident to the splice plane between the materials having different refractive indices. In the example of FIG. 32, it is assumed that the refractive index of the first waveguide 1401 is $N_1$=3.21, and the refractive index of the second waveguide 1402 is $N_2$=1.54.

In FIG. 32, as the incident angle $\theta_1$ increases, the reflectance R of the component parallel to the incidence plane gradually decreases, and becomes zero when the incident angle $\theta_1$ is aligned with the Brewster angle $\theta_B$=25.6 degrees. Then, when the incident angle $\theta_1$ exceeds the Brewster angle $\theta_B$, the reflectance R of the component parallel to the incidence plane increases sharply, and asymptotically approaches the total reflection angle $\theta_A$=28.7 degrees.

The total reflection angle $\theta_A$ is given by the following expression (15).

$$\theta_A=\sin^{-1}(N_2/N_1) \quad (15)$$

As an example of the incident angle $\theta_1$ that provides small reflectance R, consider the incident angle $\theta_1$ that will give reflectance equal to ⅓ of the reflectance R at the incident angle of zero degree. In this case, the incident angle ranges from ⅘ of the Brewster angle $\theta_B$ to the Brewster angle $\theta_B$ plus ⅔ of the difference between the total reflection angle $\theta_A$ and the Brewster angle $\theta_B$. In other words, the incident angle $\theta_1$ that achieves small reflectance R is given by the following expression (16).

$$4\theta_B/5 \leq \theta_1 \leq \theta_B + \tfrac{2}{3}(\theta_A - \theta_B) \quad (16)$$

Thus the reflectance of the component parallel to the interface surface 1404 can be made zero by matching to the Brewster angle $\theta_B$ the incident angle $\theta_1$, that is, the angle made by the interface surface 1404 between the first waveguide 1401 and second waveguide 1402 and the propagation direction of the first waveguide 1401.

The light propagating through the waveguide is usually a TE mode that has only the component parallel to the interface surface. Accordingly, the light propagating through the first waveguide 1401 can be transmitted to the second waveguide 1402 without suffering a loss by the interface surface 1404. In addition, setting the incident angle $\theta_1$ in the range given by expression (16) can reduce the loss due to reflection.

Figure 33:
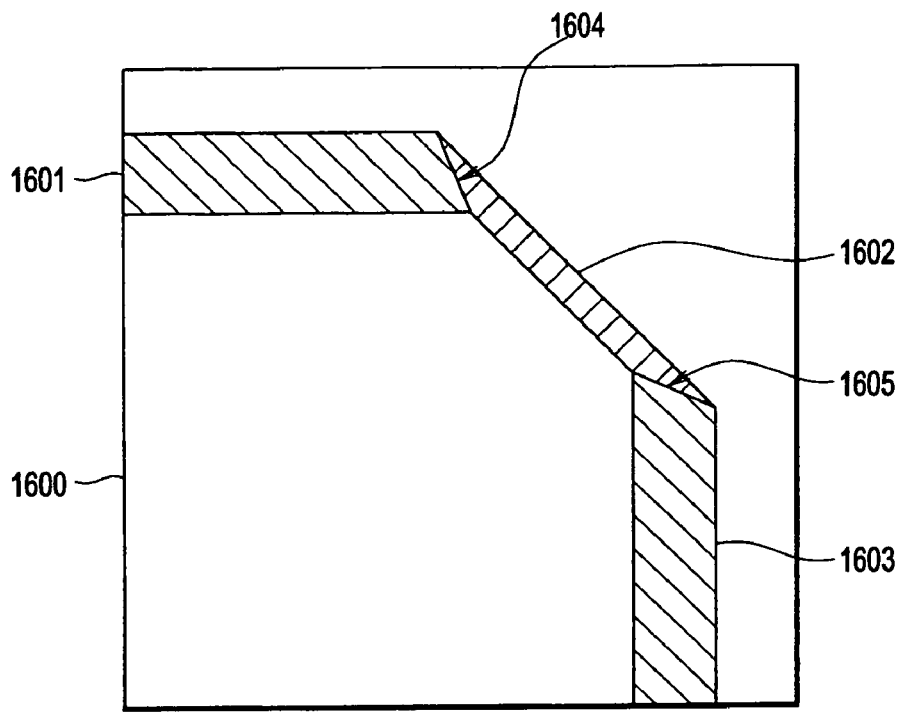
FIG. 33 is a plan view showing a schematic configuration of an integrated optical waveguide of a 19th example in accordance with the present invention.

FIG. 33 is a plan view showing a schematic configuration of an integrated optical waveguide of a 19th example in accordance with the present invention. In FIG. 33, on a semiconductor substrate 1600, a first waveguide 1601, a second waveguide 1602 and a third waveguide 1603 are formed, and the second waveguide 1602 is disposed across the first waveguide 1601 and the third waveguide 1603. Here, the refractive index of the first waveguide 1601 and that of the third waveguide 1603 can be made equal to each other. Also, the refractive index of the first waveguide 1601 can differ from that of the second waveguide 1602, and the refractive index ratio between the first waveguide 1401 and second waveguide 1402 can be set at about 0.41.

The interface surface 1604 between the first waveguide 1601 and second waveguide 1602, and the interface surface 1605 between the second waveguide 1602 and third waveguide 1603 can be inclined with respect to the incident direction to satisfy the Brewster angle, respectively.

This enables the angle between the first waveguide 1601 and second waveguide 1602 and the angle between the second waveguide 1602 and third waveguide 1603 to be set at 45 degrees. Thus, it is possible to make the directions of the first waveguide 1601 and third waveguide 1603 orthogonal, and to reduce the reflection from the interface surface 1604 between the first waveguide 1601 and second waveguide 1602, and from the interface surface 1605 between the second waveguide 1602 and third waveguide 1603. As a result, from the viewpoint of the crystal structure, when forming cleaved surfaces in the first waveguide 1601 and third waveguide 1603, the cleaved surfaces can be placed perpendicularly, if not parallel.

Figure 34:
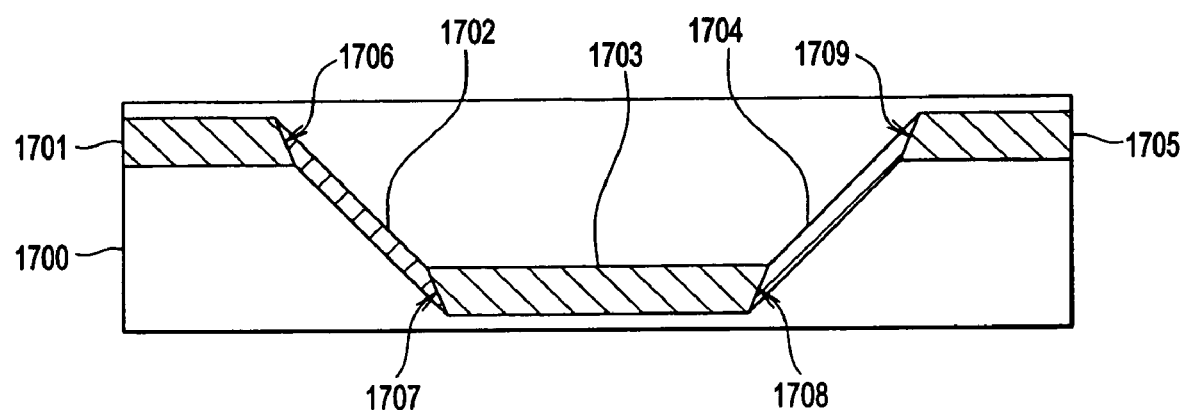
FIG. 34 is a plan view showing a schematic configuration of an integrated optical waveguide of a 20th example in accordance with the present invention.

FIG. 34 is a plan view showing a schematic configuration of an integrated optical waveguide of 4th example in accordance with the present invention. In FIG. 34, on a semiconductor substrate 1700, a first waveguide 1701, a second waveguide 1702, a third waveguide 1703, a fourth waveguide 1704 and a fifth waveguide 1705a reformed. The second waveguide 1702 is disposed across the first waveguide 1701 and third waveguide 1703, and the fourth waveguide 1704 is disposed across the third waveguide 1703 and fifth waveguide 1705.

The refractive indices of the first waveguide 1701, third waveguide 1703 and fifth waveguide 1705 may be set equal to each other, and the refractive indices of the second waveguide 1702 and fourth waveguide 1704 may be set equal to each other. In addition, the refractive index of the first waveguide 1701 can differ from that of the second waveguide 1702. For example, the first waveguide 1701, third waveguide 1703 and fifth waveguide 1705 may be composed of semiconductor materials, and the second waveguide 1702 and fourth waveguide 1704 may be composed of materials other than the semiconductors.

Furthermore, the interface surface 1706 between the first waveguide 1701 and second waveguide 1702 can be inclined with respect to the propagation direction of the first waveguide 1701. Likewise, the interface surface 1707 between the second waveguide 1702 and third waveguide 1703 can be inclined with respect to the extension line of the refraction direction through the interface surface 1706 between the first waveguide 1701 and second waveguide 1702. When the interface surface 1707 between the second waveguide 1702 and third waveguide 1703 is inclined with respect to the extension line of the refraction direction through the interface surface 1706 between the first waveguide 1701 and second waveguide 1702, the refraction direction through the interface surface 1706 between the second waveguide 1702 and third waveguide 1703 can be set in such a manner that the refraction direction is in line with the propagation direction of the third waveguide 1703.

In addition, the interface surface 1708 between the third waveguide 1703 and fourth waveguide 1704 can be inclined with respect to the propagation direction of the third waveguide 1703. Likewise, the interface surface 1709 between the fourth waveguide 1704 and fifth waveguide 1705 can be inclined with respect to the extension line of the refraction direction through the interface surface 1708 between the third waveguide 1703 and fourth waveguide 1704. When the interface surface 1709 between the fourth waveguide 1704 and fifth waveguide 1705 is inclined with respect to the extension line of the refraction direction through the interface surface 1708 between the third waveguide 1703 and fourth waveguide 1704, it is possible to set the refraction direction through the interface surface 1709 between the fourth waveguide 1704 and fifth waveguide 1705 in such a manner that the refraction direction is in line with the propagation direction of the fifth waveguide 1705.

For example, it is possible to set the inclination angles of the interface surfaces 1706-1709 in such a manner that they satisfy the Brewster angle; to connect the first waveguide 1701 and third waveguide 1703 to the second waveguide 1702 in such a manner that they are point symmetry with respect to the midpoint of the second waveguide 1702; and to connect the third waveguide 1703 and fifth waveguide 1705 to the fourth waveguide 1704 in such a manner that they are point symmetry with respect to the midpoint of the fourth waveguide 1704.

This makes it possible to reduce the reflection from the interface surfaces 1706-1709, and to align the input side first waveguide 1701 with the output side fifth waveguide 1705, thereby improving the flexibility of the waveguide design.

The 20th example of FIG. 34 is configured by connecting the configurations of FIG. 28 in mirror symmetry. Thus, as for the materials and shapes of the first waveguide 1701, second waveguide 1702,. third waveguide 1703, fourth waveguide 1704 and fifth waveguide 1705, they can be those employed by the foregoing examples.

In addition, a plurality of configurations of FIG. 34 can be connected in cascade. This makes it possible to distribute the waveguide regions composed of materials different from the semiconductors, which enables the implementation of the optical waveguide with new characteristics that cannot be achieved by semiconductor-only configuration.

Figure 35:
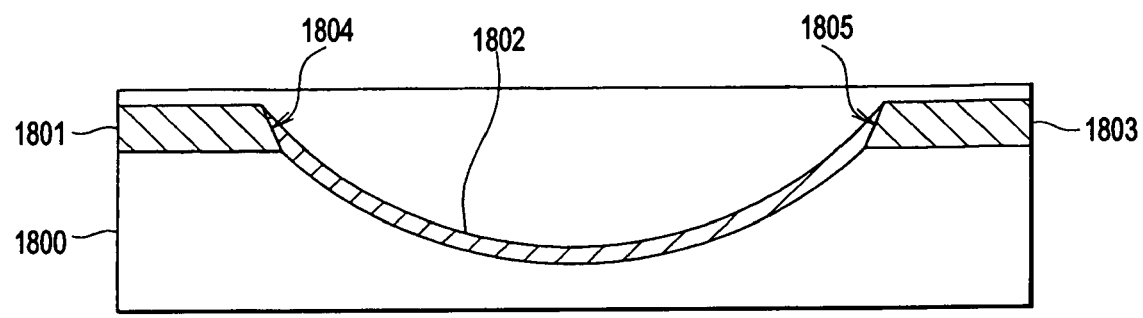
FIG. 35 is a plan view showing a schematic configuration of an integrated optical waveguide of a 21st example in accordance with the present invention.

FIG. 35 is a plan view showing a schematic configuration of an integrated optical waveguide of a 5th example in accordance with the present invention.

In FIG. 35, on a semiconductor substrate 1800, a first waveguide 1801, a second waveguide 1802 and a third waveguide 1803 are formed, and the second waveguide 1802 is disposed across the first waveguide 1801 and third waveguide 1803. Here, the refractive index of the first waveguide 1801 can be made equal to that of the third waveguide 1803, but different from that of the second waveguide 1802. For example, the first waveguide 1801 and third waveguide 1803 may be composed of semiconductor materials, and the second waveguide 1802 may be composed of the materials other than the semiconductors.

Also, the interface surface 1804 between the first waveguide 1801 and second waveguide 1802 can be inclined with respect to the propagation direction of the first waveguide 1801. Likewise, the interface surface 1805 between the second waveguide 1802 and third waveguide 1803 can be inclined with respect to the extension line of the refraction direction through the interface surface 1804 between the first waveguide 1801 and second waveguide 1802. The first waveguide 1801 and third waveguide 1803 can be aligned, and the second waveguide 1802 can be curved in an arc to enable the first waveguide 1801 and third waveguide 1803 to be connected in accordance with the refraction directions through the interface surfaces 1804 and 1805.

For example, the inclination angles of the interface surfaces 1804 and 1805 are set to satisfy the Brewster angle, and the first waveguide 1801 and third waveguide 1803 are connected with the second waveguide 1802 in such a manner that they are line symmetry with respect to the center line of the second waveguide 1802.

This makes it possible to correct the bend of the light beam due to the refraction angle while suppressing the waveguide loss, and to set the location of the third optical waveguide 1803 at any desired position, thereby improving the flexibility of the waveguide design.

Although the second waveguide region 1802 is composed of a curved waveguide to correct the bending of the light due to the refraction angle in the 21st example of FIG. 10 described above, a configuration is also possible in which the first waveguide region 1801 or third waveguide region 1803 is composed of a curved waveguide.

Since the 21st example of FIG. 35 is a variation of the configuration of FIG. 28, the materials and shapes of the first waveguide 1801, second waveguide 1802 and third waveguide 1803 can be the same as those of the foregoing examples.

Furthermore, a plurality of configurations of FIG. 35 can be connected in cascade. This makes it possible to distribute the waveguide regions composed of materials different from the semiconductors, which enables the implementation of the optical waveguide with new characteristics that cannot be achieved by semiconductor-only configuration.

Figure 36:
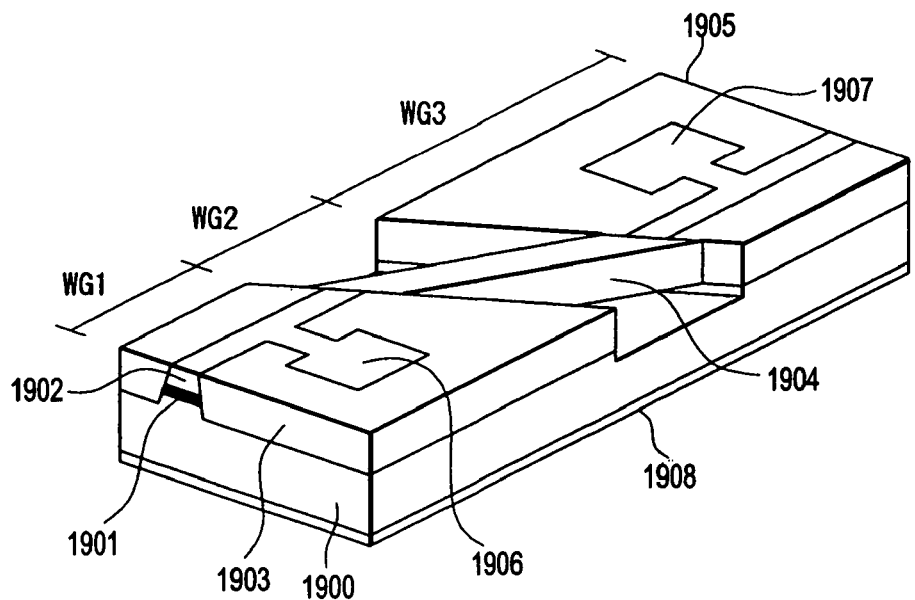
FIG. 36 is a perspective view showing a schematic configuration of an integrated optical waveguide of a 22nd example in accordance with the present invention.

FIG. 36 is a cross-sectional perspective view showing a schematic configuration of an integrated optical waveguide of the 22nd example in accordance with the present invention.

In FIG. 36, on a semiconductor substrate 1900, a first waveguide WG1, a second waveguide WG2 and a third waveguide WG3 are formed, and the second waveguide WG2 is disposed across the first waveguide WG1 and third waveguide WG3. The refractive index of the first waveguide WG1 can be set equal to that of the third waveguide WG3, but different from that of the second waveguide WG2. For example, the first waveguide WG1 and third waveguide WG3 may be composed of semiconductor materials, and the second waveguide WG2 may be composed of materials other than the semiconductors.

The interface surface between the first waveguide WG1 and second waveguide WG2 can be inclined with respect to the propagation direction of the first waveguide WG1. Likewise, the interface surface between the second waveguide WG2 and third waveguide WG3 can be inclined with respect to the extension line of the refraction direction through the interface surface between the first waveguide WG1 and second waveguide WG2. To incline the interface surface between the second waveguide WG2 and third waveguide WG3 with respect to the extension line of the refraction direction through the interface surface between the first waveguide WG1 and second waveguide WG2, it is possible to align the refraction direction through the interface surface between the second waveguide WG2 and third waveguide WG3 with the propagation direction of the third waveguide WG3. Also, a laser diode is formed in each of the first waveguide WG1 and third waveguide WG3.

More specifically, on the semiconductor substrate 1900, a core layer 1901 is stacked, and on the core layer 1901, an upper cladding layer 1902 whose conductivity type differs from that of the semiconductor substrate 1900 is stacked. As the semiconductor substrate 1900 and upper cladding layer 1902, InP can be used and as the core layer 1901, GaInAsP can be used for example. Also, the semiconductor substrate 1901 can be an n-type, and the upper cladding layer 1902 can be a p-type, for example.

Then, by etching the semiconductor substrate 1900 on which the core layer 1901 and upper cladding layer 1902 have been stacked successively, the upper cladding layer 1902, the core layer 1901 and the upper region of the semiconductor substrate 1900 are shaped into the form of the first waveguide WG1 and third waveguide WG3. Then, a buried heterostructure is formed by growing burying layers 1903 and 1905 on both sides of the first waveguide WG1 and third waveguide WG3. As the burying layers 1903 and 1905, a Fe-doped InP insulating layer can be used for example.

Subsequently, the upper cladding layer 1902, the core layer 1901 and the upper region of the semiconductor substrate 1900 between the first waveguide WG1 and third waveguide WG3 are removed along the boundary between the first waveguide WG1 and second waveguide WG2 and along the boundary between the second waveguide WG2 and third waveguide WG3.

After that, the second waveguide WG2 connected with the first waveguide WG1 and third waveguide WG3 is formed on the semiconductor substrate 1900 by burying an organic material such as BCB between the first waveguide WG1 and third waveguide WG3 in such a manner that it conforms to the shape of the second waveguide WG2.

In addition, electrodes 1906 and 1907 are formed on the upper cladding layer 1902 corresponding to the positions of the first waveguide WG1 and third waveguide WG3, and an electrode 1908 is formed on the back surface of the semiconductor substrate 1900. Thus, the laser diodes are formed on the first waveguide WG1 and third waveguide WG3.

In the 22nd example of FIG. 36, although a method of providing the electrodes 1906-1908 is described by way of example of the structure of FIG. 28, the electrodes can be attached to one of the structures of FIG. 26 and FIGS. 33-35.

Since the 22nd example of FIG. 36 has a structure in which the semiconductor waveguide includes the active layer for injecting the current, the first waveguide WG1, second waveguide WG2 and third waveguide WG3 can employ the same materials and shapes as those described in the foregoing examples.

A diffraction grating can be formed on the semiconductor waveguide sections to provide the wavelength selectivity, or a distributed feedback (DFB) semiconductor laser or distributed reflector (DBR) can be formed.

Furthermore, using a material whose refractive index has a negative temperature coefficient as the second waveguide WG2 can generate a single oscillation wavelength because of the wavelength selectivity, and implement the laser whose wavelength is constant regardless of the temperature.

As described above, according to the third embodiment of the present invention, even when the materials with refractive indices different from each other are inserted between the waveguide regions, it is possible to improve the flexibility of the waveguide design while suppressing the reflection from the interface surfaces; to make effective use of the crystal orientation suitable for cleavage, etching or burying during the fabrication of the integrated optical waveguide; and to easily implement the optical waveguide and optical device with new characteristics that cannot be achieved with semiconductor-only configuration on the semiconductor substrate.

INDUSTRIAL APPLICABILITY

As described above, the present invention can provide an optical semiconductor device and optical semiconductor integrated circuit that can facilitate the process and integration, and have new characteristics that cannot be achieved by semiconductor-only configuration by applying the materials having refractive indices whose temperature dependence differs from each other to the propagating regions and/or waveguide regions on the semiconductor substrate.

What is claimed is:

1. A semiconductor laser comprising:
    a gain region having wavelength selectivity;
    a propagating region optically coupled to said gain region, the propagating region having a length, the propagating region also having an effective refractive index whose temperature dependence differs from that of said gain region, and having no wavelength selectivity; and
    a reflection region for reflecting light propagated through said propagating region with high reflectivity,
    wherein said gain region comprises a diffraction grating formed by periodic perturbation with at least one of real and imaginary parts of a complex refractive index and the coupling coefficient of the diffraction grating of said gain region is greater than 300 cm$^{-1}$, so that said gain region and said reflection region form a cavity for laser oscillation within an extended stop bandwidth, the cavity having an effective length, the wavelength of the laser oscillation being determined by an optical phase determined by the effective cavity length and the length of the propagation region while a center wavelength of the stop band changes over temperature due to temperature dependence of the effective refractive index of the gain region.

2. A semiconductor laser comprising:
    a gain region having wavelength selectivity;
    a propagating region optically coupled to said gain region, the propagating region having a length, the propagating region also having a material other than a semiconductor with an effective refractive index whose temperature dependence differs from that of said gain region, and having no gain nor wavelength selectivity; and
    a reflection region that reflects light propagated through said propagating region with high reflectivity, and has no gain,
    wherein said gain region comprises a diffraction grating formed by periodic perturbation with at least one of real and imaginary parts of a complex refractive index and the coupling coefficient of the diffraction grating of said gain region is greater than 300 cm$^{-1}$, so that said gain region and said reflection region form a cavity for laser oscillation within an extended stop bandwidth, the cavity having an effective length, the wavelength of the laser oscillation being determined by an optical phase determined by the effective cavity length and the length of the propagation region while a center wavelength of the stop band changes over temperature due to temperature dependence of the effective refractive index of the gain region.

3. A semiconductor laser comprising:
    a gain region having wavelength selectivity;
    a propagating region optically coupled to said gain region, the propagating region having a length, the propagating region also having a structure with an effective refractive index whose temperature dependence differs from that of said gain region, and having no gain nor wavelength selectivity; and a reflection region that reflects light propagated through said propagating region with high reflectivity, and has no gain, wherein said gain region comprises a diffraction grating formed by periodic perturbation with at least one of real and imaginary parts of a complex refractive index and the coupling coefficient of the diffraction grating of said gain region is greater than 300 cm$^{-1}$, so that said gain region and said reflection region form a cavity for laser oscillation within an extended stop bandwidth, the cavity having effective length, the wavelength of the laser oscillation being determined by an optical phase determined by the effective cavity length and the length of the propagation region while a center wavelength of the stop band changes over temperature due to temperature dependence of the effective refractive index of the gain region.

4. The semiconductor laser as claimed in claim 1, wherein said reflection region has a mirror or a diffraction grating with a periodic structure.

5. A semiconductor laser comprising:

a first gain region having wavelength selectivity;

a propagating region optically coupled to said first gain region, the propagating region having a length, the propagating region also having a material other than a semiconductor with an effective refractive index whose temperature dependence differs from that of said gain region, and having no gain nor wavelength selectivity; and a second gain region optically coupled to said propagating region, and having wavelength selectivity, wherein each of said first and second gain regions comprises a diffraction grating formed by periodic perturbation with at least one of real and imaginary parts of a complex refractive index and the coupling coefficient of the diffraction grating of said gain region is greater than 300 cm$^{-1}$, so that said first and second gain regions form a cavity for laser oscillation within an extended stop bandwidth, the cavity having an length, the wavelength of the laser oscillation being determined by an optical phase determined by the effective cavity length and the length of the propagation region while a center wavelength of the stop band changes over temperature due to temperature dependence of the effective refractive index of the gain region.

6. A semiconductor laser comprising:

a first gain region having wavelength selectivity;

a propagating region optically coupled to said first gain region, the propagating region having a length, the propagating region also having a structure with an effective refractive index whose temperature dependence differs from that of said gain region, and having no gain nor wavelength selectivity; and a second gain region optically coupled to said propagating region, and having wavelength selectivity, wherein each of said first and second gain regions comprises a diffraction grating formed by periodic perturbation with at least one of real and imaginary parts of a complex refractive index and the coupling coefficient of the diffraction grating of said gain region is greater than 300 cm$^{-1}$, so that said first and second gain regions form a cavity for laser oscillation within an extended stop bandwidth, the cavity having an effective length, the wavelength of the laser oscillation being determined by an optical phase determined by the effective cavity length and the length of the propagation region while a center wavelength of the stop band changes over temperature due to temperature dependence of the effective refractive index of the gain region.

7. The semiconductor laser as claimed in claim 3, wherein said structure is different from a structure of the gain region in at least one of a layer structure, layer thickness and waveguide width.

8. The semiconductor laser as claimed in claim 1, wherein an absolute value of a product of a length of said propagating region and a difference between a temperature differential coefficient of the effective refractive index of said gain region and a temperature differential coefficient of the effective refractive index of said propagating region is equal to or greater than $7.5 \times 10^{-4}$ [μm/K].

9. The semiconductor laser as claimed in claim 1, wherein said propagating region is composed of a material other than a semiconductor whose temperature differential coefficient of the effective refractive index is different from that of a semiconductor.

10. The semiconductor laser as claimed in claim 1, wherein said propagating region is composed of a material other than a semiconductor whose temperature differential coefficient of the effective refractive index is negative.

11. The semiconductor laser as claimed in claim 1, wherein the length of said propagating region is determined such that a longitudinal mode spacing determined by a sum of an effective length of the diffraction grating of said gain region and a length of said propagating region, is greater than a stop bandwidth of said diffraction grating.

12. The semiconductor laser as claimed in claim 1, wherein said gain region, said propagating region and said reflection region are stacked.

13. The semiconductor laser as claimed in claim 1, wherein said gain region and said propagating region are coupled via optical path changing means.

14. The semiconductor laser as claimed in claim 1, wherein said propagating region has a waveguide structure having an optical confinement structure on at least one of upper and lower portions and left and right portions.

15. The semiconductor laser as claimed in claim 1, wherein the stop bandwidth of the diffraction grating of said gain region is increased by setting the coupling coefficient of the diffraction grating of said gain region at least at 300 cm$^{-1}$.

16. The semiconductor laser as claimed in claim 2, wherein the stop bandwidth of the diffraction grating of said gain region is increased by setting the coupling coefficient of the diffraction grating of said gain region at least at 300 cm$^{-1}$.

17. The semiconductor laser as claimed in claim 3, wherein the stop bandwidth of the diffraction grating of said gain region is increased by setting the coupling coefficient of the diffraction grating of said gain region at least at 300 cm$^{-1}$.

18. The semiconductor laser as claimed in claim 5, wherein the stop bandwidth of the diffraction grating of said gain region is increased by setting the coupling coefficient of the diffraction grating of said gain region at least at 300 cm$^{-1}$.

19. The semiconductor laser as claimed in claim 6, wherein the stop bandwidth of the diffraction grating of said gain region is increased by setting the coupling coefficient of the diffraction grating of said gain region at least at 300 cm$^{-1}$.

* * * * *